US011610914B2

(12) United States Patent
Yan et al.

(10) Patent No.: US 11,610,914 B2
(45) Date of Patent: *Mar. 21, 2023

(54) VERTICAL THIN-FILM TRANSISTOR AND APPLICATION AS BIT-LINE CONNECTOR FOR 3-DIMENSIONAL MEMORY ARRAYS

(71) Applicant: Sunrise Memory Corporation, San Jose, CA (US)

(72) Inventors: Tianhong Yan, Saratoga, CA (US); Scott Brad Herner, Portland, OR (US); Jie Zhou, San Jose, CA (US); Wu-Yi Henry Chien, San Jose, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 18 days.

This patent is subject to a terminal disclaimer.

(21) Appl. No.: 17/161,504

(22) Filed: Jan. 28, 2021

(65) Prior Publication Data

US 2021/0210506 A1 Jul. 8, 2021

Related U.S. Application Data

(63) Continuation-in-part of application No. 16/786,463, filed on Feb. 10, 2020, now Pat. No. 11,398,492.
(Continued)

(51) Int. Cl.
*H01L 27/11582* (2017.01)
*H01L 23/522* (2006.01)
(Continued)

(52) U.S. Cl.
CPC .... *H01L 27/11582* (2013.01); *H01L 23/5226* (2013.01); *H01L 23/5283* (2013.01);
(Continued)

(58) Field of Classification Search
CPC ........... H01L 27/11582; H01L 23/5226; H01L 23/5283; H01L 29/04; H01L 29/16; H01L 29/161; H01L 29/24
See application file for complete search history.

(56) References Cited

U.S. PATENT DOCUMENTS 6,881,994 B2 4/2005 Lee et al.
9,455,268 B2 9/2016 Oh et al.
(Continued)

OTHER PUBLICATIONS

"PCT Search Report and Written Opinion, PCT/US2019/052164", dated Feb. 27, 2020.
(Continued)

*Primary Examiner* — Monica D Harrison
*Assistant Examiner* — Andre C Stevenson
(74) *Attorney, Agent, or Firm* — Edward C. Kwok; VLP Law Group LLP

(57) ABSTRACT

A memory circuit includes: (i) a semiconductor substrate having a planar surface, the semiconductor substrate having formed therein circuitry for memory operations; (ii) a memory array formed above the planar surface, the memory array having one or more electrodes to memory circuits in the memory array, the conductors each extending along a direction substantially parallel to the planar surface; and (iii) one or more transistors each formed above, alongside or below a corresponding one of the electrodes but above the planar surface of the semiconductor substrate, each transistor (a) having first and second drain/source region and a gate region each formed out of a semiconductor material, wherein the first drain/source region, the second drain/source region or the gate region has formed thereon a metal silicide layer; and (b) selectively connecting the corresponding electrode to the circuitry for memory operations.

11 Claims, 44 Drawing Sheets

Related U.S. Application Data

(60) Provisional application No. 62/947,405, filed on Dec. 12, 2019, provisional application No. 62/804,080, filed on Feb. 11, 2019.

(51) Int. Cl.

| | | |
|---|---|---|
| *H01L 23/528* | (2006.01) | |
| *H01L 29/24* | (2006.01) | |
| *H01L 29/16* | (2006.01) | |
| *H01L 29/161* | (2006.01) | |
| *H01L 29/04* | (2006.01) | |

(52) U.S. Cl.
CPC .............. *H01L 29/04* (2013.01); *H01L 29/16* (2013.01); *H01L 29/161* (2013.01); *H01L 29/24* (2013.01)

(56) References Cited

U.S. PATENT DOCUMENTS

| | | | |
|---|---|---|---|
| 9,620,605 | B2 | 4/2017 | Liang et al. |
| 9,633,944 | B2 | 4/2017 | Kim |
| 10,217,667 | B2 | 2/2019 | Or-Bach et al. |
| 2002/0028541 | A1 | 3/2002 | Lee et al. |
| 2007/0252201 | A1 | 11/2007 | Kito et al. |
| 2008/0073635 | A1 | 3/2008 | Kiyotoshi et al. |
| 2010/0219392 | A1 | 9/2010 | Awaya et al. |
| 2010/0254191 | A1 | 10/2010 | Son et al. |
| 2010/0320526 | A1 | 12/2010 | Kidoh et al. |
| 2011/0134705 | A1 | 6/2011 | Jones et al. |
| 2014/0075135 | A1 | 3/2014 | Choi et al. |
| 2015/0372099 | A1 | 12/2015 | Chen et al. |
| 2016/0013156 | A1 | 1/2016 | Zhai et al. |
| 2016/0020169 | A1 | 1/2016 | Matsuda |
| 2017/0092370 | A1 | 3/2017 | Harari |
| 2017/0092371 | A1 | 3/2017 | Harari |
| 2017/0148517 | A1 | 5/2017 | Harari |
| 2018/0095127 | A1 | 4/2018 | Pappu et al. |
| 2019/0067327 | A1 | 2/2019 | Herner et al. |
| 2019/0303042 | A1 | 10/2019 | Kim et al. |
| 2019/0355672 | A1* | 11/2019 | Fujita .................... H01L 23/564 |
| 2019/0393241 | A1 | 12/2019 | Baek et al. |
| 2020/0258897 | A1* | 8/2020 | Yan .................... H01L 29/78642 |

OTHER PUBLICATIONS

"PCT Search Report and Written Opinion, PCT/US2020/017494", dated Jul. 20, 2020, 13 pages.

"PCT Search Report and Written Opinion, PCT/US2021/016964", dated Jun. 15, 2021, 19 pages.

\* cited by examiner

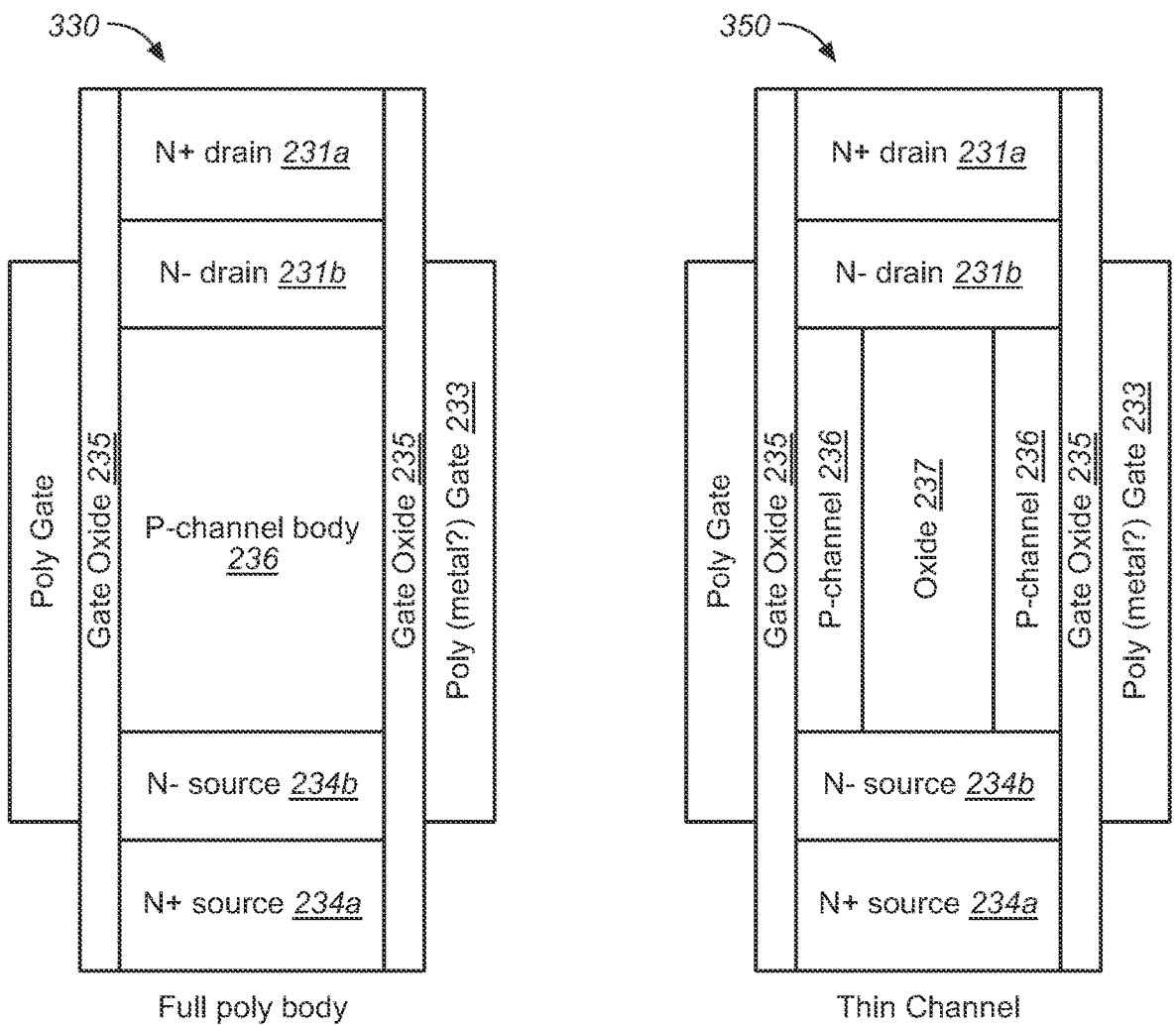
*FIG. 2b*      *FIG. 2c*

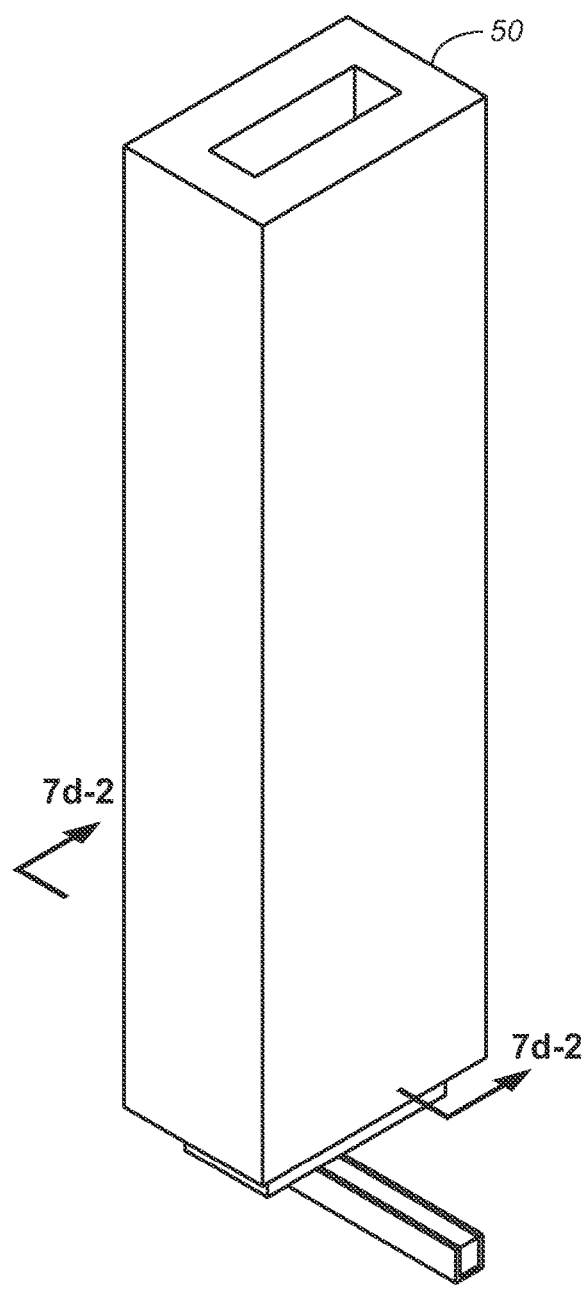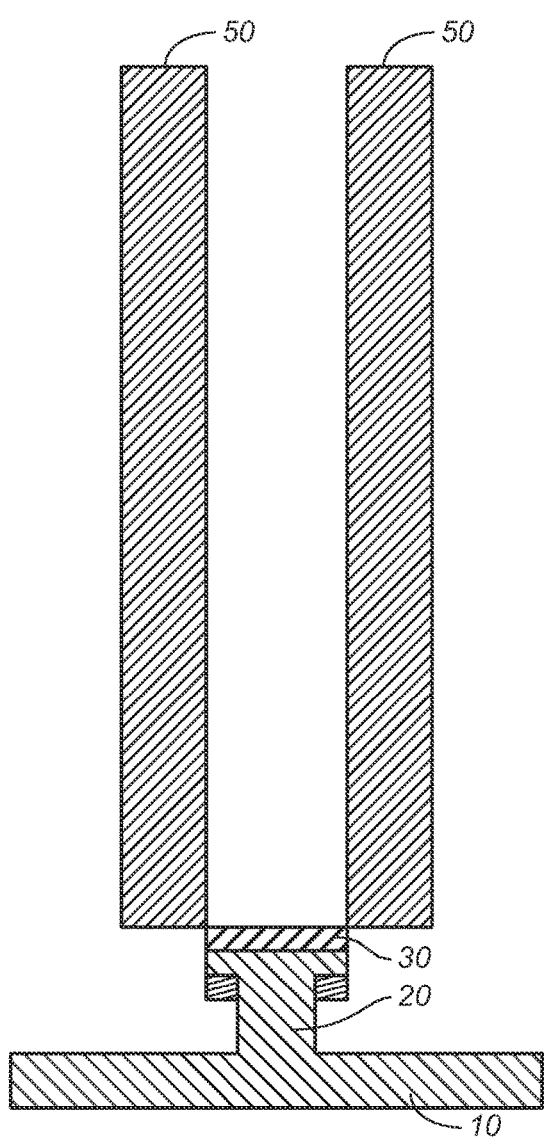
FIG. 7d-1　　　　FIG. 7d-2

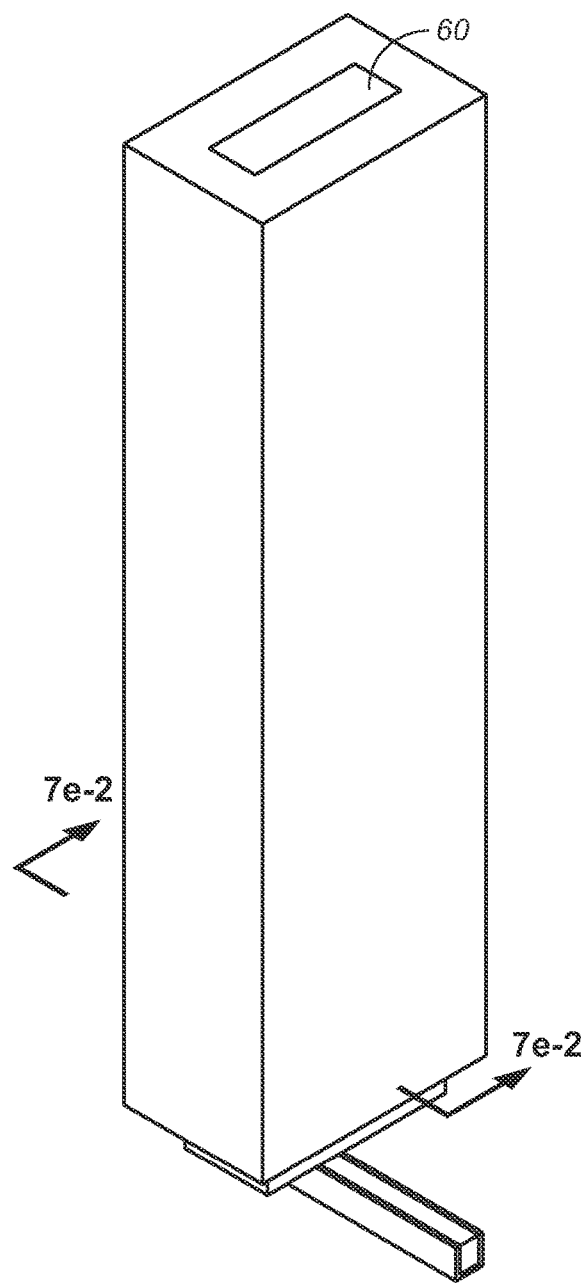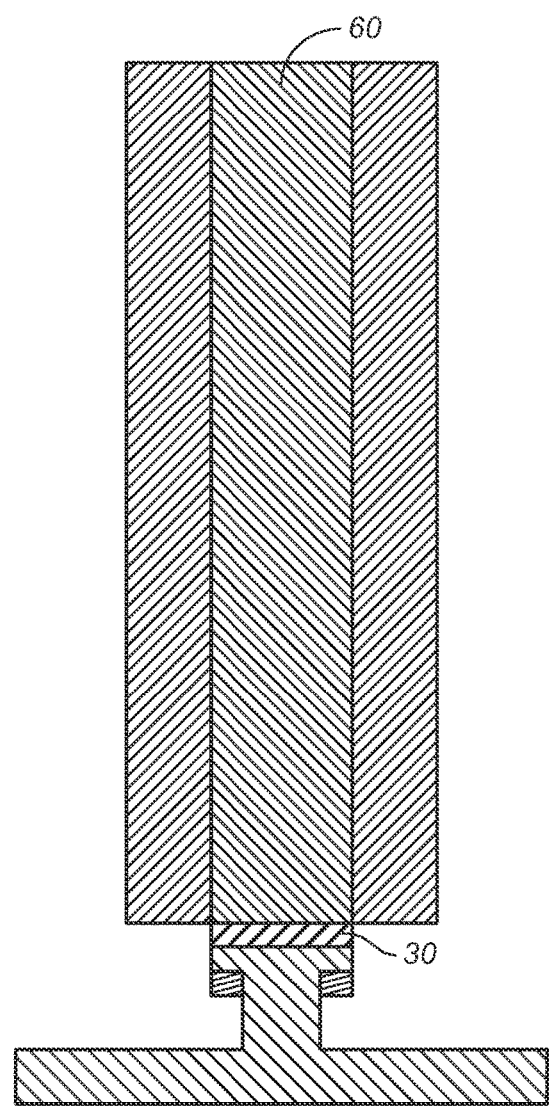
FIG. 7e-1    FIG. 7e-2

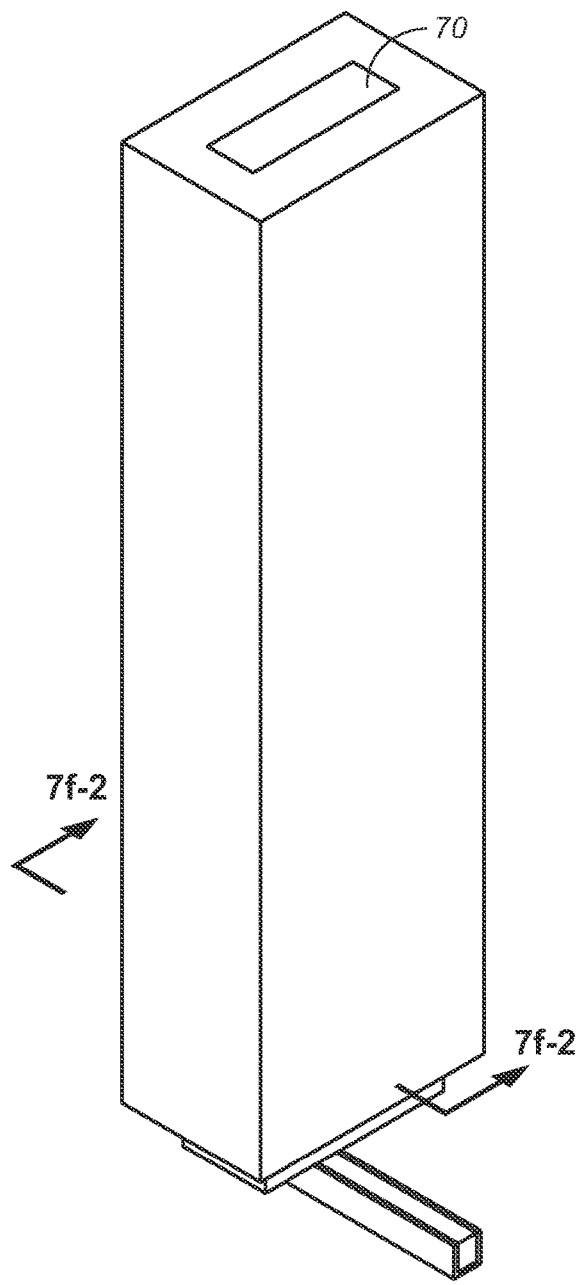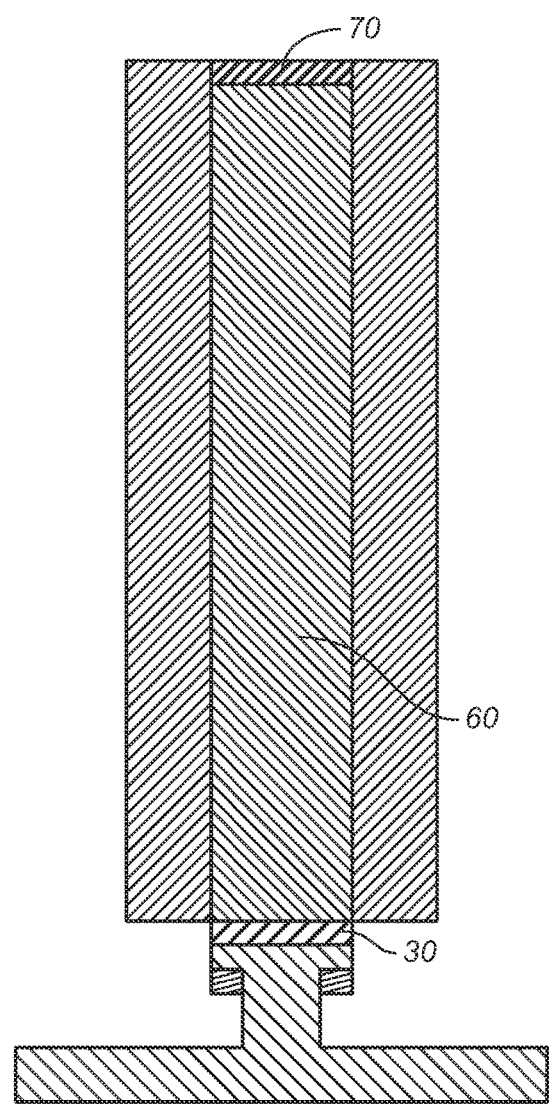
FIG. 7f-1    FIG. 7f-2

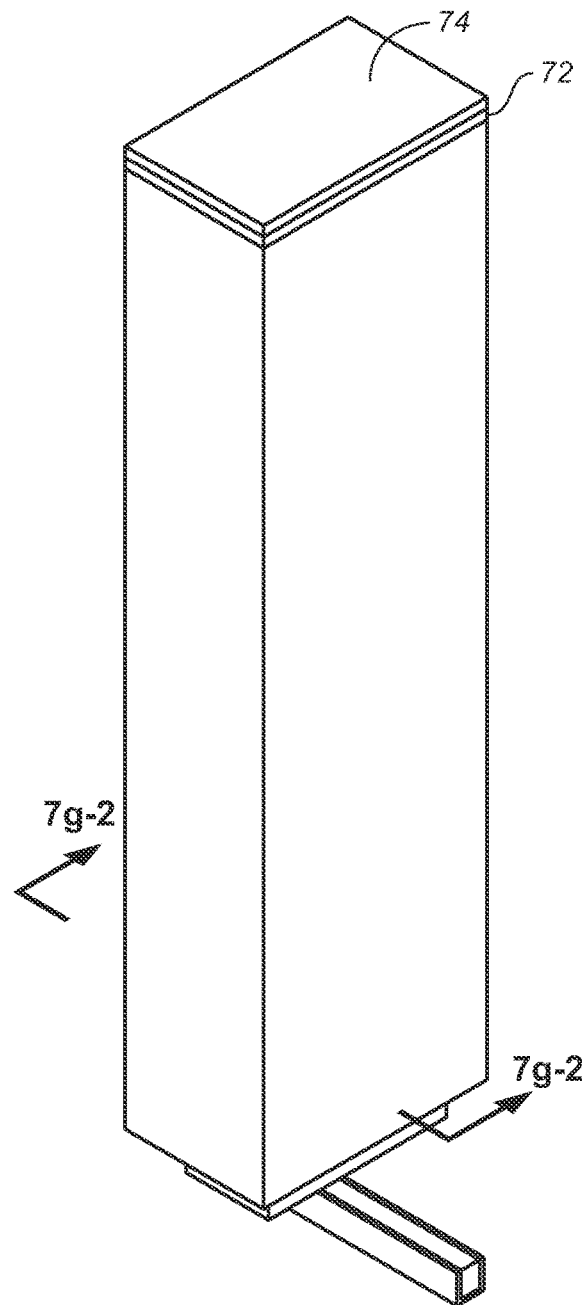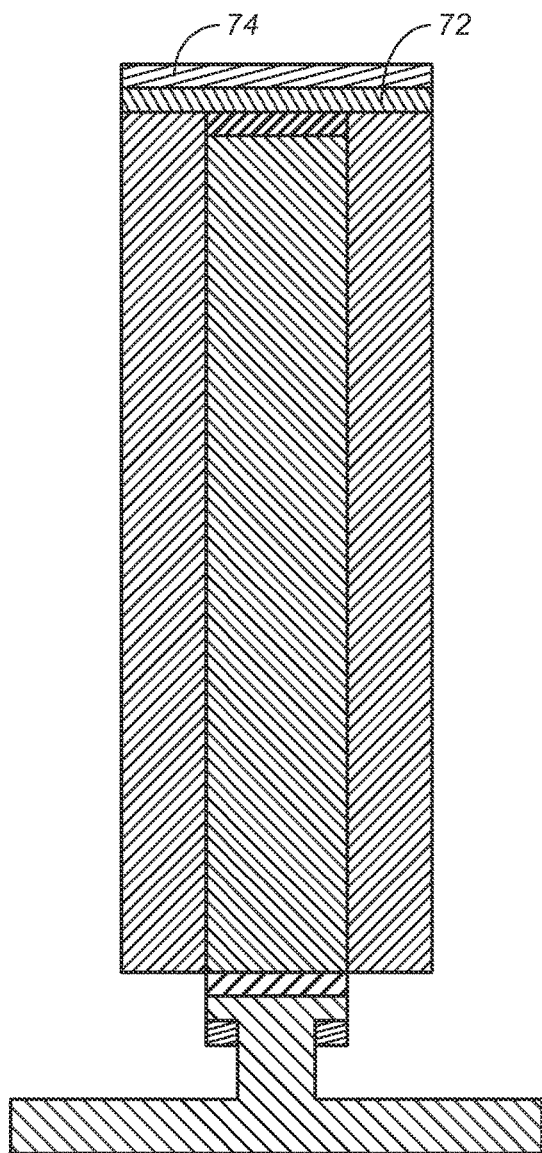
FIG. 7g-1     FIG. 7g-2

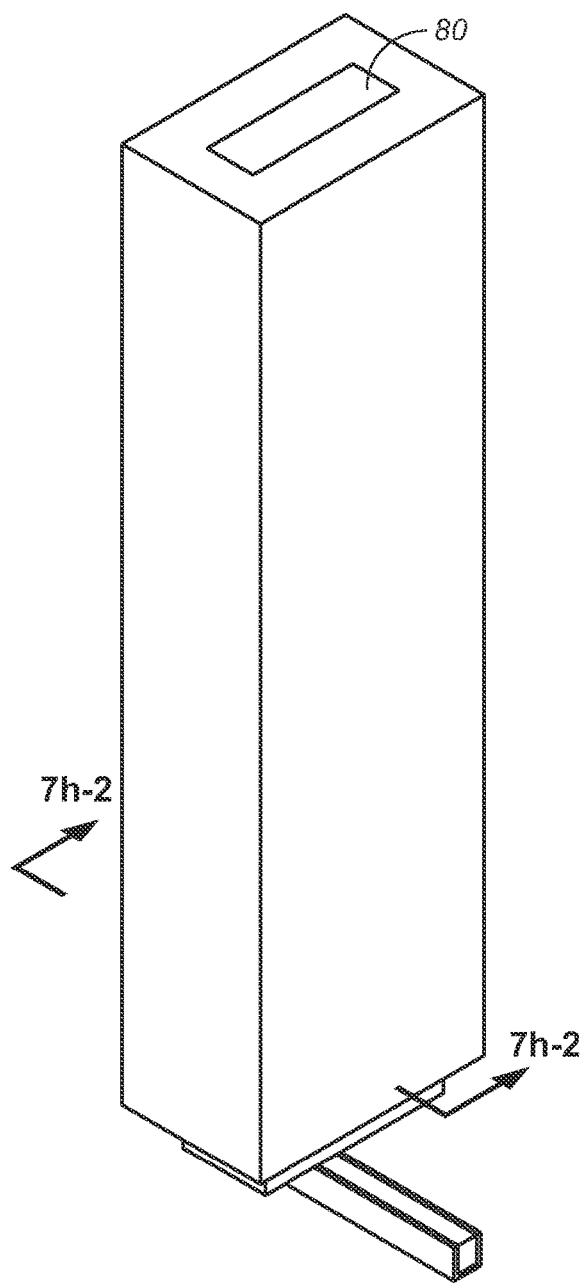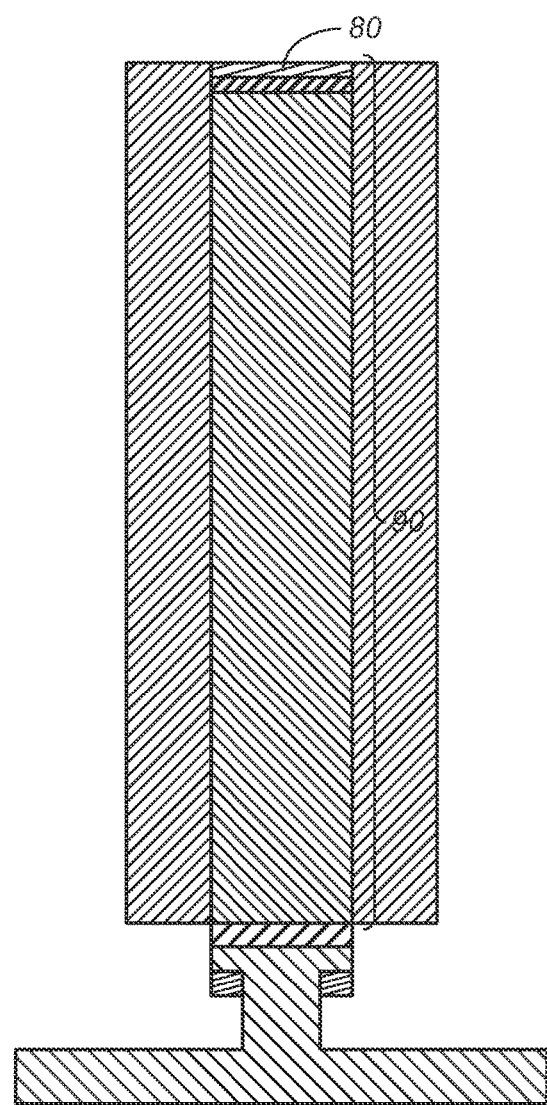
FIG. 7h-1      FIG. 7h-2

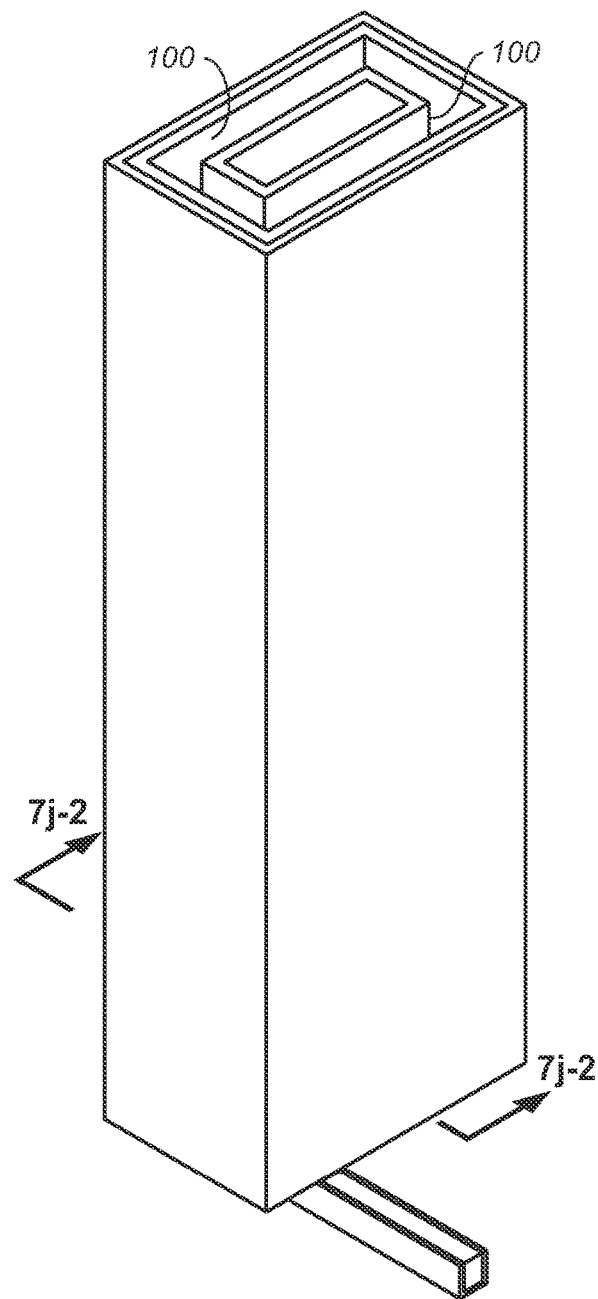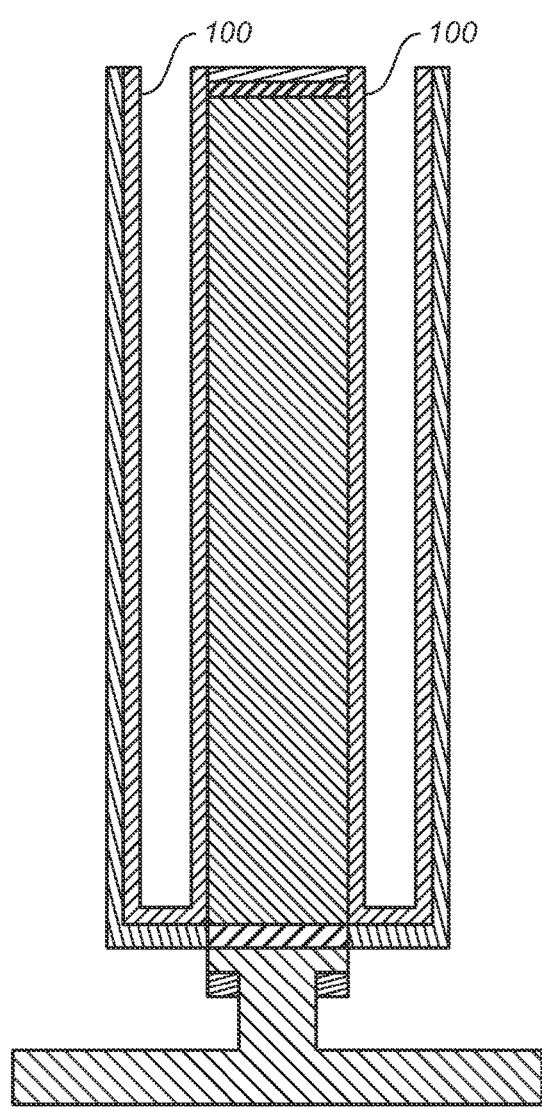
FIG. 7j-1   FIG. 7j-2

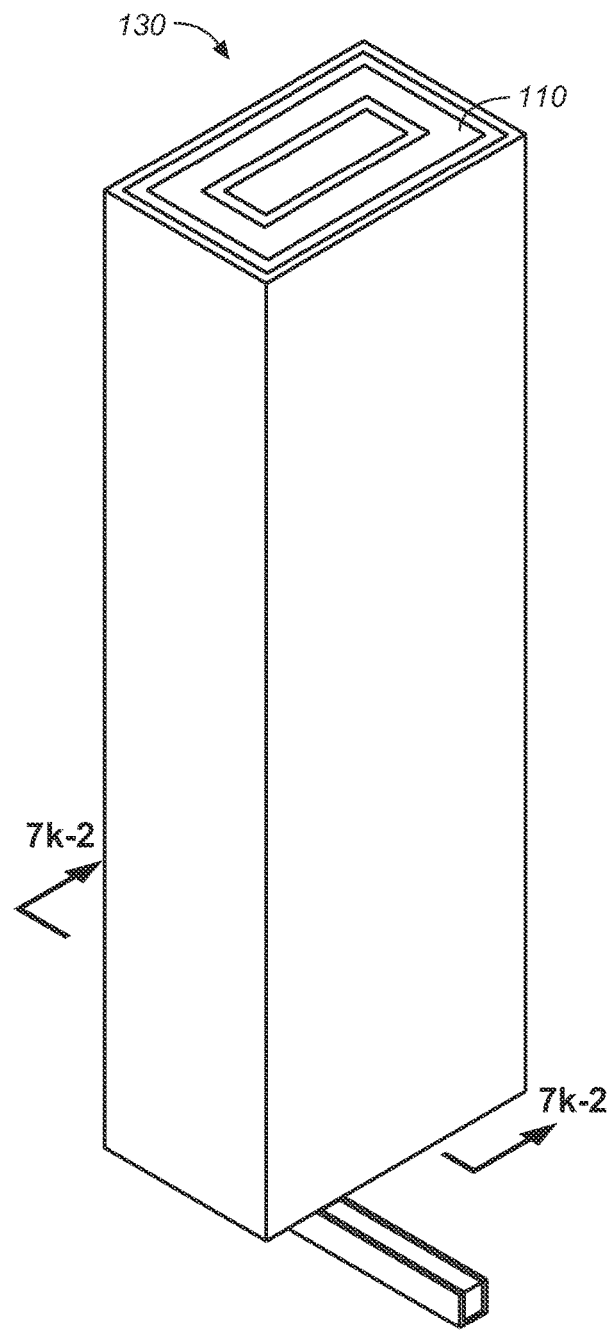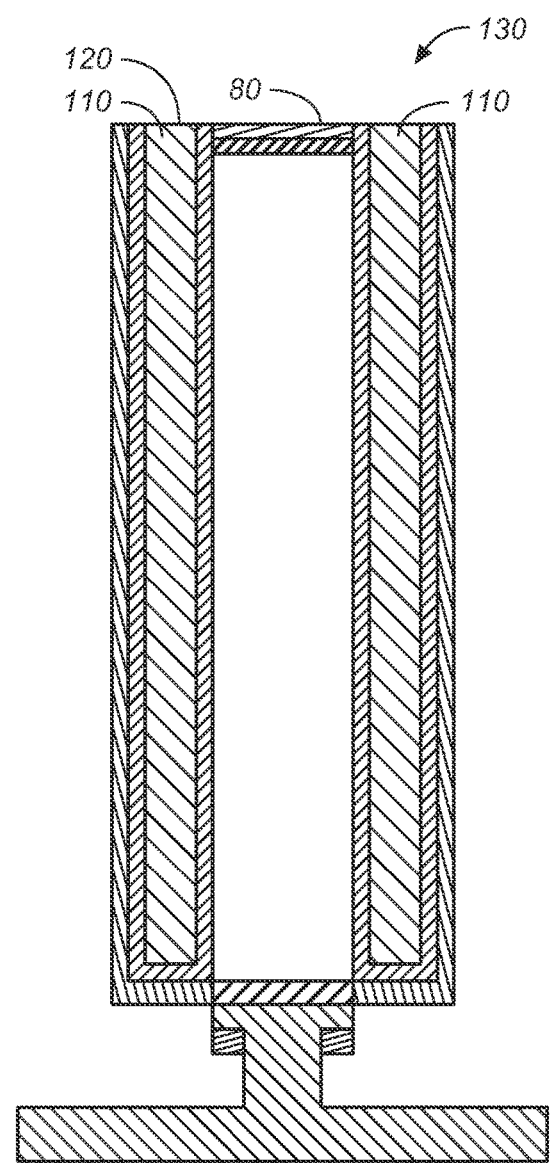
FIG. 7k-1　　　FIG. 7k-2

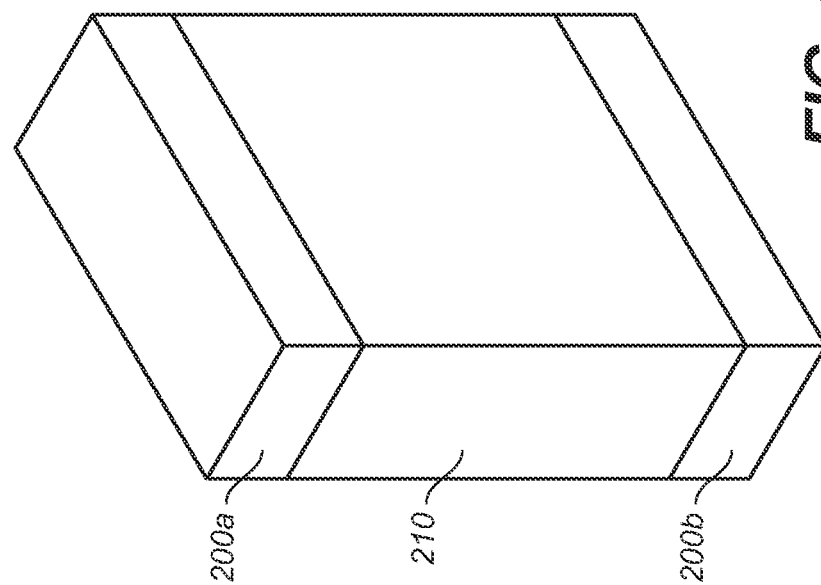
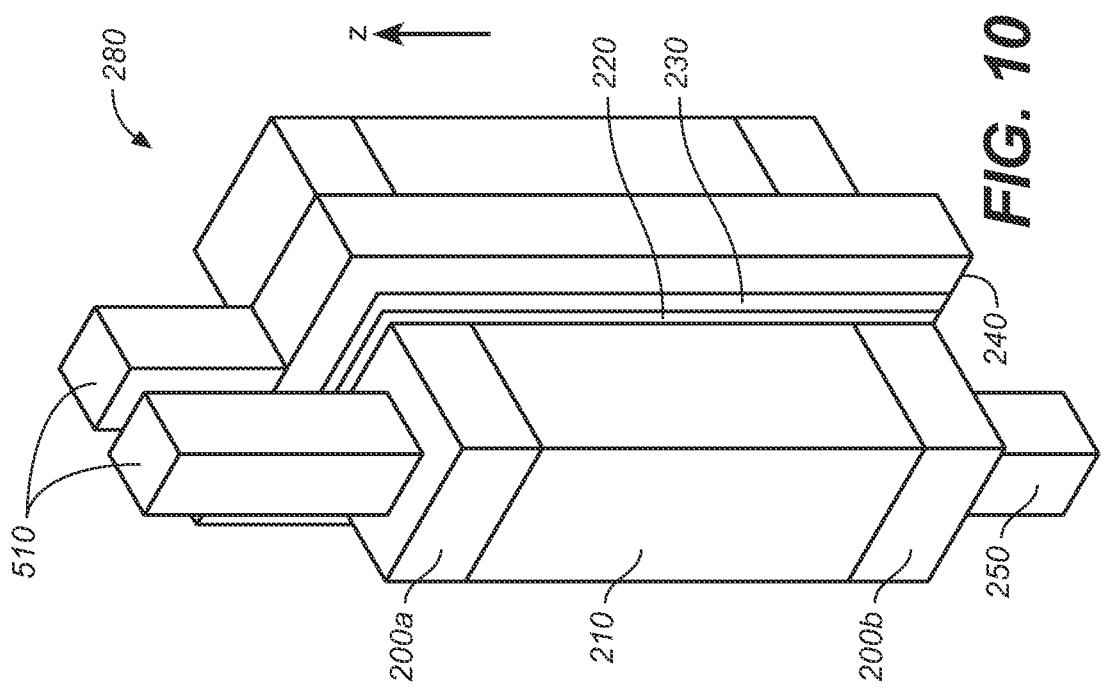

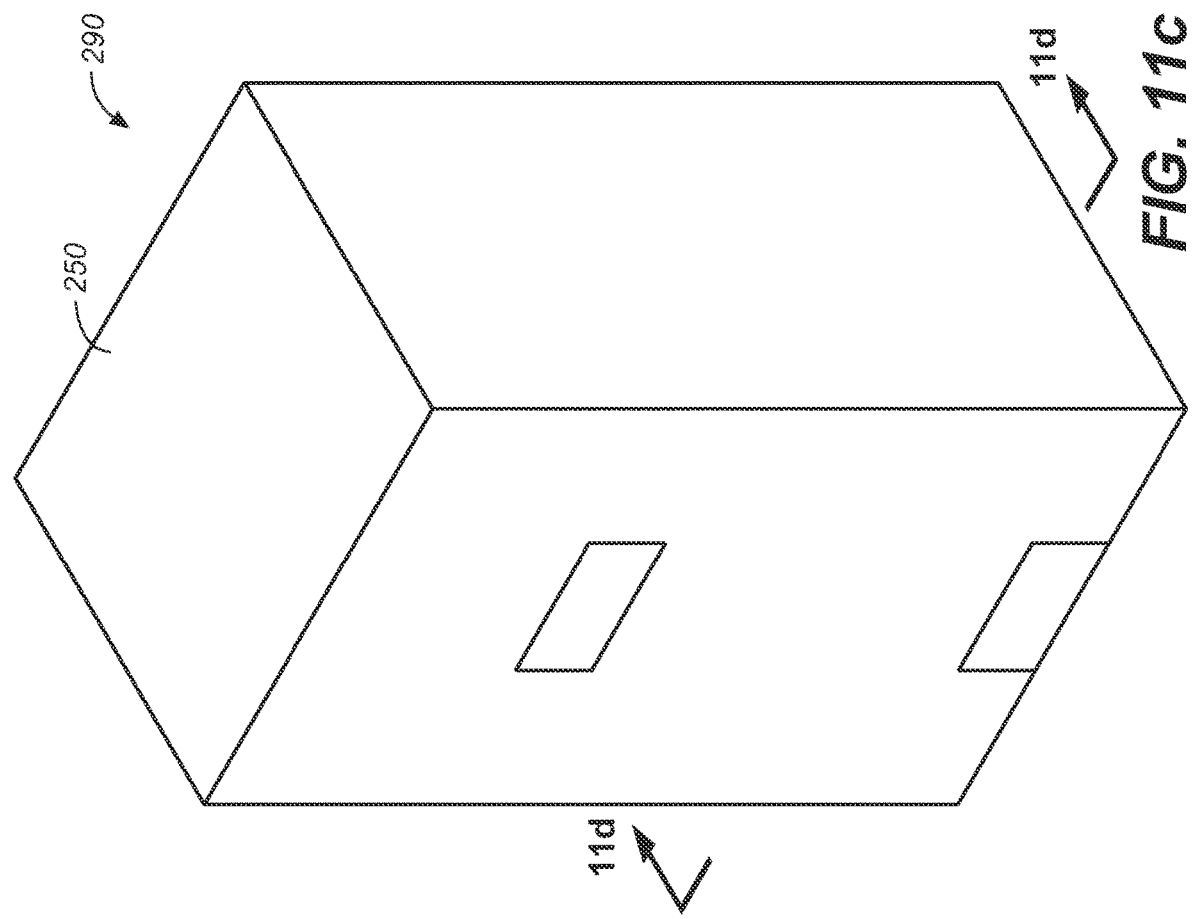
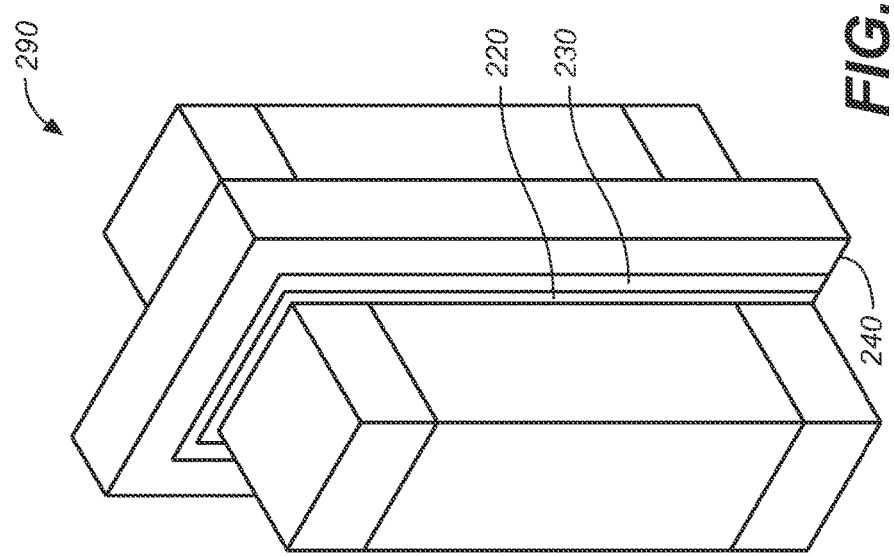

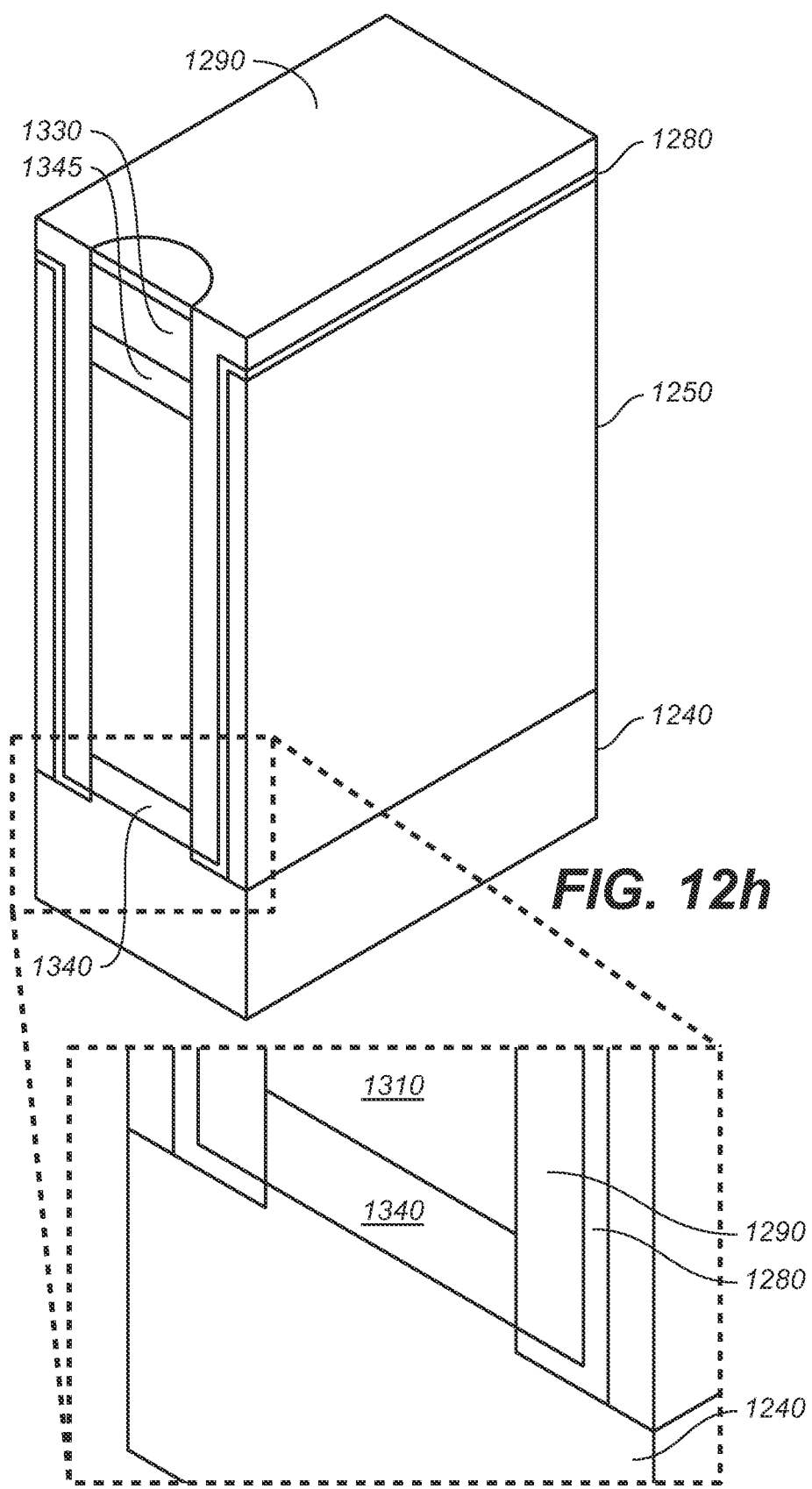

VERTICAL THIN-FILM TRANSISTOR AND APPLICATION AS BIT-LINE CONNECTOR FOR 3-DIMENSIONAL MEMORY ARRAYS

CROSS REFERENCE TO RELATED APPLICATIONS

The present application is a continuation-in-part application of U.S. patent application ("Parent Application"), Ser. No. 16/786,463, entitled "VERTICAL THIN-FILM TRANSISTOR AND APPLICATION AS BIT-LINE CONNECTOR FOR 3-DIMENSIONAL MEMORY ARRAYS," filed on Feb. 10, 2020, which is related to and claims priority of (i) U.S. provisional application ("Provisional Application III"), Ser. No. 62/804,080, entitled "Vertical Thin-Film Transistor And Application As Bit-line Connector For 3-Dimensional Memory Arrays,", filed on Feb. 11, 2019, and (ii) U.S. provisional application ("Provisional Application IV"), Ser. No. 62/947,405, entitled "Vertical Thin-Film Transistor And Application As Bit-line Connector For 3-Dimensional Memory Arrays," filed on Dec. 12, 2019.

The present application also relates to (i) U.S. provisional application ("Provisional Application I"), Ser. No. 62/734,175, entitled "Staircase Structures for Electrically Connecting Multiple Horizontal Conductive layers of a 3-Dimensional Memory Device," filed on Sep. 20, 2018; and (ii) U.S. provisional application ("Provisional Application II"), Ser. No. 62/771,922, entitled "Staircase Structures for Electrically Connecting Multiple Horizontal Conductive layers of a 3-Dimensional Memory Device," filed on Nov. 27, 2018.

The present application also relates to U.S. non-provisional application ("Non-provisional application"), Ser. No. 16/577,469, entitled "Staircase Structures for Electrically Connecting Multiple Horizontal Conductive Layers of a 3-Dimensional Memory Device," filed Sep. 20, 2019.

The disclosures of the Parent Application, Provisional Applications I, II, III and IV (collectively, the "Provisional Applications") and the Non-provisional application are hereby incorporated by reference in their entireties.

BACKGROUND OF THE INVENTION

1. Field of the Invention

The present invention relates to low defect-density thin-film transistors. In particular, the present invention relates to use of low defect-density thin-film transistors in 3-dimensional memory arrays.

2. Discussion of the Related Art

The Non-provisional application discloses a 3-dimensional array of thin-film storage transistors ("3-D memory array") formed above a planar surface of a semiconductor substrate. (For convenience of reference in the description herein, the direction perpendicular the planar surface is referred to as the "Z-direction," while two mutually orthogonal directions parallel to the planar surface are referred to as "X-direction" and "Y-direction," respectively.) Numerous 3-D memory arrays may be formed on a single semiconductor substrate.

The 3-D memory array includes multiple stacks of NOR memory strings spaced apart from each other in regular intervals along the X-direction, with each stack of NOR memory strings having multiple layers of NOR memory strings provided one on top of another (i.e., along the Z-direction) and isolated from each other. In one implementation, 8 layers of NOR memory strings are provided in each stack and 8 such stacks are provided along the X-direction. Each layer of NOR memory strings in each stack includes first and second strips of n-type or p-type polysilicon layers separated by a channel material-containing strip. The channel material-containing strip includes polysilicon layers in contact with the polysilicon layers of the first and second strips. These polysilicon layers in the channel material-containing strip may be lightly-doped polysilicon, preferably doped opposite in type as the polysilicon layers in the first and second strips. The first, second and channel material-containing strips each extend lengthwise along the Y direction, with a narrow width along the X-direction. The polysilicon layers of the first and second strips form common source and common drain regions for the layer of NOR memory strings.

As disclosed in the Non-provisional Application, each channel material-containing strip has two polysilicon layers exposed on opposite sidewalls of the stack, each polysilicon layer being separated from the other by an insulative material. The polysilicon layers form the channel regions of two thin-film storage transistors on opposite sides of the stack. Between adjacent stacks and in regular intervals along the Y-direction are provided conductive pillars (e.g., a heavily-doped polysilicon) each extending along the Z-direction insulated from each of the adjacent stacks by a charge-trapping material (e.g., an oxide-nitride-oxide triple-layer) covering the vertical sidewalls of the stacks. Each conductive pillar serves as a gate electrode. Where a conductive pillar ("local word line") overlaps one of the channel regions, together with its adjacent charge-trapping material, and its adjacent common source and common drain regions, a thin-film storage transistor is formed. Thus, two NOR memory strings are formed on opposite sides of each layer of NOR memory strings in each stack.

The Non-provisional Application discloses that CMOS support circuitry for memory operations (e.g., various power supply circuits, address decoders, and sense amplifiers) are formed in semiconductor substrate underneath the 3-D memory array. In one implementation, the circuitry for memory operation supporting each 3-D memory array above the semiconductor substrate is formed underneath the 3-D memory array itself to provide modularity.

The common drain regions ("bit lines") of the 3-D memory array and, in some implementations, the common source regions as well, extend along the Y-direction beyond both side sides of the 3-D memory array (the "array region") into the "staircase regions." In each staircase region, the bit lines (or source lines) of each layer of NOR memory strings of each stack extend to a different extent in the Y-direction to form a staircase-like structure, with the most extent being the layer of NOR memory strings closest to the semiconductor substrate and the least extent being the layer of NOR memory strings furthest from the semiconductor substrate. As illustrated in various embodiments in the Non-provisional Application, the staircase structure facilitates electrical connection between each bit line and its corresponding circuitry for memory operations (e.g., sense amplifiers).

SUMMARY

According to one embodiment of the present invention, a memory circuit includes: (i) a semiconductor substrate having a planar surface, the semiconductor substrate having formed therein circuitry for memory operations; (ii) an array of memory cells ("memory array") formed above the planar surface, the memory array having one or more conductors in a conductive layer for carrying electrical signals to memory cells in the memory array, the conductors each extending along a direction substantially parallel to the planar surface; and (iii) one or more transistors each formed above, alongside or below a corresponding one of the conductors in the conductive layer but above the planar surface of the semiconductor substrate, each transistor (a) having first and second drain or source region and a gate region each formed out of a semiconductor material, the first drain or source region, the second drain or source region or the gate region having formed thereon a metal silicide layer; and (b) selectively connects the corresponding conductor in the conductive layer to the circuitry for memory operations.

In one embodiment, the metal silicide layer includes a silicide of titanium or a silicide of nickel.

In one embodiment, the memory circuit further includes a second conductive layer, wherein the first drain or source region of each of the transistor connects to one of the conductors in the second conductive layer and the second drain or source region of the transistor connects to the corresponding conductor in the first conductive layer. The memory circuit may further include a set of interconnect lines, wherein the gate terminal of each transistor connects to one of the interconnect lines.

In one embodiment, when a current is present in the channel region of one of the transistors, the current flows in a direction substantially perpendicular to the planar surface.

In one embodiment, the memory array includes numerous levels of NOR memory strings, each level having multiple NOR memory strings, and wherein the conductors in the first conductive layer are common bit lines of the NOR memory strings. Portions of the common bit lines may be provided in a staircase structure extended from on one or both sides of the memory array. Further, each step of the staircase structure includes the common bit lines of a corresponding level of NOR memory strings, the transistors connected to the common bit lines at each step of the staircase form a bit-line selector for those common bit lines. The transistors of each bit-line selector form a first group and a second group, such that adjacent common bit lines selected by the bit-line selector are served by a transistor from the first group and a transistor from the second group, and wherein contacts to the transistors of the first group are placed in a staggered fashion relative to contacts to the transistors of the second group.

According to one embodiment of the present invention, a first process for forming a transistor, includes: (i) providing a semiconductor substrate with a planar surface; (ii) providing a first semiconductor layer of a first type and of a first doping concentration above the planar surface of the semiconductor substrate; (iii) providing a molding dielectric layer over the first semiconductor layer; (iv) etching the molding dielectric layer to provide a trench substantially perpendicular to the planar surface that exposes a surface of the first semiconductor layer; (v) filling the trench with a second semiconductor layer in an amorphous form, the second semiconductor layer being of a second type opposite the first type or having a second doping concentration lower than the first doping concentration; (vi) converting a portion of the second semiconductor layer to become a third semiconductor layer, the third semiconductor layer being of the first type or having a third doping concentration higher than the second semiconductor layer; and (vii) providing a metallic layer on the third semiconductor layer; and annealing the metallic layer to convert the metallic layer to a metal silicide.

The first process may further include: after providing the protective layer, (i) providing a second trench in the molding dielectric layer that is substantially perpendicular to the planar surface and which exposes a portion of the second semiconductor layer; (ii) providing an insulator over the exposed portion of the second semiconductor layer; and (iii) providing a conductive material to fill the second trench, the conductive material being insulated from the second semiconductor layer by the insulator. The conductive material providing a gate electrode to the transistor.

According to one embodiment of the present invention, a second process for forming a transistor includes: (i) providing a semiconductor substrate with a planar surface; (ii) providing a first semiconductor layer of a first type and of a first doping concentration above the planar surface of the semiconductor substrate; (iii) providing a molding dielectric layer over the first semiconductor layer; (iv) etching the molding dielectric layer to provide a trench substantially perpendicular to the planar surface to a surface of the first semiconductor layer; (v) providing a conductive material coating the exposed surface of the semiconductor layer and the sidewalls of the trench; (vi) providing an insulator coating the conductive material; (vii) etching away, anisotropically, any conductive material or any portion of the insulator material in the trench to expose the surface of the first semiconductor material; (viii) filling the trench with a second semiconductor layer in an amorphous form, the second semiconductor layer being of a second type opposite the first type or having a second doping concentration lower than the first doping concentration; (ix) converting a portion of the second semiconductor layer to become a third semiconductor layer, the third semiconductor layer being of the first type and having a third doping concentration higher than the second semiconductor layer; (x) providing a metallic layer on the third semiconductor layer; and (xi) annealing the metallic layer to convert the metallic layer to a metal silicide.

In the first and second processes, the step of converting a portion of the second semiconductor layer to the third semiconductor layer may include gaseous diffusion or ion implantation.

According to one embodiment of the present invention, a third process for forming a transistor includes: (a) providing a semiconductor substrate with a planar surface; (ii) providing a first semiconductor layer above the planar surface; (iii) providing a first insulator layer over the first semiconductor layer; (iv) providing a third semiconductor layer over the insulator such that the third semiconductor layer is isolated from the first semiconductor layer; (v) providing a second semiconductor layer in contact with both the first semiconductor layer and the second semiconductor layer, wherein a portion of the second semiconductor layer is provided above the third semiconductor layer; (vi) providing a second insulator layer over the second semiconductor layer; (vii) providing a conductive material over second insulator layer; (viii) providing a passivation layer to enclose the conductive material, the second insulator layer, the second semiconductor layer, the third semiconductor layer, the first insulator layer and the first semiconductor layer; (ix) etching the passivation layer to provide a via to expose a portion of the conductive material; (x) providing a metallic layer on the exposed portion of the conductive material or the exposed portion of the third semiconductor layer; and (xi) annealing the metallic layer to convert the metallic layer to a metal silicide.

The third process may further include etching the second semiconductor layer, the second insulator layer and the conductive layer to form a line structure around the third semiconductor layer, the first insulator layer and the first semiconductor layer.

According to one embodiment of the present invention, a fourth process for forming a transistor, includes (a) providing a first conductive semiconductor layer of a first conductivity above a planar surface of a semiconductor substrate; (b) providing a dielectric material over the first semiconductor layer; (c) creating first and second portions of a cavity in the dielectric material reaching down to the first semiconductor layer, the second portion of the cavity having a width significantly less than a corresponding width of the first portion of the cavity; (d) providing an etch stop layer conformally on the sidewalls of the cavity; (e) providing a sacrificial layer conformally on the sidewalls of the first cavity over the etch stop layer, the sacrificial layer being provided to a thickness such that the second portion of the cavity is substantially filled; (f) anisotropically etching the sacrificial layer, and the etch stop layer to expose a portion of the first semiconductor layer at the bottom of the first portion of the cavity; (g) providing an amorphous semiconductor material to fill the first portion of the cavity; (h) providing a metal layer on the amorphous semiconductor material; (i) annealing the metal layer into an alloy of the semiconductor material; (j) converting by ion implantation a portion of the crystallized semiconductor layer into a region of semiconductor material of the first conductivity type; (k) removing the sacrificial layer from the first and second portions of the cavity; (l) providing conformally a gate dielectric material on the side walls of the first and second portions of the cavity; and (m) filling the first and second portions of the cavity by a gate conductor layer.

In each of the first, second, third and fourth processes, the metal silicide may include one or more of: a silicide of titanium and a silicide of nickel. When the metallic layer includes titanium, the annealing may be carried out in excess of 550° C. for between 1 second and 24 hours. Specifically, in the case of titanium, the annealing is carried out (a) at 550° C. to 600° C. for 12-24 hours; (b) at 600° C. to 750° C. for 5 minutes to 12 hours; (c) at 750° C. to 800° C. for 1 minute to 5 minutes, or (d) at 800° C. to 1000° C. for 1 second to 1 minute. When the metallic layer includes nickel, the annealing is carried out between about 350° C. to about 450° C.

In each of the first, second, third and fourth processes, amorphous semiconductor material is converted by the annealing into a crystalline semiconductor material. The metal silicide adjacent to the amorphous semiconductor layer facilitates the crystallization process.

The present invention is better understood upon consideration of the detailed description in conjunction with the accompanying drawings.

BRIEF DESCRIPTION OF THE DRAWINGS

FIG. 7a, 7b-1, 7b-2, 7c, 7d-1, 7d-2, 7e-1, 7e-2, 7f-1, 7f-2, 7g-1, 7g-2, 7h-1, 7h-2, 7i, 7j-1, 7j-2, 7k-1, 7k-2, and 7l illustrate a fabrication process for forming a vertical TFT, according to one embodiment of the present invention.

FIG. 10 shows vertical TFT 280, according to one embodiment of the present invention.

FIGS. 11a, 11b, 11c, 11d, 11e, and 11f, illustrate a process in which vertical TFT 280 of FIG. 10 may be formed, according to one embodiment of the present invention.

FIGS. 12a, 12b, 12c, 12d, 12e, 12f, 12g, 12h, 12i, 12j, and 12k illustrate vertical TFTs 20 with high mobility that connect to memory cells of an array of NOR memory strings, according to yet another embodiment of embodiment of the present invention.

DETAILED DESCRIPTION OF THE PREFERRED EMBODIMENT

Figure 1A:
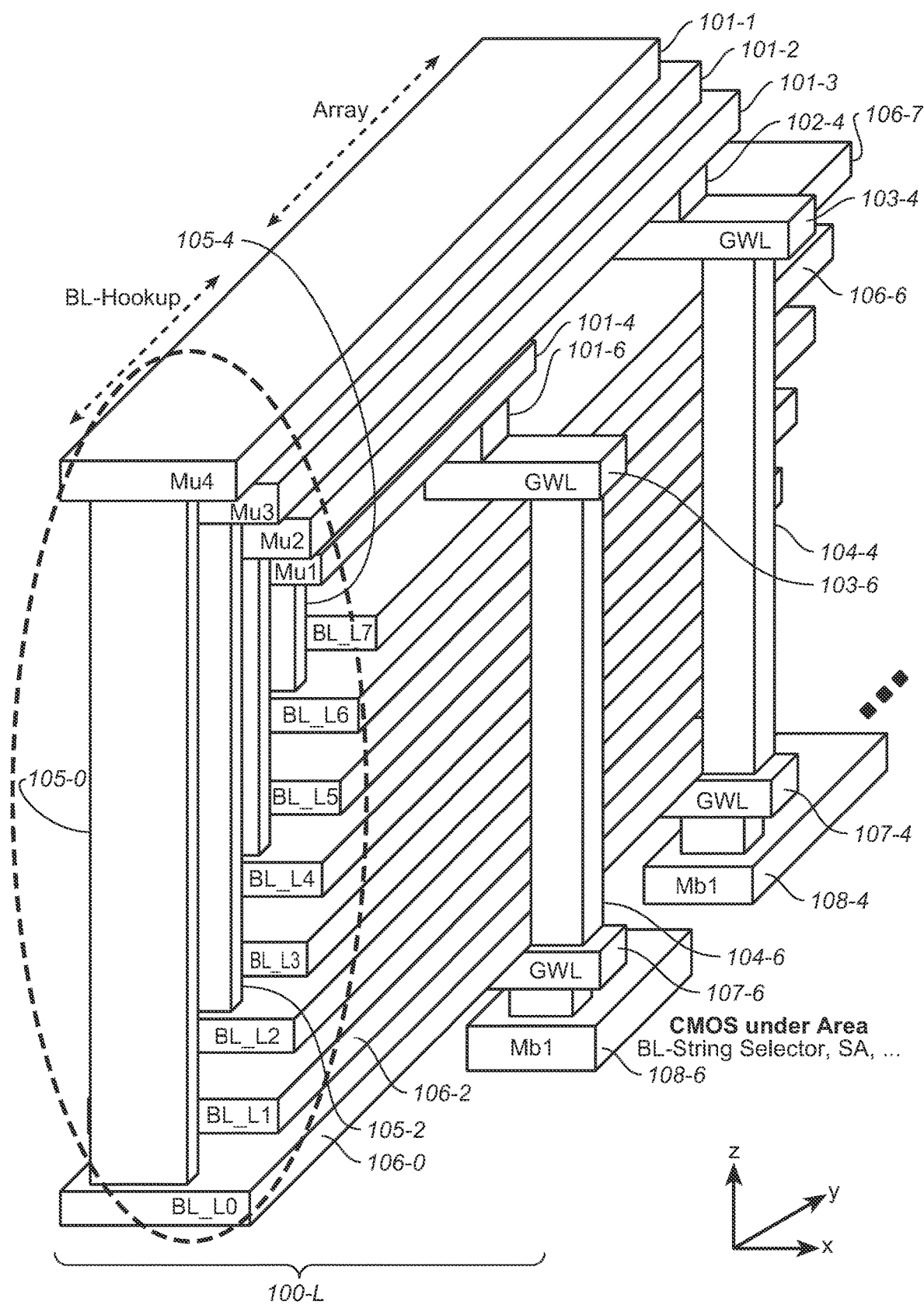
FIG. 1a illustrates 8-layer staircase structure 100-L for 8 bit lines from 8 layers of NOR memory strings on one-side of a 3-D memory array.

FIG. 1a illustrates 8-layer staircase structure 100-L for eight bit lines from eight levels of NOR memory strings on one-side of a 3-D memory array. As shown in FIG. 1a, staircase structure 100-L includes bit lines 106-0 to 106-7 extending to decreasing extents along the Y-direction. Bit lines 106-0, 106-2, 106-4, and 106-6 are electrically connected by conductor-filled vias 105-0, 105-2, 105-4 and 105-6 to conductors in conductive layers 101-1, 101-2, 101-3 and 101-4. In a corresponding staircase structure 100-R (not shown in FIG. 1a), bit lines 106-1, 106-3, 106-5, and 106-7 are electrically connected by conductor-filled vias 105-1, 105-3, 105-5 and 105-7 to conductors in the same conductive layers 101-1, 101-2, 101-3 and 101-4. The conductors of conductive layers 101-1, 101-2, 101-3 and 101-4 are respectively electrically connected to a first orthogonal set of interconnect conductors ("first global word lines").

Each first global word line in staircase structure 100-L (and 100-R also) routes electrical signals between the support circuitry in the semiconductor substrate to selected bit lines in like-level layers of NOR memory strings in the 3-D memory array. In this description, "like-level" refers to the layers of NOR memory strings that are roughly at the same level above the planar semiconductor substrate. As shown in FIG. 1a, first global word line 103-6 connects by via 102-6 to the conductor in conductive layer 101-4, which is electrically connected to bit line 106-6. First global word line 103-6 is connected by conductive pillar or local word line 104-6 through conductor 107-6 and through a via to buried contact 108-6. Conductor 107-6 is a conductor in a second set of interconnect conductors ("second global word lines") that run underneath the 3-D memory array substantially parallel to the first global word lines. Buried contact 108-6 is connected through a bit-line selector circuit (not shown in FIG. 1a, but which is described below in conjunction with FIG. 1c) to a sense amplifier that serves bit line 106-6. Second global word line 107-6 allows other circuitry (e.g., bias voltage sources) to connect to bit line 106-6.

In FIG. 1a, like first global word line 103-6, first global word line 103-4 connects by via 102-4 to a conductor in conductive layer 101-3, which is electrically connected to bit line 106-2. First global word line 103-4 is connected by local word line 104-4 through second global word line 107-4 and through a conductor-filled via to buried contact 108-4. Buried contact 108-4 is connected through a bit-line selector circuit to a sense amplifier that serves bit line 106-4. Second global word line 107-6 allows other circuitry (e.g., bias voltage sources) to connect to bit line 106-6.

Figure 1B:
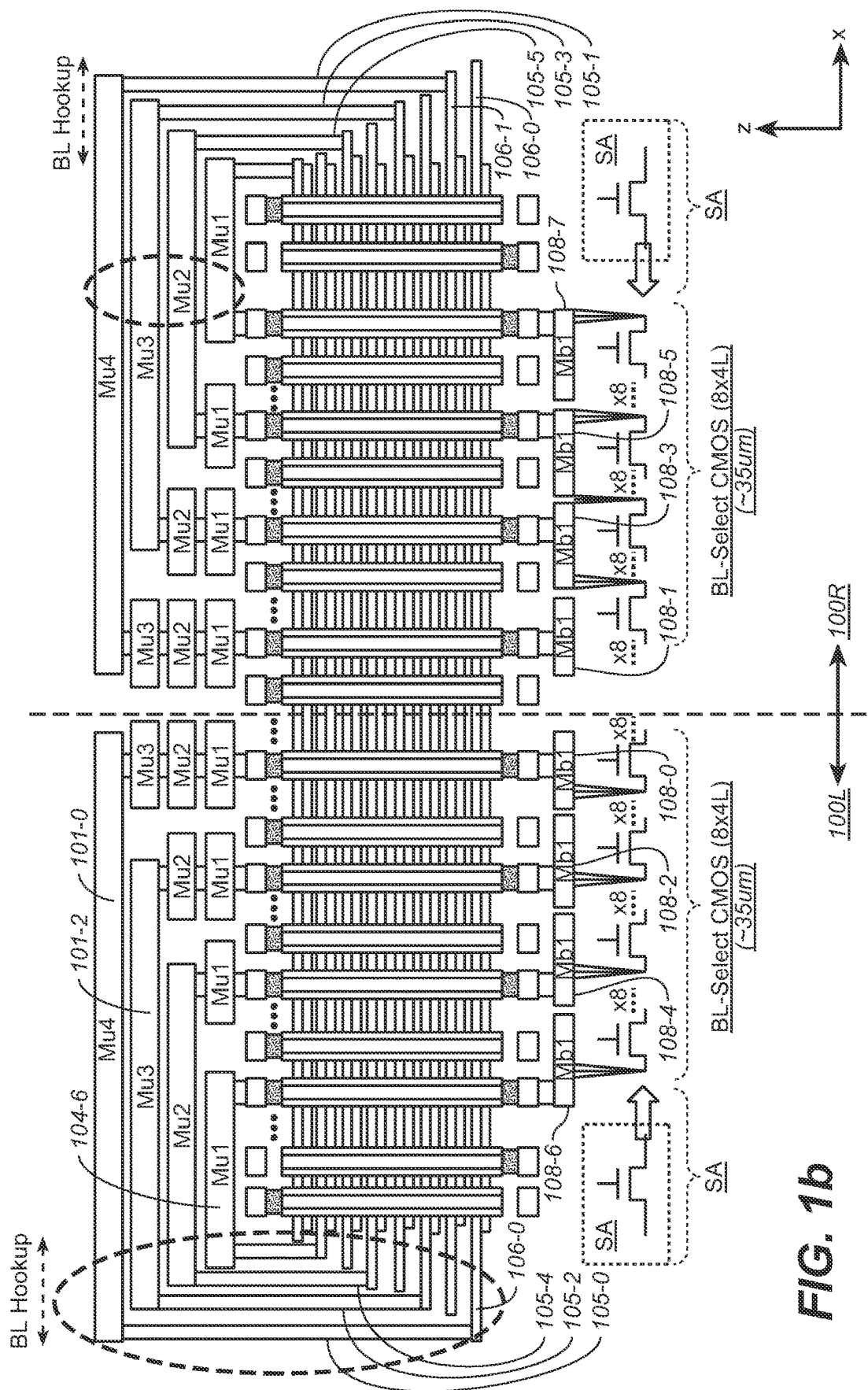
FIG. 1b shows the side views through the X-Z plane of staircase structures 100-L and 100-R, respectively.

FIG. 1b shows the side views in the X-Z plane of staircase structures 100-L and 100-R, respectively. FIG. 1b shows connections of bit lines 106-0, 106-2, 106-4 and 106-6 to buried contacts 108-0, 108-4, 108-6 and 108-8 in staircase structure 100-L, in the manner already discussed above with respect to FIG. 1a. FIG. 1b also shows connections of bit lines 106-1, 106-3, 106-5 and 106-7 to buried contacts 108-1, 108-3, 108-5 and 108-7 in staircase structure 100-R, in like manner FIG. 1b also indicates schematically that each of buried contacts 108-0, . . . , 108-6 and 108-7 is connected through an 8-input selection circuit for selecting one of 8 like-level bit lines across 8 stacks in the 3-D memory array.

Figure 1C:
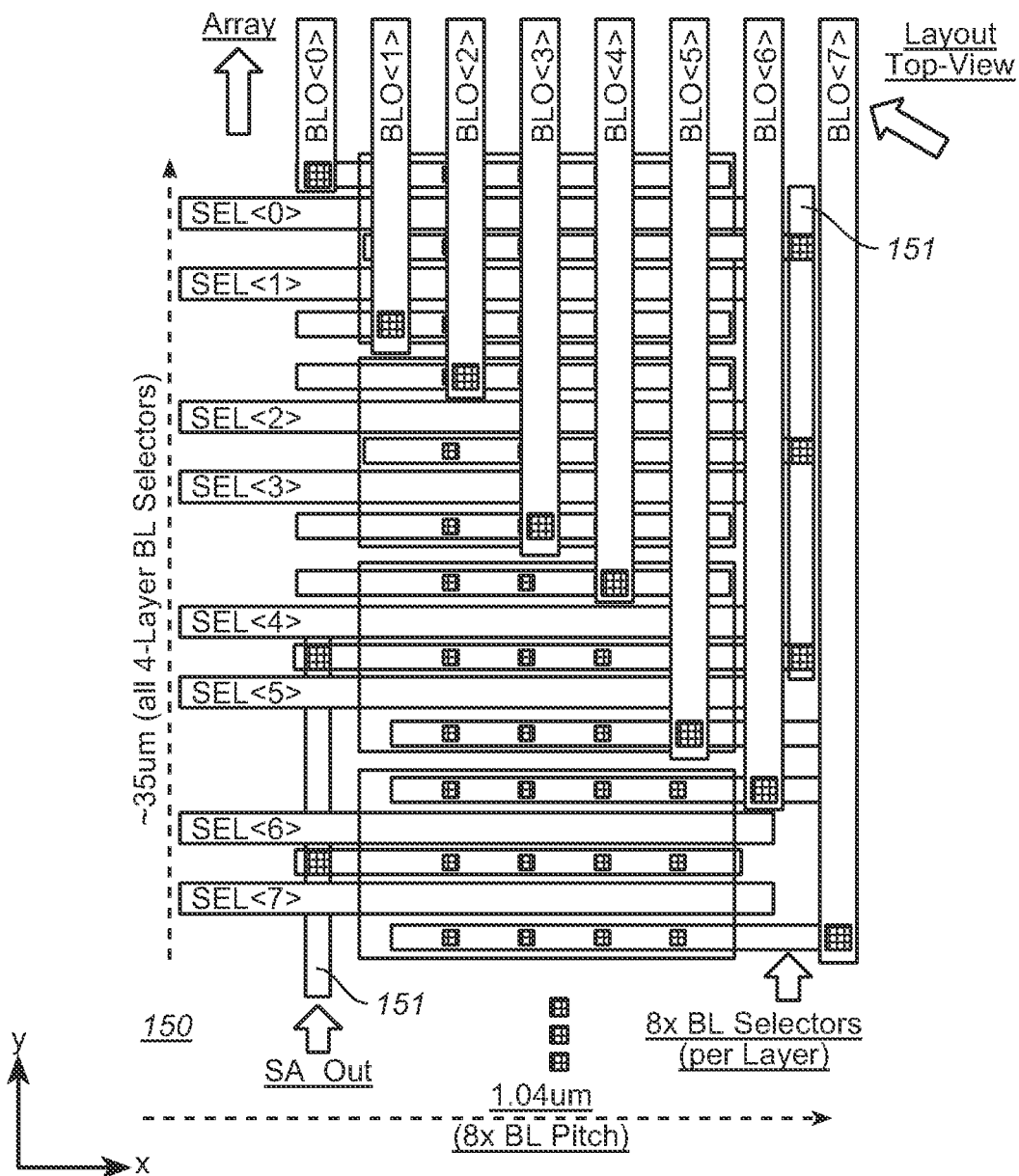
FIG. 1c shows a top view of 8-bit bit-line selector 150 for one selected level across 8 stacks of a 3-D memory array (e.g., the bit-line selector for bit line 106-0 of FIG. 1a).

Thus, in the connection method illustrated in FIGS. 1a and 1b, for an 8-level 3-D memory array, four additional conductive layers (i.e., conductive layers 101-1, 101-2, 101-3 and 101-4) are required. In general, the connection method of FIGS. 1a and 1b requires as many additional conductive layers as half the number of levels in the 3-D memory array. In addition, as the number of levels in the 3-D memory array increases, the silicon real estate underneath the 3-D memory array for the bit-line selectors increases proportionally. FIG. 1c shows a top view of 8-bit bit-line selector 150 for one selected level across 8 stacks of a 3-D memory array (e.g., the bit-line selector for bit line 106-0 of FIG. 1a).

As shown in FIG. 1c, bit lines BL0<0>, BL0<1>, , , and BL0<7> are each connected to a corresponding drain terminal of eight CMOS transistors that form bit-line selector 150 in the semiconductor substrate. Likewise BL1<0>, BL1<1>, , , , and BL1<7>, BL2<0>, BL2<1>, , , and BL2<7>, and BL3<0>, BL3<1>, , , and BL3<7> are each connected to one of another three 8-bit bit selectors. The source terminals of all 32 CMOS transistors in the four 8-bit bit line selectors are connected in common to terminal 151 of a sense amplifier which serves all 32 bit lines (i.e., the 32 bit lines correspond to eight bit lines in each of four selected levels of the staircase structure). In bit line selector 150, selection signals SEL<0>, SEL<1>, , , and SEL<7> are provided to corresponding gate electrodes of the eight CMOS transistors, such that, when one of the selection signals is activated, the corresponding CMOS transistor becomes conducting, connecting the corresponding bit line to terminal 151 of the sense amplifier.

Figure 1D:
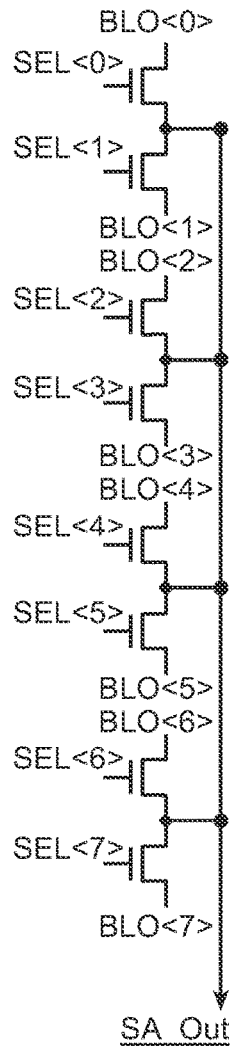
FIG. 1d is a schematic circuit diagram of 8-bit bit-line selector 150.

FIG. 1d is a schematic circuit diagram of 8-bit bit-line selector 150. In FIG. 1d, the eight CMOS transistors of bit line selector 150 are grouped into 4 transistor-pairs, with the two CMOS transistors in each transistor-pair sharing a common source region between them.

Figure 1E:
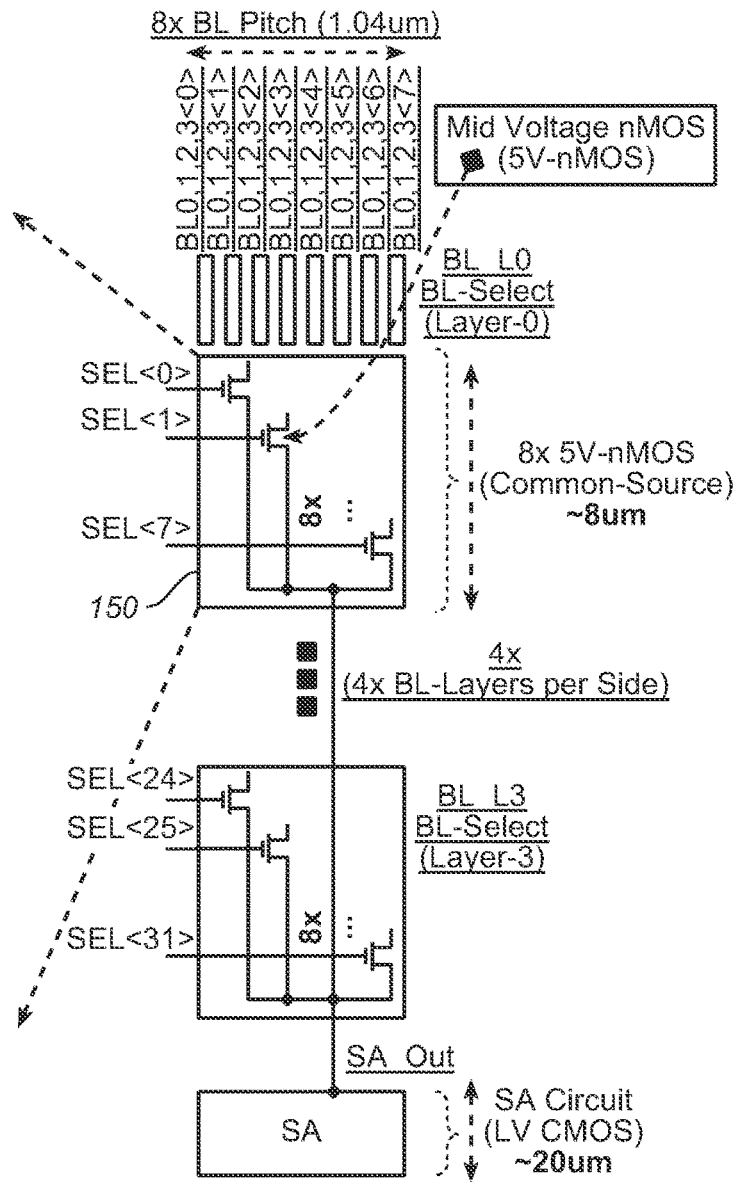
FIG. 1e shows, in the semiconductor substrate underneath a staircase structure, a sense amplifier connects to 4 8-bit bit-line selectors, with each 8-bit bit line connector being connected to common bit lines in a corresponding one of 4 levels of NOR memory strings in a 3-D memory array.

FIG. 1e shows, in the semiconductor substrate underneath a staircase structure, a sense amplifier connects to 4 8-bit bit-line selectors, with each 8-bit bit line selector being connected to bit lines in a corresponding one of 4 levels of NOR memory strings in a 3-D memory array.

In one implementation of the method of FIGS. 1a-1e, for an 8-level 3-D memory array, the four bit-line selectors (e.g., bit-line selector 150) underneath each staircase structure require about 35 µm² in semiconductor substrate area, which is substantially 28% of the semiconductor substrate area underneath the footprint of each 3-D memory array. As the number of levels in the 3-D memory array increases, the required semiconductor area for the bit-line selectors increases proportionally. The semiconductor area required for the bit-line selectors of a 3-D memory array having more than 16 levels would exceed the footprint of the 3-D memory array itself.

According to one embodiment of the present invention, the bit-line selectors in the semiconductor substrate for connecting the bit lines to the sense amplifier may are eliminated by implementing the bit-line selectors using thin-film transistors ("vertical TFTs") formed above, below or on the side of a staircase structure. The vertical TFTs allow the additional conductive layers (e.g., conductive layers 101-1, 101-2, 101-3 and 101-4 of FIGS. 1a and 1b) required for connecting the bit lines to be reduced to one. The vertical TFTs are so named because, in some preferred embodiments, their channel currents flow along the Z-direction. It is important to understand that the "vertical" designation in the vertical TFT is merely a convenient naming convention in this detailed description. As would be apparent in the description below, the channel current in a vertical TFT, although preferred for minimizing its footprint, need not flow along the Z-direction to perform its intended function.

Figure 2A:
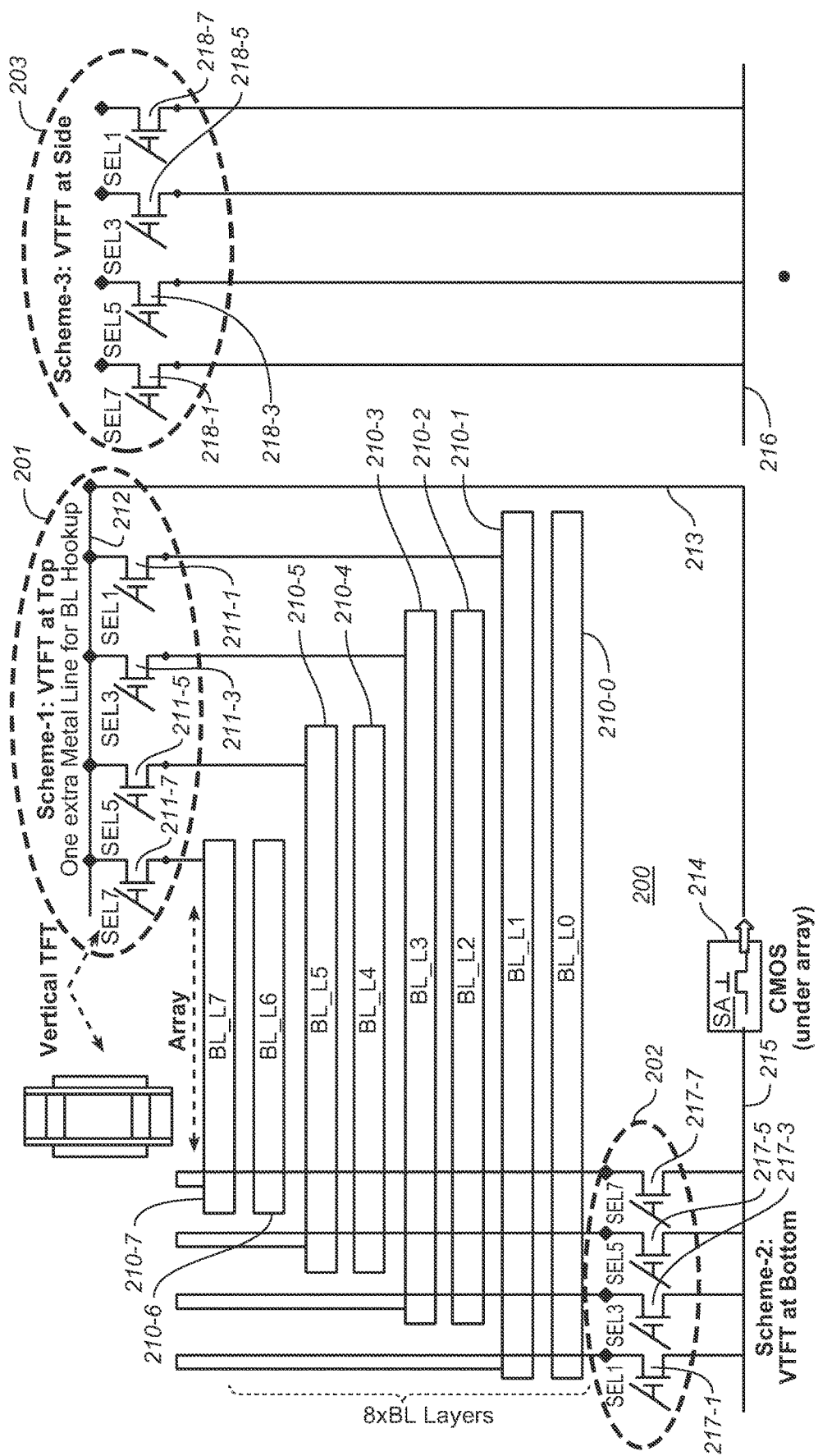
FIG. 2a illustrates schemes 201, 202 and 203 that provide vertical thin-film transistors (TFTs) above, below and alongside staircase structure 200, respectively, according one embodiment of the present invention.

FIG. 2a illustrates schemes 201, 202 and 203 that provide vertical TFTs above, below and alongside staircase structure 200, respectively. As illustrated in FIG. 2a, under scheme 201, bit lines at the same level of NOR memory strings of a 3-D memory array are connected through conductor-filled vias (e.g., conductor-filled vias 105-0, 105-2, 105-4 and 105-6 of FIG. 1a) to corresponding vertical TFTs formed above staircase structure 200 (e.g., vertical TFTs 211-1, 211-3, 211-5 and 211-7, connecting bit lines in levels 1, 3, 5 and 7, respectively). When a vertical TFT is switched on, it connects the corresponding bit line to a corresponding conductor in single conductive layer 212. Conductors in conductive layer 212 may be connected by other conductors (e.g., conductive pillars or local word lines) in staircase structure 200 to support circuitry in the semiconductor substrate (e.g., sense amplifier 214).

Under scheme 202, bit lines at the same level of NOR memory strings of a 3-D memory array are connected through conductor-filled vias (e.g., vias 105-0, 105-2, 105-4 and 105-6 of FIG. 1a) by available conductors to a corresponding one of vertical TFTs formed below staircase structure 200 (e.g., vertical TFTs 217-1, 217-3, 217-5 and 217-7, connecting bit lines in levels 1, 3, 5 and 7, respectively). For each bit line, such available conductors may include a corresponding short section of a first global word line (e.g., global word line 103-4 of FIG. 1a) and a corresponding local word line (e.g., local word line 104-4). When a vertical TFT is switched on, it connects the corresponding bit line to a corresponding conductor in single conductive layer 215. The conductors in conductive layer 215 may be selectively connected to support circuitry in the semiconductor substrate (e.g., sense amplifier 214).

Under scheme 203, bit lines at the same level of NOR memory strings of a 3-D memory array are connected through conductor-filled vias (e.g., conductor-filled vias 105-0, 105-2, 105-4 and 105-6 of FIG. 1a) by other conductors to a corresponding one of vertical TFTs formed alongside staircase structure 200 (e.g., vertical TFTs 218-1, 218-3, 218-5 and 218-7, connecting bit lines in levels 1, 3, 5 and 7). For each bit line, such other conductors may include a corresponding short section of a first global word line (e.g., global word line 103-4 of FIG. 1a) and a corresponding conductor-filled via. When a vertical TFT is switched on, it connects the corresponding bit line to a corresponding conductor in single conductive layer 216, which is connected to support circuitry in the semiconductor substrate (e.g., sense amplifier 214).

Figures 2B, 2C:
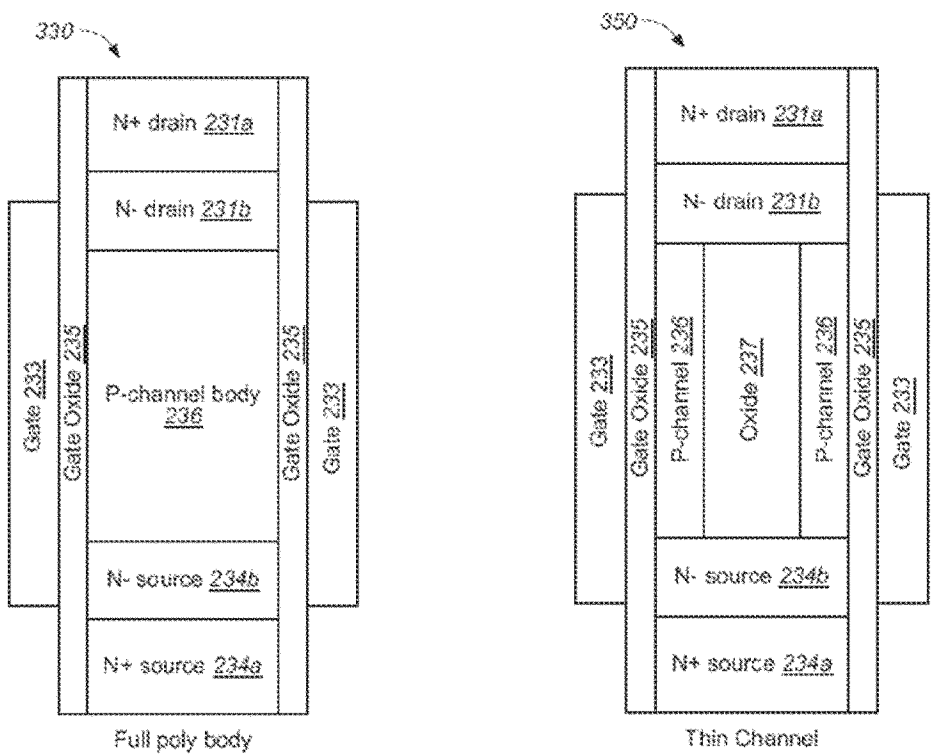
FIG. 2b shows a cross-section of vertical TFT 330, according to one embodiment of the present invention.
FIG. 2c shows a cross-section of vertical TFT 350, according to one embodiment of the present invention.

FIG. 2b shows a cross-section of vertical TFT 330, according to one embodiment of the present invention. As shown in FIG. 2b, vertical TFT 330 includes annular gate electrode 233 (e.g., a polysilicon gate) surrounding a semiconductor structure separated from annular gate electrode by annular gate oxide 235. (The term "annular," as used herein, refers not only to a circular ring, but refers also to any closed outer layer of any shape.) The semiconductor structure includes N$^+$-doped drain region 231a and N$^-$-doped drain region 231b, channel region 236, N$^-$-doped source region 234b and N$^+$-doped region 234a. Channel region 236 may be, for example, a P-type body region. When the voltage on gate electrode 233 exceeds the threshold voltage of vertical TFT 330, vertical TFT 330 becomes conducting, providing a low-resistance current path between N$^+$-doped drain region 231a and N$^+$-doped source region 234a.

FIG. 2c shows a cross-section of vertical TFT 350, according to one embodiment of the present invention. As shown in FIG. 2c, vertical TFT 350 includes annular gate electrode 233 (e.g., a polysilicon gate) surrounding a semiconductor structure separated from annular gate electrode by annular gate oxide 235. Like vertical TFT 330 of FIG. 2b, the semiconductor structure of vertical TFT 350 includes N$^+$-doped drain region 231a and N$^-$-doped drain region 231b, N$^-$-doped source region 234b and N$^+$-doped region 234a. Unlike TFT 330 of FIG. 2b, however, channel or P-type body region 236 of vertical TFT 350 is annular, surrounding an oxide core 237. When the voltage on gate electrode 233 exceeds the threshold voltage of vertical TFT 350, vertical TFT 350 becomes conducting, thus providing a low-resistance current path between N$^+$-doped drain region 231a and N$^+$-doped source region 234a.

FIGS. 2b and 2c are not drawn to scale. In one implementation, gate oxide 235 may be 20 nm thick, gate electrode 233 may be 40 nm thick, the channel length (i.e., along the Z-direction) of p-type body region 236 may be 500 nm. The footprint of p-type body 236 may be 150 nm by 100 nm (in X-direction and Y-direction, respectively), so that the channel width, as approximated using the perimeter of the footprint is also 500 nm. With these dimensions, when driven gate-to-source ($V_{GS}$) at its threshold voltage plus 8 volts and drain-to-source ($V_{DS}$) at 0.5 volts, a vertical TFT may provide a drain-to-source ($I_{DS}$) current capability of approximately 2.25 µA. When the channel region is provided a high quality crystalline semiconductor, such as when the crystallization is facilitated by a metal silicide, as discussed below, a significantly greater current capability (e.g., 15 µA) may be achieved at these dimensions.

Figure 3:
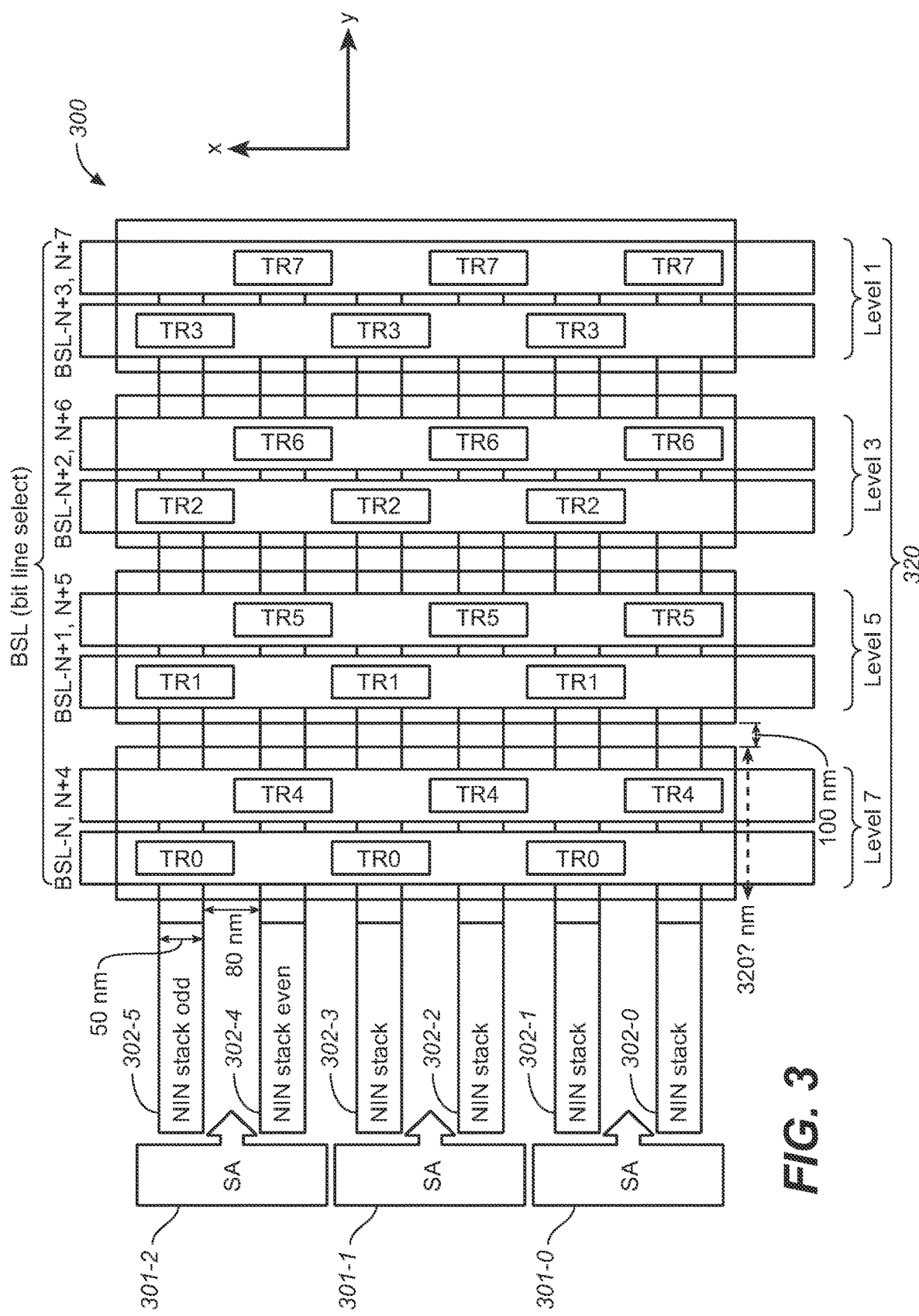
FIG. 3 shows bit-line selector 300 formed using vertical TFTs that are provided above staircase structure 320, in accordance with one embodiment of the present invention.

FIG. 3 shows bit-line selector 300 formed using vertical TFTs that are provided above staircase structure 320 (i.e., scheme 201), in accordance with one embodiment of the present invention. As shown in FIG. 3, bit-line selector 300 is shown providing vertical TFTs for connecting to the bit lines at levels 1, 3, 5 and 7 of staircase structure 320. For efficient use of space, as explained below, two sets of vertical TFTs are provided for each level of bit lines, with one set of vertical TFTs provided for connecting to the odd bit lines, while the other set of vertical TFTs provided for connecting to the even bit lines. For example, vertical TFTs TR0 connect to odd bit lines 302-1, 302-3, 302-5 and 302-7 of level 7, while vertical TFTs TR4 connect to even bit lines 302-0, 302-2, 302-4 and 302-6 of level 7. Likewise, vertical TFTs TR1, TR2, and TR3 connect to the odd bit lines of levels 5, 3 and 1, respectively, while vertical TFTs TR5, TR6 and TR7 connect to the even bit lines of levels 5, 3 and 1, respectively. This arrangement allows a staggered placement of the vertical TFTs that serve adjacent bit lines.

In one implementation, each bit line has a width of 50 nm and adjacent bit lines are spaced 80 nm apart, providing a 130 nm bit-line pitch. A sense amplifier serving adjacent bit lines (e.g., sense amplifiers 301-0 serve adjacent bit lines 302-0 and 302-1 at each of levels 1, 3, 5 and 7) may be provided between twice the bit-line pitch (i.e., 260 nm). In that embodiment, a vertical TFT providing the desired drive may have a foot-print of 150 nm by 100 nm (and a vertical channel length of 500 nm). Accordingly, in bit-line selector 300, the two sets of vertical TFTs serving each level are placed side-by-side along the Y-direction, but with their contacts placed in a staggered manner relative to each other, to allow vertical TFTs serving adjacent bit lines to fit within 260 nm (i.e., twice the bit-line pitch). Specifically, in one embodiment, each vertical TFT has a footprint that exceeds the bit-line pitch in both the X-direction and the Y-direction. By placing adjacent vertical TFTs TR0 and TR4 in a staggered manner, the combined footprints of the two adjacent vertical TFTs fit within a 320 nm (Y-direction) by 260 nm (X-direction) area. For an 8-level 3-D memory array, with an array length (i.e., the length of each NOR memory string along the Y-direction) of 160 µm, staircase structure 320 need only extend 2 µm along the Y-direction to accommodate bit-line selector 300 of the present invention.

Figure 4:
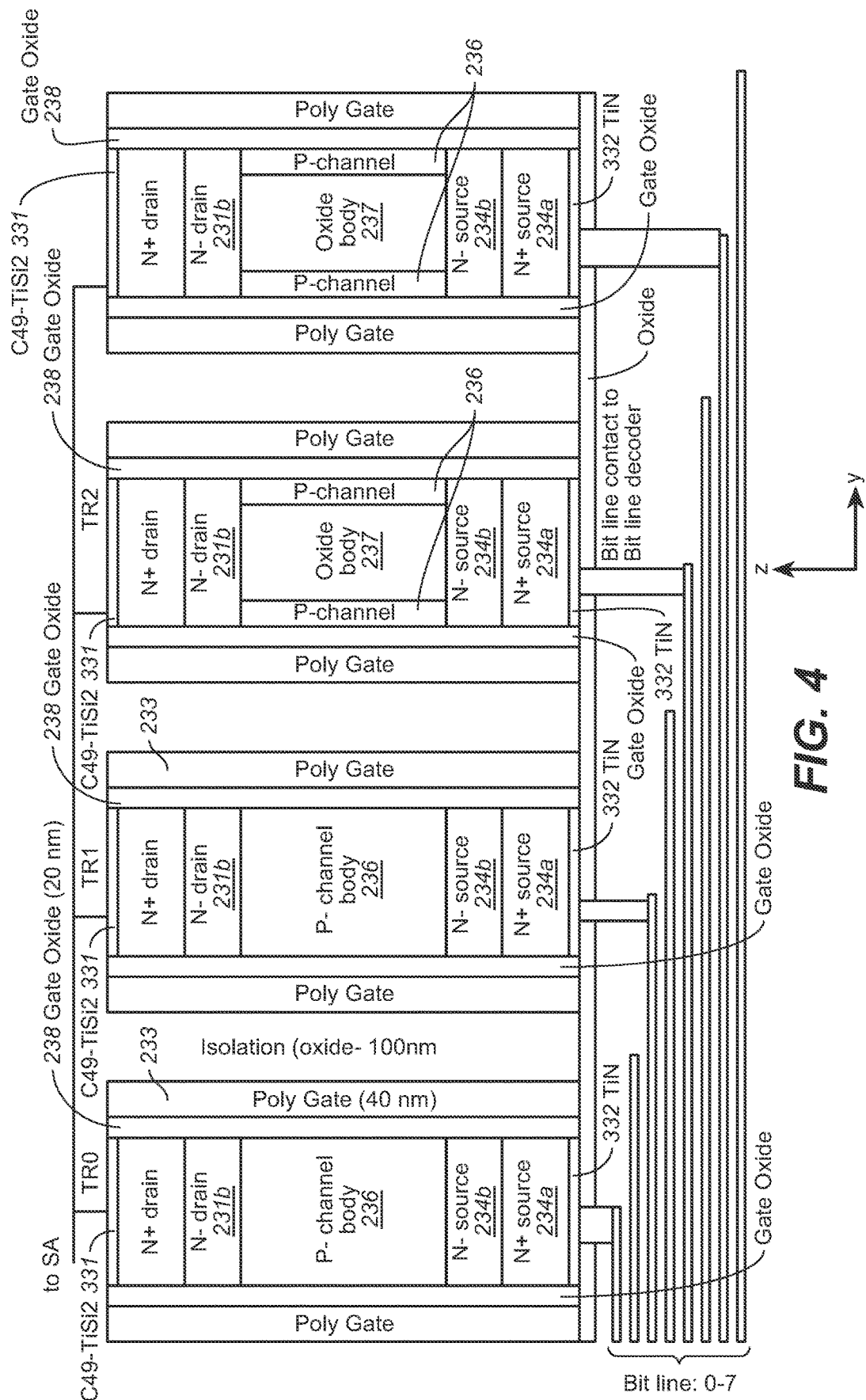
FIG. 4 shows a Y-Z plane cross-section of staircase 320 of FIG. 3 through an odd bit line, according to one embodiment of the present invention.

FIG. 4 shows a Y-Z plane cross-section of staircase 320 of FIG. 3 through an odd bit line, according to one embodiment of the present invention. Merely for purpose of illustration, FIG. 4 shows vertical TFTs TR0 and TR1 being implemented by vertical TFTs of the type illustrated by vertical TFT 330 of FIG. 2b. FIG. 4 also shows vertical TFTs TR2 and TR3 being implemented by vertical TFTs of the type illustrated by vertical TFT 350 of FIG. 2c. Any vertical TFT disclosed herein is suitable for implementing any of vertical TFTs TR0, TR1, TR2 and TR3 shown in FIG. 4. Further, each vertical TFT in FIG. 4 is provided thin layer 332 of titanium nitride (TiN) on N+-doped source region 234a to provide good electrical contact. In addition, layer 331 of a C49 titanium silicide (TiSi$_2$) is formed on each vertical TFT adjacent N+-doped drain region 231a. As explained below, for example, an annealing step forming the TiSi$_2$ layer also leads to crystallization of any adjacent amorphous semiconductor material, as the TiSi$_2$ layer provides a seed layer that causes the adjacent amorphous semiconductor material to become crystalline. The crystalline semiconductor material thus formed has fewer defects and a higher carrier mobility, as compared to a semiconductor layer that is crystallized without the presence of a seed layer. Alternatively, the semiconductor layer may be crystallized using a metal silicide, such as nickel silicide. In this alternative method, the metal silicide leaves a crystallized semiconductor with fewer defects and a higher mobility behind a wave-front of a metal silicide layer.

Figure 5:
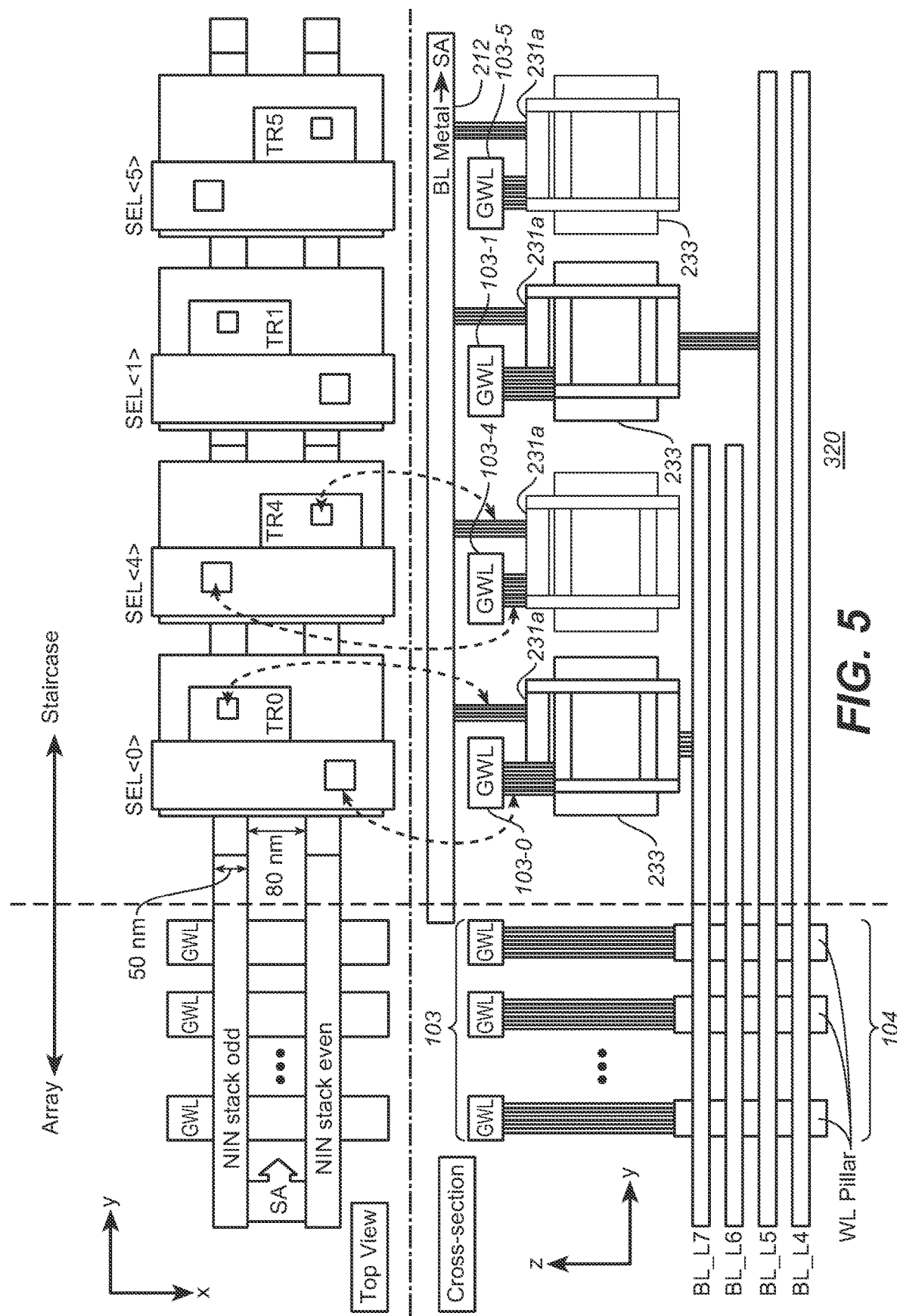
FIG. 5 shows, in staircase structure 320, connections of bit-line selection signals using global word lines 103-0, 103-4, 103-1 and 103-5 to gate terminals 233 of each of vertical TFTs TR0, TR4, TR1 and TR5, respectively, and connections of drain terminal 231a of each of vertical TFTs TR0, TR4, TR1 and TR5 using conductive layer 212.

FIG. 5 shows, in staircase structure 320, connections of bit-line selection signals using global word lines 103-0, 103-4, 103-1 and 103-5 to the gate terminals of vertical TFTs TR0, TR4, TR1 and TR5, respectively, and connections of the drain terminals of vertical TFTs TR0, TR4, TR1 and TR5 using conductive layer 212. In FIG. 5, cross sections in both X-Y and Y-Z planes are shown. As shown in FIG. 5, selection signals to vertical TFTs TR0 and TR4 connect through first global word lines 103-0 and 103-4 to bit lines at level 7 of staircase 320 and selection signals to vertical TFTs TR1 and TR5 connect through first global word lines 103-1 and 103-5 to bit lines at level 5 of staircase 320. FIG. 5 also shows that the first global word lines are typically used in the array portion of the 3-D memory array to connect to local word lines, which are provided as conductive pillars. The drain terminals (e.g., drain terminal 231a) of vertical TFTs TR0, TR4, TR1 and TR5 (and also the drain terminals of vertical TR2, TR6, TR3 and TR7 in other levels) are served by the same sense amplifier and are connected to a common conductor in conductive layer 212. Thus, unlike the methods illustrated in FIGS. 1a-1e, which require additional conductive layers equal in number to half the levels in the 3-D memory array, using vertical TFTs, the methods of FIGS. 2-5 require merely one single additional conductive layer.

One significant advantage of the vertical TFTs described herein is the reduced footprint projected on the surface of the underlying semiconductor substrate, because the current flows in the Z-direction, substantially perpendicular the semiconductor substrate. As used herein, the term "footprint" refers to the area that the vertical TFT projects on the semiconductor substrate, when viewed top-down. In general, the current provided by the vertical TFT in the "on" or conducting state is proportional to the mobility of the charge carriers in its channel region. As higher "on" currents are desirable for integrating the vertical TFT with memory cell operations, higher mobilities in the charge carriers in the vertical TFTs are desirable.

The following description illustrates various embodiments of vertical TFTs within the scope of the present invention, whether or not discussed above, and methods of forming such vertical TFTs. The process steps described in one embodiment herein may be used in another embodiment, even if those steps are not expressly described in the context of the other embodiment. When a reference is made herein to a method of two or more specified steps, unless otherwise stated herein or required by the context, such specified steps can be carried out in any order or simultaneously. Likewise, such a method can also include one or more other steps carried out before or after the specified steps, or between any two specified steps.

Figure 6:
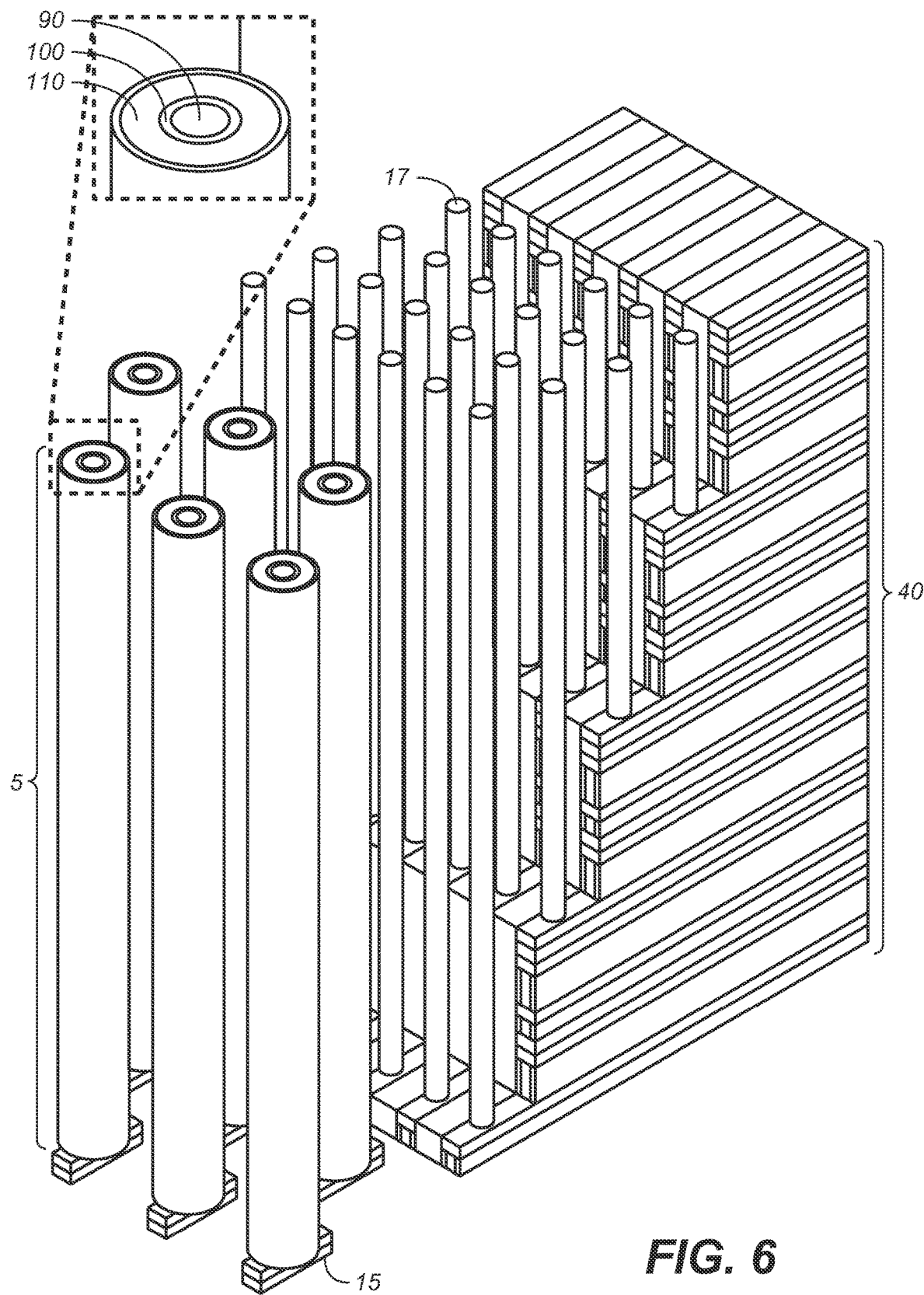
FIG. 6 is an isometric view of several vertical TFTs (e.g., vertical TFT 5) and staircase structure 40 prior to interconnections by interconnect conductors above the vertical TFTs and staircase structure 40 are fabricated, according to one embodiment of the present invention.

FIG. 6 is an isometric view of several vertical TFTs (e.g., vertical TFT 5) and staircase structure 40 prior to interconnections are fabricated by interconnect conductors above the vertical TFTs and memory structure 40, which includes a staircase structure, according to one embodiment of the present invention. The staircase structure in memory structure 40 includes numerous conductor-filled vias (e.g., conductor-filled via 17) each connected to a bit line (i.e., the common drain region) at each level of the 3-D memory array. In FIG. 6, the vertical TFTs are shown alongside staircase structure 40 (such as discussed above with respect to scheme 203 of FIG. 2a). As shown in FIG. 6, vertical TFT 5 is electrically connected at the bottom by a conductive element 15, which may be formed by the same material as a common drain region of a NOR memory string (i.e., a doped semiconductor layer, which may also be strapped to a metal layer to reduce resistance), thereby allowing conductive element 15 to be formed simultaneously with the bit lines during the same masking and etching steps. As shown in FIG. 6, vertical TFT 5 includes semiconductor pillar 90 surrounded concentrically by gate oxide layer 100, and gate electrode layer 110. Semiconductor pillar 90 includes a channel region (not shown) and a source region (not shown) for vertical TFT 5. Conductive element 15 forms a drain region for vertical TFT 5. Semiconductor pillar 90, which is substantially perpendicular to the plane of the semiconductor substrate, provides a current flow along the vertical direction which allows a considerably reduced area on the semiconductor substrate. The following description includes process steps that allow semiconductor pillar 90 to have a low crystalline defect density and a high charge carrier mobility in the channel region of the resulting vertical TFT, thereby providing an improved current capability.

Figure 7A:
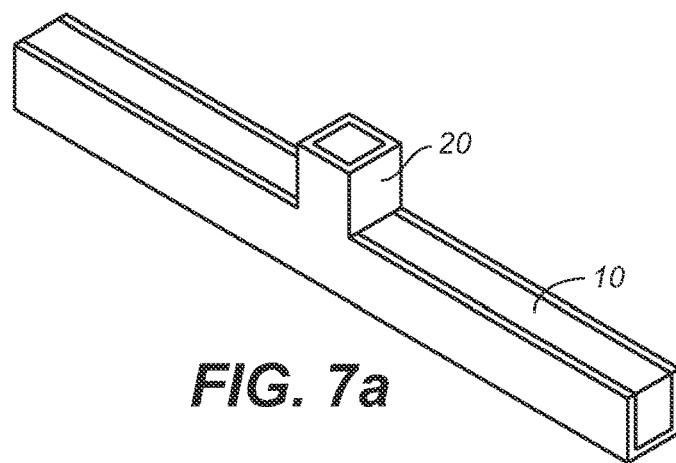

FIGS. 7a to 7l illustrate a fabrication process for forming a vertical TFT, according to one embodiment of the present invention. As shown in FIG. 7a, initially, conductive interconnect 10 is formed above and substantially along a direction parallel to the semiconductor substrate. Suitable material for interconnect 10 includes any of molybdenum, cobalt, tungsten, titanium nitride, tantalum nitride, tantalum, titanium, one or more combinations of the foregoing, and any other suitable conductive material. Interconnect 10 may include conductor-filled via 20 which allows connection to a bit line in a staircase structure (e.g., staircase structure in memory structure 40 of FIG. 6). The conductive material in conductor-filled via 20 may be the same as that used for interconnect 10.

Interconnect 10 and conductor-filled via 20 may be formed using any suitable method, such as a subtractive formation, in which a conductive material is deposited and defined by a photo-lithographical process, as known to those of ordinary skill in the art. The conductive material may be deposited using any suitable method, such as evaporation, sputtering, chemical vapor deposition (CVD), atomic layer deposition (ALD), or electrochemical deposition, or any other suitable method. Etching during the photo-lithographical process may be accomplished using any suitable method, such as wet acids or bases, a corrosive gas (e.g., chlorine, bromine, or fluorine), or any suitable corrosive agent. Alternatively, interconnect 10 and conductor-filled via 20 may be formed using a damascene process, also known to those of ordinary skill in the art. In a damascene process, a trench is formed in a dielectric layer (e.g., silicon oxide or silicon nitride), into which a suitable conductive material is deposited. Excess conductive material over the dielectric layer and elsewhere may then be selectively removed using any suitable method, such as etch back with corrosive gases, wet acids or bases, or chemo mechanical polishing (CMP), most preferably by CMP. The trench may be formed using any suitable method, such as an anisotropic etch.

Figures 1, 7B:
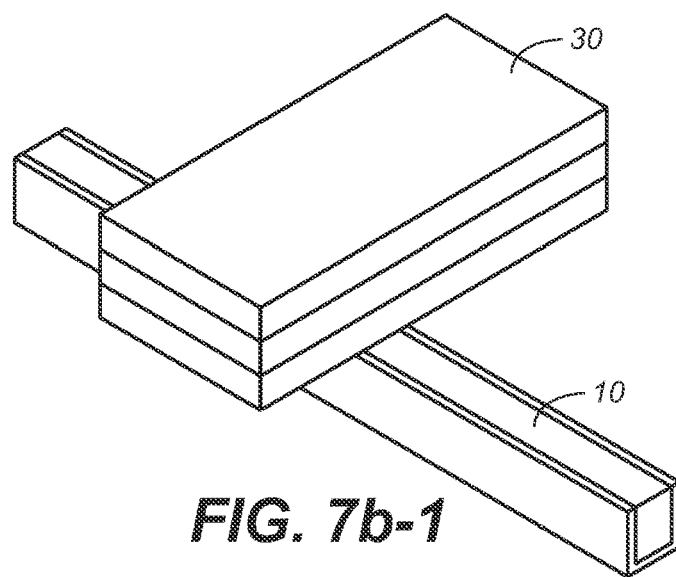
Figures 2, 7B:
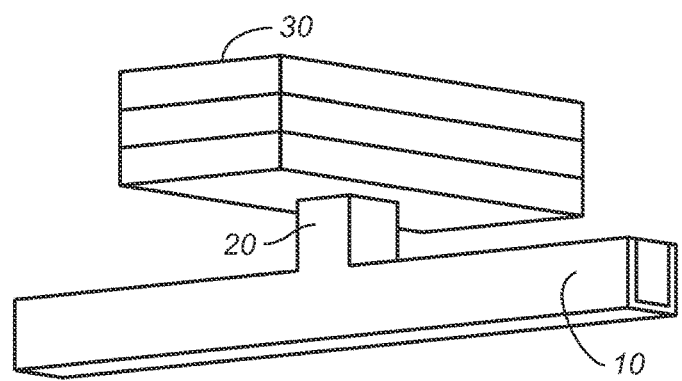
Figure 7C:
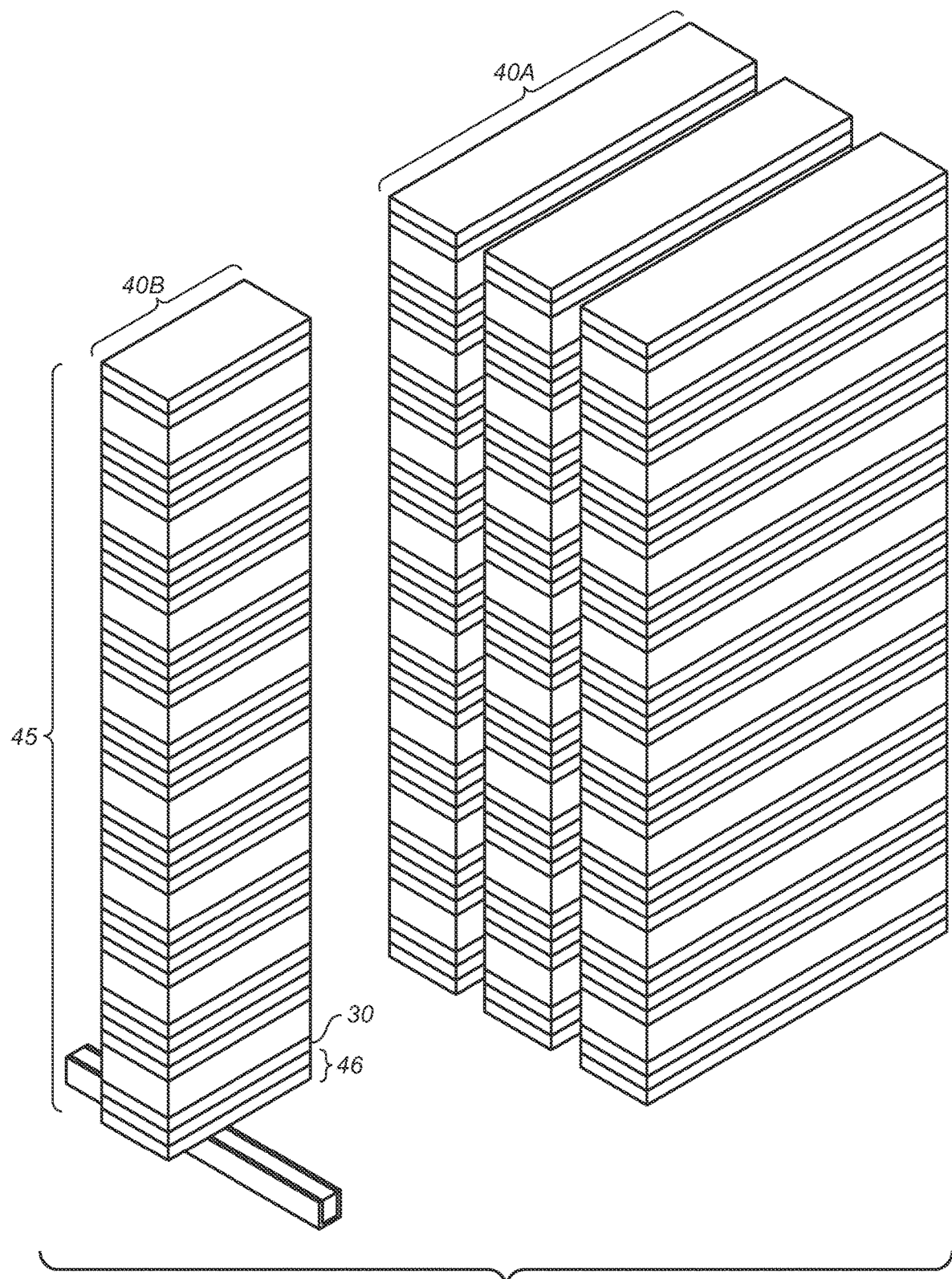

Referring to FIG. 7b-1, after forming interconnect 10 and conductor-filled via 20, first n-type or p-type semiconductor layer 30 (e.g., silicon, germanium, silicon germanium, or indium gallium zinc oxide (IGZO)) is deposited as an amorphous semiconductor layer using any suitable technique (e.g., CVD, ALD, or sputtering). The semiconductor layer may be crystallized at a subsequent step. In other embodiments, the semiconductor layer may be deposited as a polycrystalline semiconductor material. As first semiconductor layer 30 is designated to be a source or drain region for the vertical TFT 5 to be formed, first semiconductor layer 30 is hereafter referred to as "first source or drain layer 30.". FIG. 7b-2 shows the structure of FIG. 7b-1 from a different perspective. First source or drain layer 30 is subsequently crystallized, as described below. In one embodiment, first source or drain layer 30 may be formed simultaneously with a common drain region of a NOR memory string (i.e., formed out of the same layer of semiconductor material as the common drain region). FIG. 7c shows an intermediate step in the formations of vertical TFT 5 in portion 40B and 3-D memory structure 40A (including both a memory array and one or more staircases) out of multiple deposited semiconductor and insulator layers. Formation of a 3-D memory structure, such as memory structure 40A, has been disclosed, for example, in the Non-provisional application. At this intermediate step, processing of vertical TFT portion 40B is separated from processing of memory structure portion 40A. Using suitable masking and etching steps, upper layers of vertical TFT portion 40B are removed, stopping at first source or drain layer 30. Other layers may be present, such as metal layer 46 strapped to first source or drain layer 30. The structure of FIG. 7b-1 may result from removing the upper layers from vertical TFT portion 40B of FIG. 7c.

Thereafter, as shown in isometric view in FIG. 7d-1 and in cross-section in FIG. 7d-2, after forming first source or drain layer 30, mold dielectric layer 50 (e.g., silicon oxide, silicon nitride, silicon oxide nitride, silicon carbide, silicon carbide oxygen hydrogen, fluorine-doped, boron-doped, or phosphorus-doped silicon oxide, or any combination of these materials) is deposited on first source or drain layer 30 using any suitable method, such as CVD, ALD, or spin on.

Mold dielectric layer 50 is masked, patterned, and etched to form a via that exposes first source or drain layer 30. Thereafter, second semiconductor layer 60 (e.g., silicon, germanium, or silicon germanium) is deposited in the via, using any suitable technique (e.g., CVD, ALD, or sputtering), as shown in isometric view in FIG. 7e-1 and in cross-section in FIG. 7e-2, after removing excess semiconductor material from the surface of mold dielectric layer 50 by any suitable process, such as etch back or CMP, most preferably CMP. As second semiconductor layer 60 is designated to become a channel region of vertical TFT 5 to be formed, second semiconductor layer 60 is hereafter referred to as channel layer 60. Semiconductor layer 60 is preferably deposited as an amorphous semiconductor material.

Channel layer 60 may be doped, in situ, the same or opposite type as first source or drain layer 30. A portion of channel layer 60 may then be doped using a non-in situ doping step (e.g., gaseous diffusion or ion implantation) to create third semiconductor layer 70, as shown in isometric view in FIG. 7f-1 and in cross-section view in FIG. 7f-2. Most preferably, third semiconductor layer 70 is provided the same doping type as first source or drain layer 30. As third semiconductor layer 70 is designated to be another source or drain region for vertical TFT 5 to be formed, third semiconductor layer 70 is hereafter referred to as second source or drain layer 70.

In the case where first source or drain layer 30, channel layer 60 and second source or drain layer 70 include amorphous silicon, as deposited, thin titanium (Ti) layer 72 (e.g., about 10 nm thick) is then deposited on second source or drain layer 70 with or without protective layer 74 (e.g., titanium nitride or any other suitable material) deposited on top of titanium layer 72. The resulting structure with deposition of protective layer 74 is shown in isometric view in FIG. 7g-1 and in cross-section in FIG. 7g-2. Protective layer 74 is preferably deposited immediately following deposition of titanium layer 72. The resulting structure is then annealed in an inert atmosphere (e.g., nitrogen or argon) at a temperature suitable for crystallization of amorphous silicon (e.g., between 550 and 1000° C. for between 1 second and 24 hours). Alternatively, annealing can be carried out at 550° C. for 24 hours, 600° C. for 12 hours, 750° C. for 5 minutes, or 800° C. for 1 minute, or at any suitable temperature for any suitable duration that results in the crystallization of silicon into high quality monocrystalline or polycrystalline silicon.

During the annealing process, titanium layer 72 reacts with the underlying silicon to form titanium silicide 80, which provides a crystalline template suitable for the formation of low defect-concentration crystalline silicon in first source or drain layer 30, channel layer 60 and second source or drain layer 70. See, FIGS. 7h-1 and 7h-2. This low defect-concentration crystalline silicon thus obtained has carriers with a higher mobility than conventional polycrystalline semiconductor material, which is known to have a high defect-concentration.

According to a second embodiment, rather than titanium layer 72, a thin nickel layer may be deposited on second source or drain layer 70. After nickel deposition, the structure is annealed at a low temperature (e.g., between about 350° C. to about 450° C.). During annealing, a nickel silicide film is formed, which diffuses through second source or drain layer 70, channel layer 60 and first source or drain layer 30, thereby inducing the amorphous silicon in these semiconductor layers to crystallize to a low defect-density form. The process is complete when the nickel silicide film reaches the outer boundaries of the silicon in the structure.

As shown in isometric view in FIG. 7h-1 and in cross-section in FIG. 7h-2, titanium layer 72 and protective layer 74 are then removed by a selective wet etch (e.g., a combination of hydrogen peroxide and sulfuric acid). Titanium silicide film 80 remains, although it can be removed by other means in some embodiments. In some embodiments, the formation of the crystalline semiconductor layers occurs at a later step in the fabrication sequence.

Figure 7I:
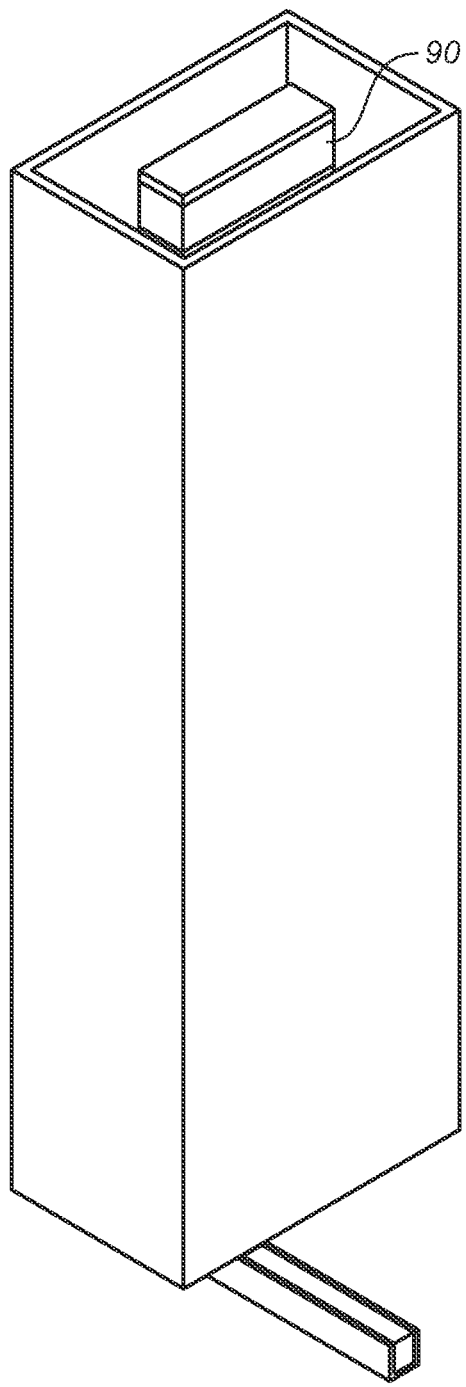
Figure 7I:
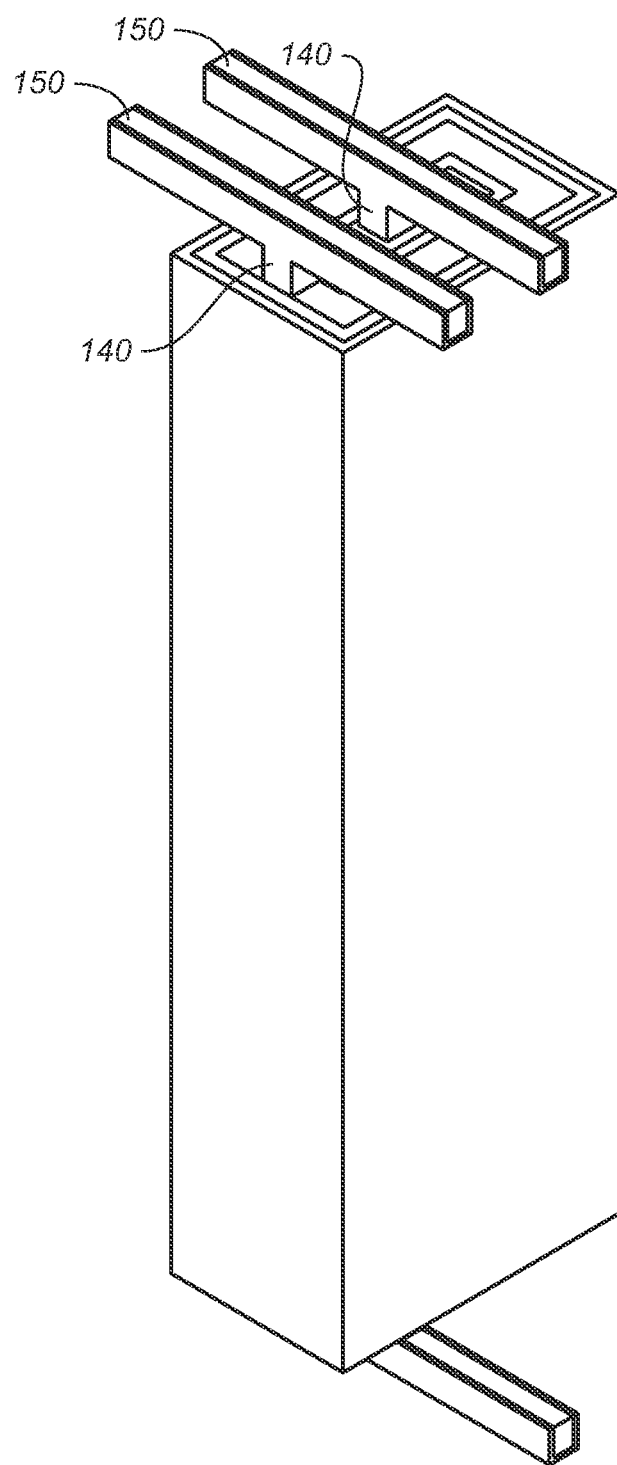

At this point, semiconductor pillar 90 (i.e., the combination of titanium silicide film 80, crystallized channel layer 60, and crystallized first and second source or drain layers 30 and 70) is substantially complete. A trench extending substantially the length of semiconductor pillar 90 is then created by etching mold dielectric layer 50 around semiconductor layer 90, as shown in FIG. 7i. Gate oxide 100 is next formed conformally using any suitable technique (e.g., CVD, ALD, or thermal oxidation) on the exposed surfaces of semiconductor pillar 90 and at the bottom of the trench, as shown isometrically in FIG. 7j-1 and in cross-section in FIG. 7j-2. Gate oxide 100 may be any suitable material, such as silicon oxide, silicon nitride, aluminum oxide, hafnium oxide, hafnium silicon oxide, any combination of two or more of these materials, or any other suitable material.

Thereafter, gate electrode layer 110 (e.g., titanium nitride, tantalum nitride, tungsten, any combination of two or more of these, or any suitable material) is deposited over the gate oxide 100 to completely fill the remaining trench and over any exposed area. Any gate electrode and gate oxide materials in the exposed areas outside of the trench may be selectively removed using any suitable technique, such as etch back or CMP. After selective removal of gate electrode layer 110 and gate oxide 100, surface 130 of semiconductor pillar 90 and surface 120 of gate electrode layer 110 are exposed, as shown in isometric view in FIG. 7k-1 and in cross-section in FIG. 7k-2.

A dielectric layer is first deposited over exposed gate electrode layer 110, gate oxide 100, and second source or drain layer 70. The dielectric layer is then patterned and etched to create vias that expose surface 120 of gate electrode layer 110 and surface 130 of second source or drain layer 70 and to provide trenches for the interconnect conductors. Next, the vias and the trenches are filled with a conductive material, thus forming interconnects 150 that electrically connect through conductor-filled vias 140 to gate electrode layer 110 and second source or drain layer 70, as shown in FIG. 7l. At this point, vertical TFT 135 is substantially complete. As channel layer 60 is crystallized in the presence of a metal silicide layer, channel layer 60 has a low crystalline defect-concentration and a higher carrier mobility, relative to a conventional polycrystalline semiconductor layer. Improved carrier mobility in the channel enables higher currents in a conducting vertical TFT.

Figure 8:
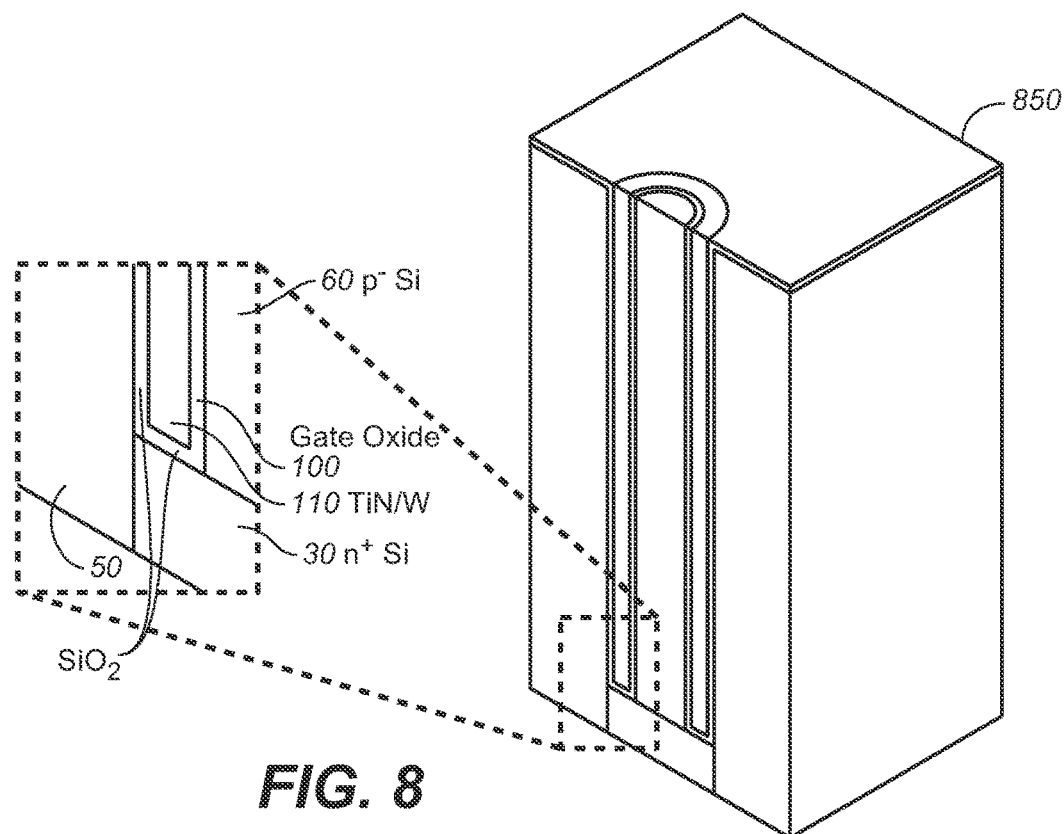
FIG. 8 shows vertical TFT 850, according to one embodiment of the present invention.

FIG. 8 shows vertical TFT 850, according to one embodiment of the present invention. Unlike vertical TFT 135 of FIG. 7l, which has a rectangular cross-section in an X-Y plane, vertical TFT 850 has a circular cross-section in the X-Y plane. Vertical TFT 850 may be used to implement vertical TFT 5 of FIG. 6. Inset 830 shows vertical TFT 850 in a cleaved isometric view to more clearly show first source or drain layer 30, channel layer 60, gate oxide layer 100, and gate electrode layer 110. The fabrication steps for circular cross-section vertical TFT 850 are substantially the same as those for vertical TFT 5 of FIG. 7l where the cross-sectional shape is rectangular.

Figure 9A:
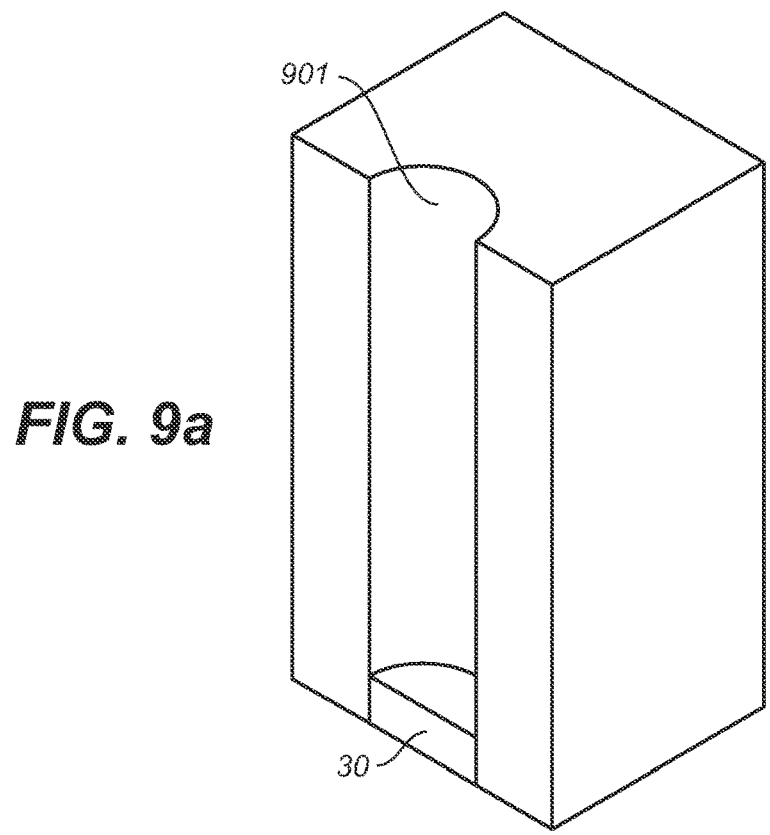
FIGS. 9a, 9b, 9c, 9d, 9e, 9f, 9g, and 9h illustrate another process under which vertical TFT 850 may be formed, according to one embodiment of the present invention.
Figure 9B:
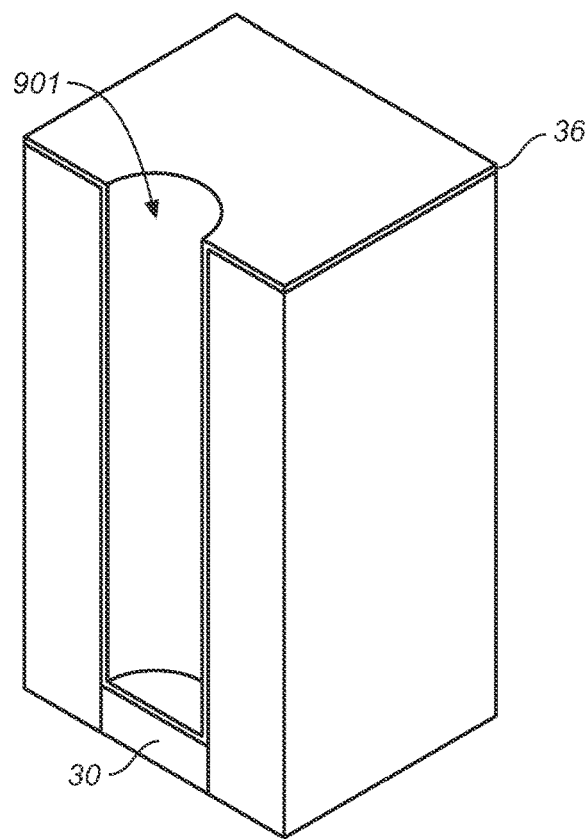
Figure 9C:
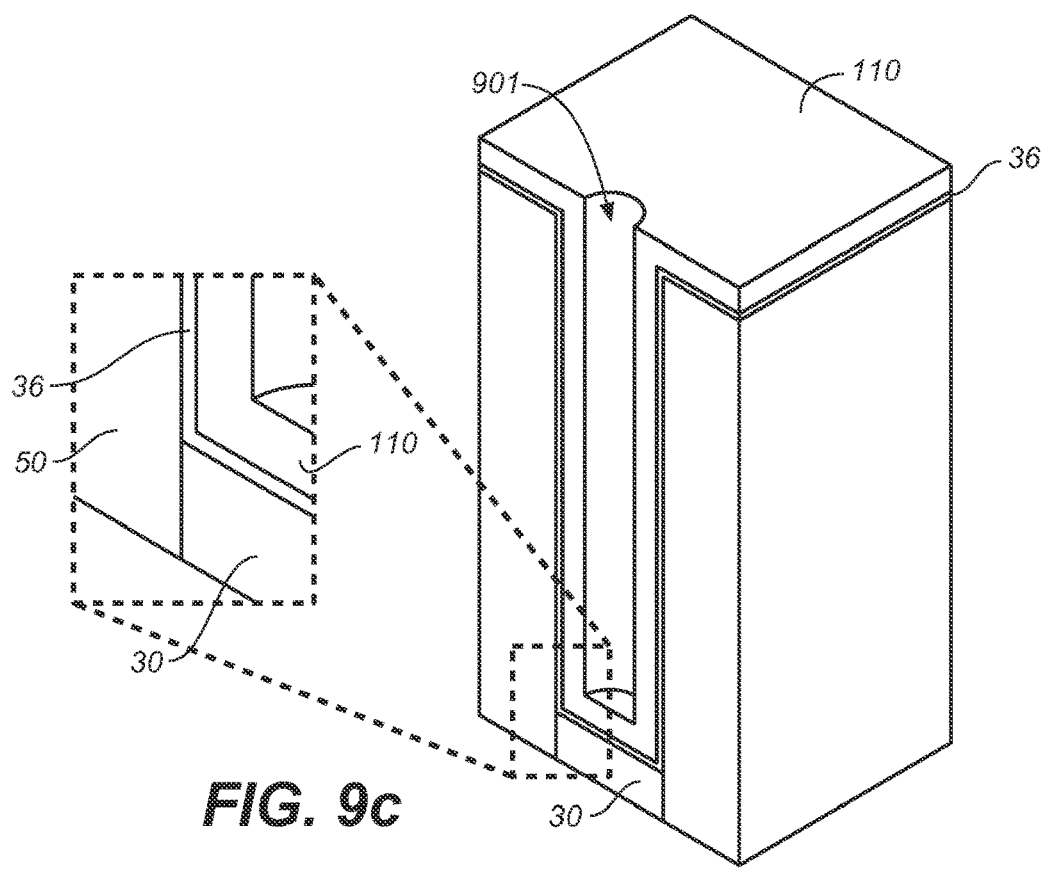
Figure 9D:
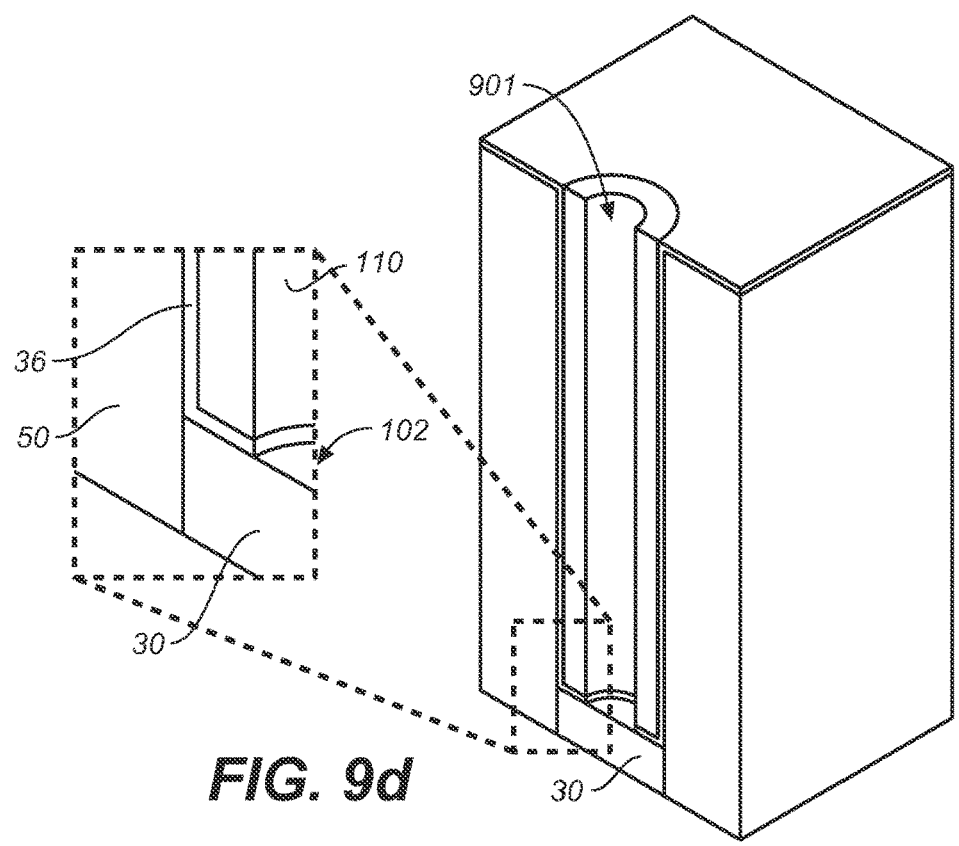

FIGS. 9a-9h illustrate another process under which vertical TFT 850 may be formed, according to one embodiment of the present invention. As shown in FIG. 9a, via 901 is formed in mold dielectric 50, exposing a surface of first source or drain layer 30. Next, as shown in isometric view in FIG. 9b, insulating layer 36 is conformally deposited in via 901, completely covering any exposed portions of first source or drain layer 30 within via 901. Insulating layer 36 may be any suitable dielectric (e.g., about 10 nm of silicon oxide). Thereafter, as shown in isometric view in FIG. 9c, gate electrode layer 110 is conformally deposited on insulating layer 36. Next, as shown in isometric view in FIG. 9d, portions of gate electrode layer 110 and insulating layer 36 are removed using an anisotropic etch, exposing surface 102 of first source or drain layer 30, leaving substantially the original thickness of gate electrode layer 110 on the sidewalls of via 901.

Figure 9E:
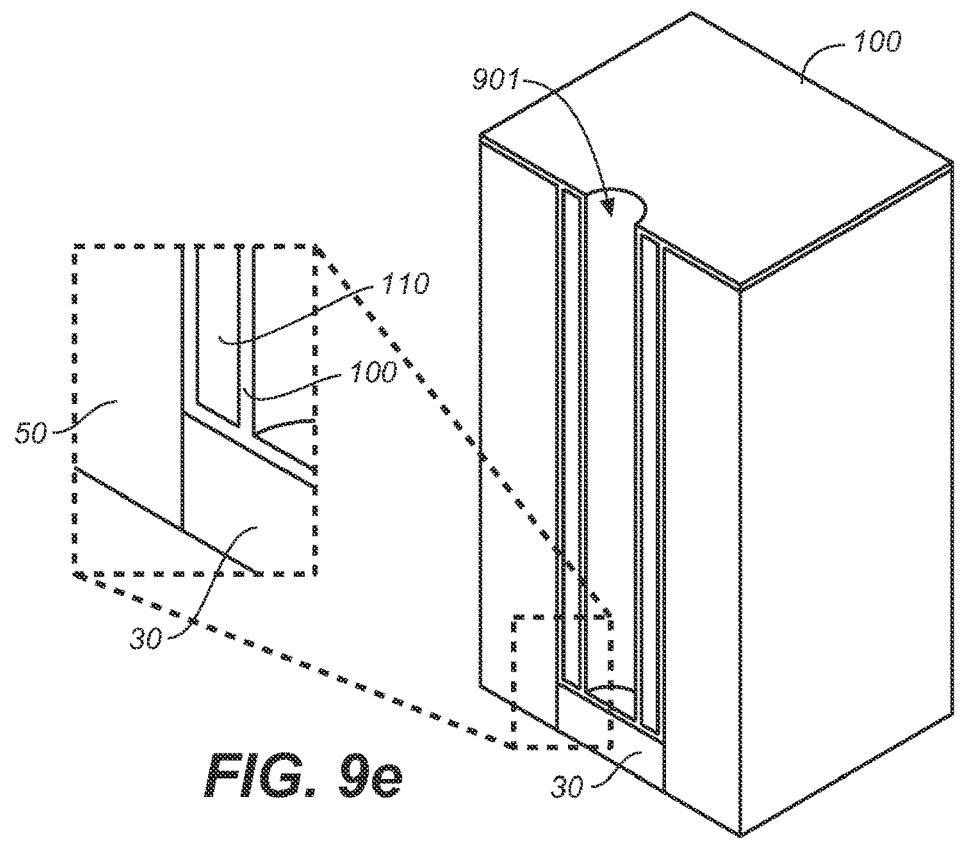
Figure 9F:
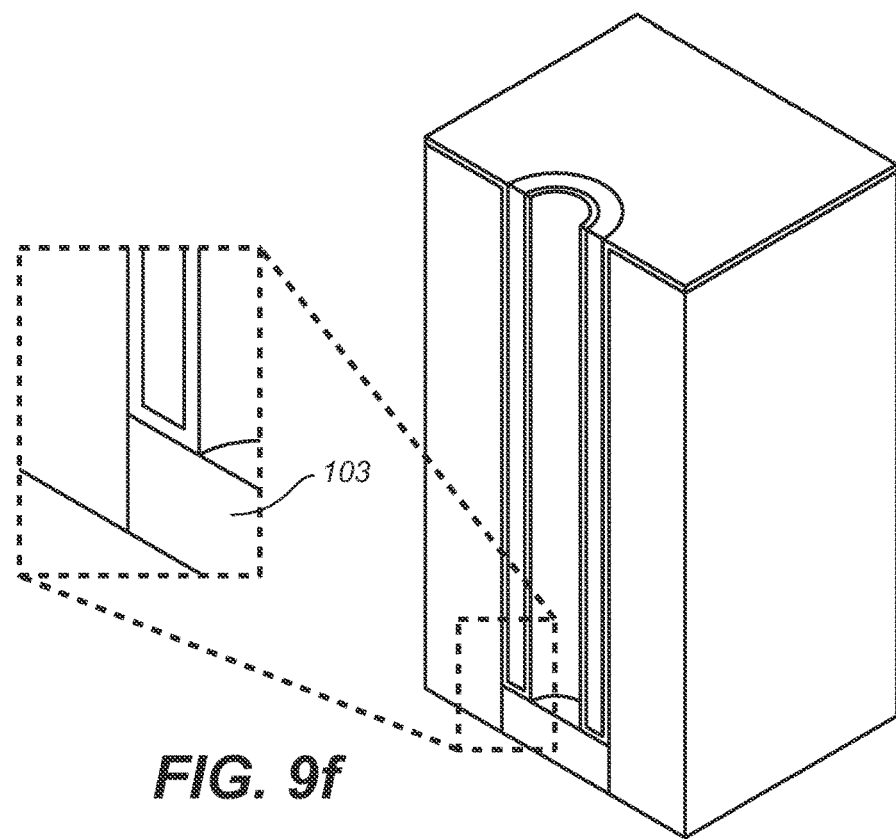
Figure 9G:
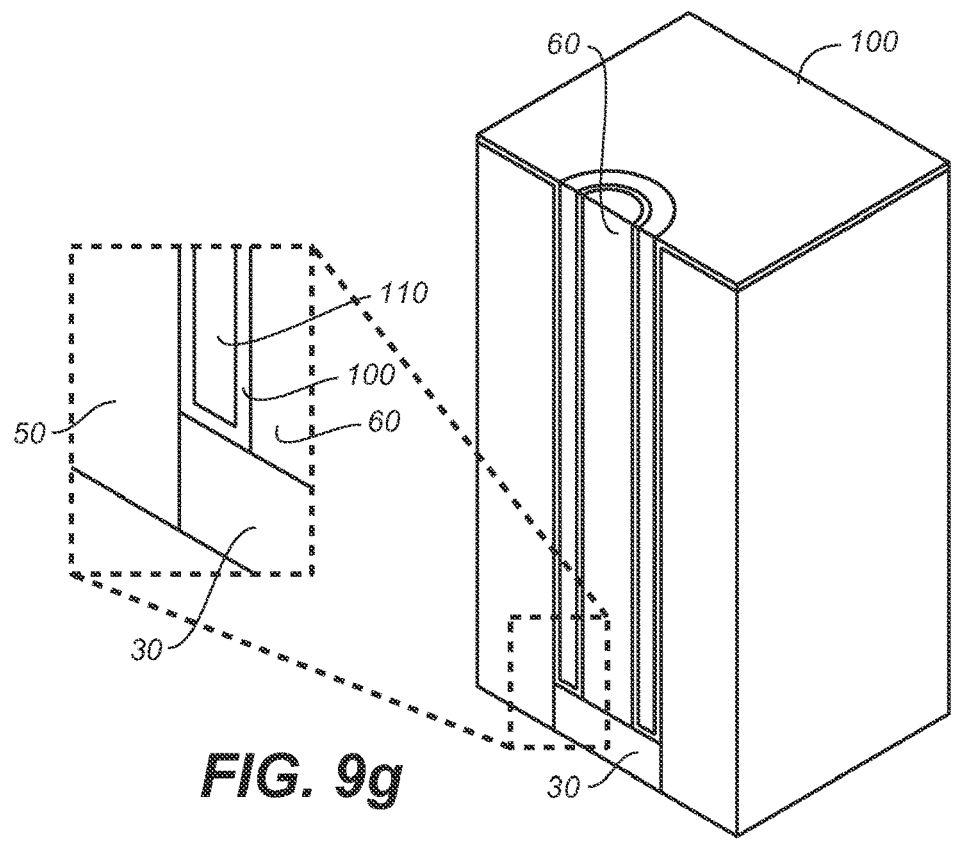
Figure 9H:
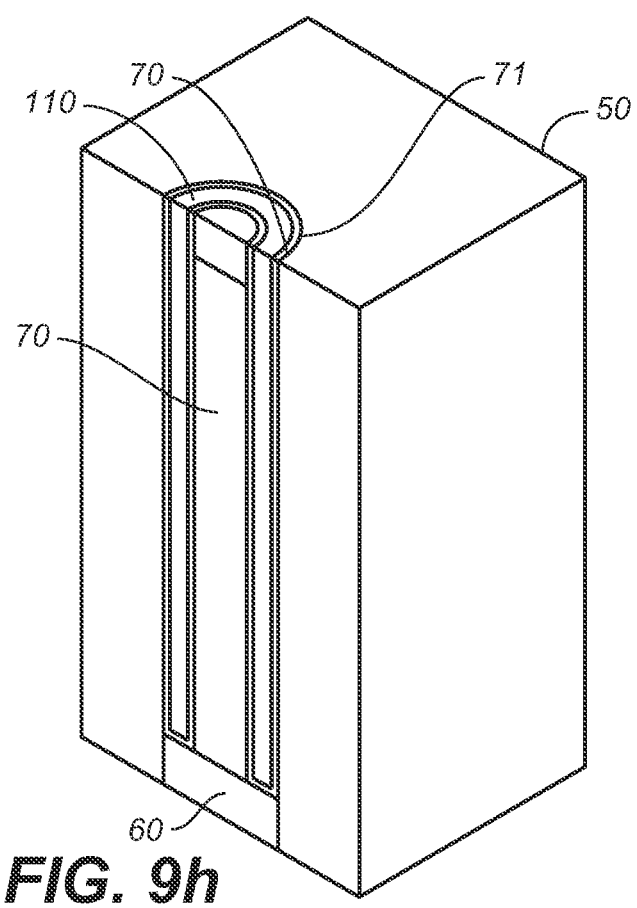

Next, as shown in isometric view in FIG. 9e, gate oxide layer 100 is deposited conformally on gate electrode layer 110 and on surface 102 of first source or drain layer 30. A portion of gate oxide layer 100 is then removed by anisotropic etching, exposing surface 102 of first source or drain layer 30, as shown in FIG. 9f. As shown in FIG. 9g, channel layer 60 is deposited in amorphous form into via 901, contacting first source or drain layer 30. Portions of channel layer 60 are then removed from the top surface by CMP. Second source or drain layer 70 is formed by doping the top portion of channel layer 60 with a different concentration or an opposite type dopant than in channel layer 60, as shown in FIG. 9g. Any amorphous semiconductor material in first source or drain layer 30, second source or drain layer 70, and channel layer 60 can then be crystallized by first depositing a titanium film on surface 71 of second source or drain layer 70 and annealing at a temperature in excess of 550° C., forming a $TiSi_2$ seed layer that seeds crystallization of channel layer 60 and first and second source or drain layers 30 and 70, in the manner described above, thereby resulting in minimal crystalline defects and a high carrier mobility in these semiconductor layers.

Interconnection and other operations for electrically connecting to gate electrode layer 110 and second source or drain layer 70 may then be accomplished in like manner as described above.

FIG. 10 shows vertical TFT 280, according to one embodiment of the present invention. As shown in FIG. 10, vertical TFT 280 includes (i) heavily-doped first and second source or drain layers 200a and 200b that are separated by dielectric layer 210, (ii) lightly-doped channel layer 220 in contact with both heavily-doped source or drain layers 200a and 200b, (iii) gate oxide layer 230 in contact with channel layer 220, and (iv) gate electrode layer 240 is in contact with gate oxide layer 230. Conductor contacts 250 provide individual contacts to source or drain layers 200a and 200b, and gate electrode layer 240. In vertical TFT 280, channel layer 220 is fabricated such that charge carriers travel in a substantially perpendicular direction to the semiconductor substrate (i.e., the Z-direction) over which vertical TFT 280 is formed. Channel layer 220 may be initially deposited as an amorphous semiconductor material and conductor contacts 250 may include a titanium or nickel layer in contact with heavily-doped semiconductor layer 200a or 200b, or both. The titanium or nickel layer seeds the crystallization of any amorphous silicon in channel layer 220 into a crystalline state with minimal crystalline defects, thereby resulting in high mobility in the charge carriers in channel layer 220.

Figure 11E:
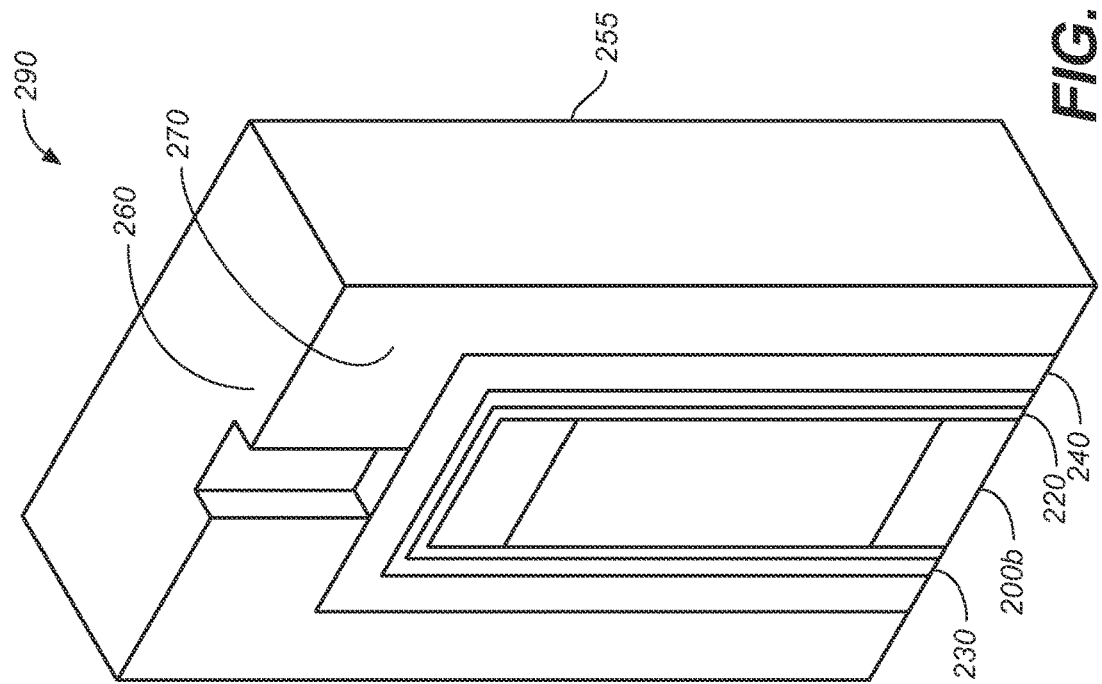

FIGS. 11a-11f illustrate a process by which vertical TFT 280 of FIG. 10 may be formed, according to one embodiment of the present invention. As shown in FIG. 11a, heavily-doped first source or drain layer 200a, dielectric layer 210 and heavily-doped second source or drain layer 200b are successively deposited as amorphous semiconductor material. The resulting structure is then patterned and etched to form a rectangular line or strip, as shown in FIG. 11a. Subsequently, channel layer 220 is then deposited as an amorphous semiconductor material over the structure of FIG. 11a, followed by depositions of gate oxide layer 230, and gate electrode layer 240 successively on the strip. The resulting structure, structure 290, is then patterned and etched using photo-lithographical steps, such that channel layer 220, gate oxide layer 230, and gate electrode layer 240 form a line that wraps around the strip, as shown in FIG. 11b.

Figure 11D:
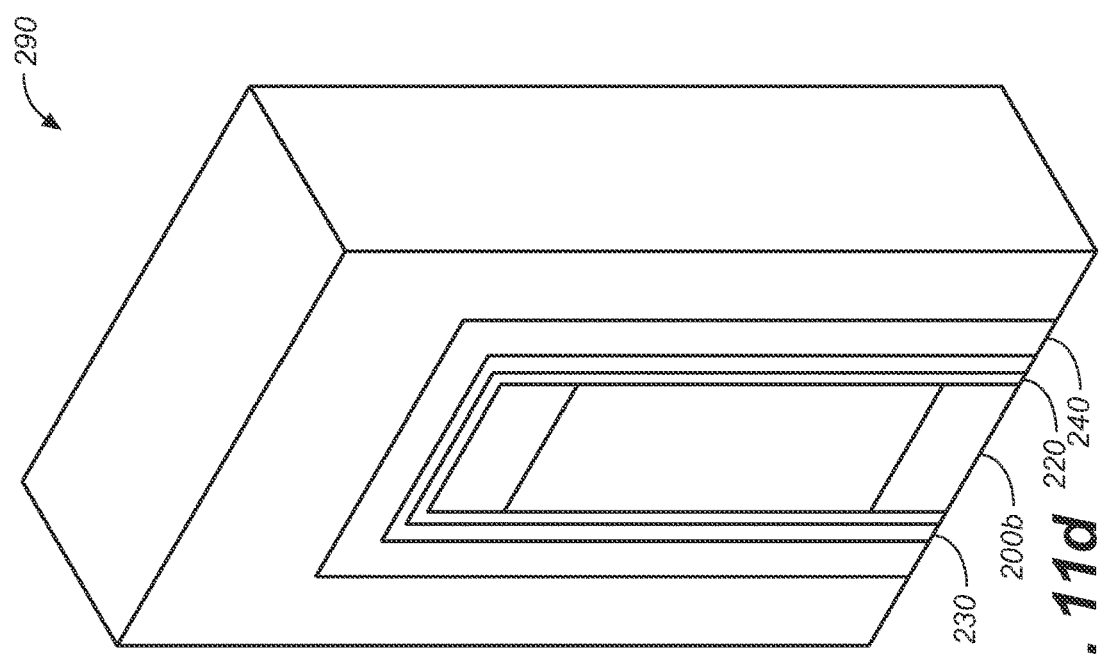
Figure 11F:
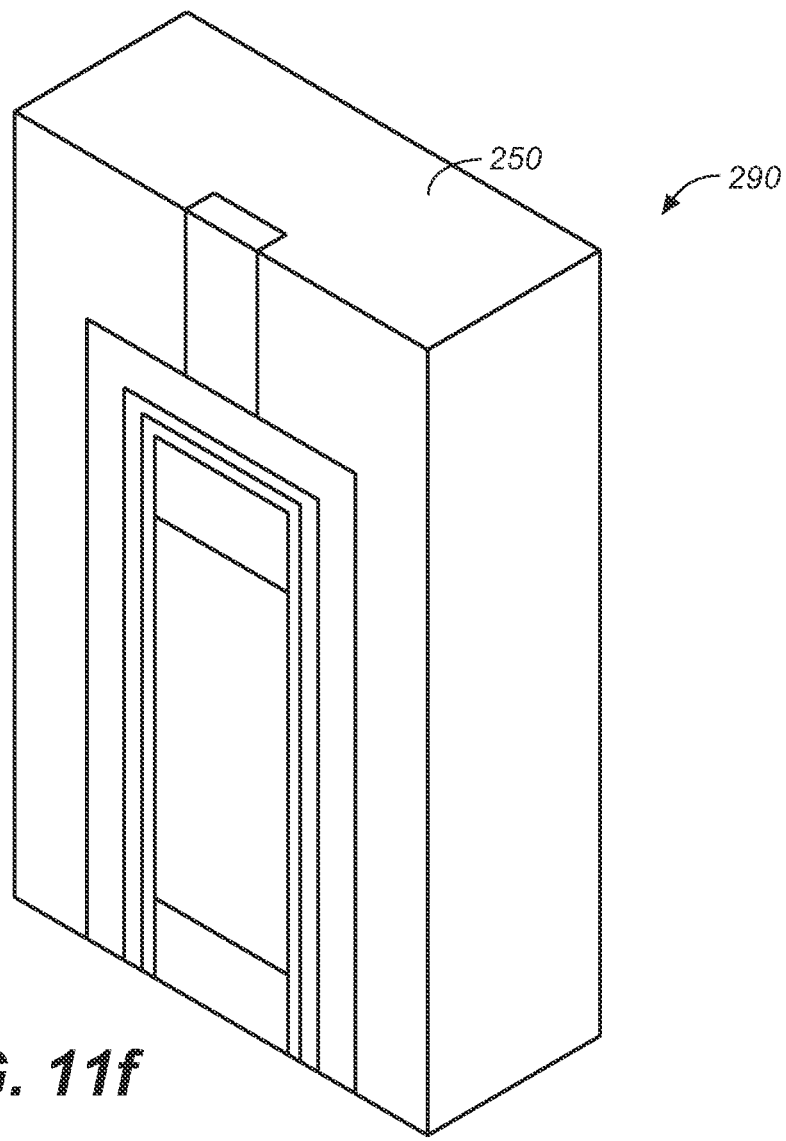

Thereafter, referring to FIG. 11c, dielectric layer 255 is deposited over structure 290 for passivation. A cross-section of structure 290 through semiconductor channel layer 220, gate oxide layer 230, and gate electrode layer 240 is shown in FIG. 11d. Via 260 is then etched in dielectric layer 255 to expose surface 270 of gate electrode layer 240. (Simultaneously or alternatively, a second via (not shown) may be etched into passivation layer 255 to expose a portion of second source or drain layer 200b.) Conductor contact layer 250 (e.g., titanium or nickel) is then deposited into via 260 to contact surface 270. (Simultaneously or alternatively, the conductor contact layer is also deposited to contact the exposed portion of second source or drain layer 200b.) After depositing titanium or nickel, structure 290 is annealed, allowing a $TiSi_2$ or NiSi layer to form and to seed the crystallization of any adjacent semiconductor material in first and second source or drain layers 200a and 200b, and channel layer 220 into crystalline form with minimal crystalline defects. Any additional conductor contacts 250, if required, may be fabricated to contact the heavily-doped first or second source or drain layers 200a and 200b, as shown in FIG. 10.

FIGS. 12a-12k illustrate vertical TFTs 1220 with high mobility that connect to memory cells in NOR memory strings of memory structure 1210, according to yet another embodiment of embodiment of the present invention. As mentioned above, a TFT with a vertical channel occupies less silicon area than a TFT with a horizontal channel. In this regard, the silicon area occupied by the TFT is that area projected by the TFT on the surface of the planar substrate. In the embodiment illustrated in FIGS. 12a-12k, vertical TFTs 1220 may be formed using only two masking steps, as vertical TFTs 1220 have critical dimensions that are both self-aligning and self-limiting. With fewer masking steps, reduced manufacturing costs and greater manufacturing uniformity and consistency are achieved. A higher charge carrier mobility in the channel region of such a vertical TFT is desirable, as the current of the vertical TFT in the conducting ("on") state is proportional to the mobility and as a higher "on" current is desirable for such a vertical TFT in its operation in conjunction with the NOR memory strings in memory structure 1210.

Figure 12A:
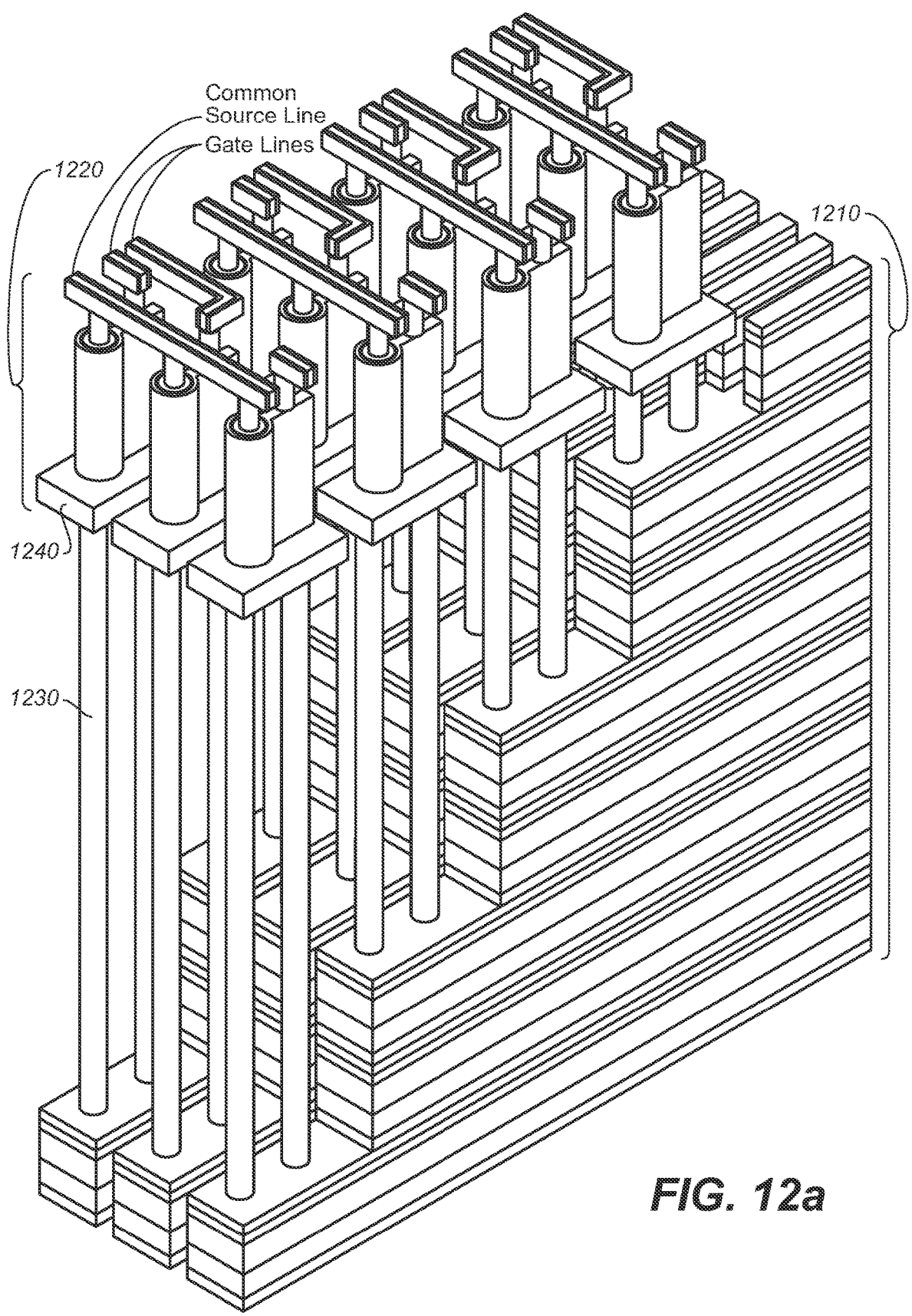
Figure 12C:
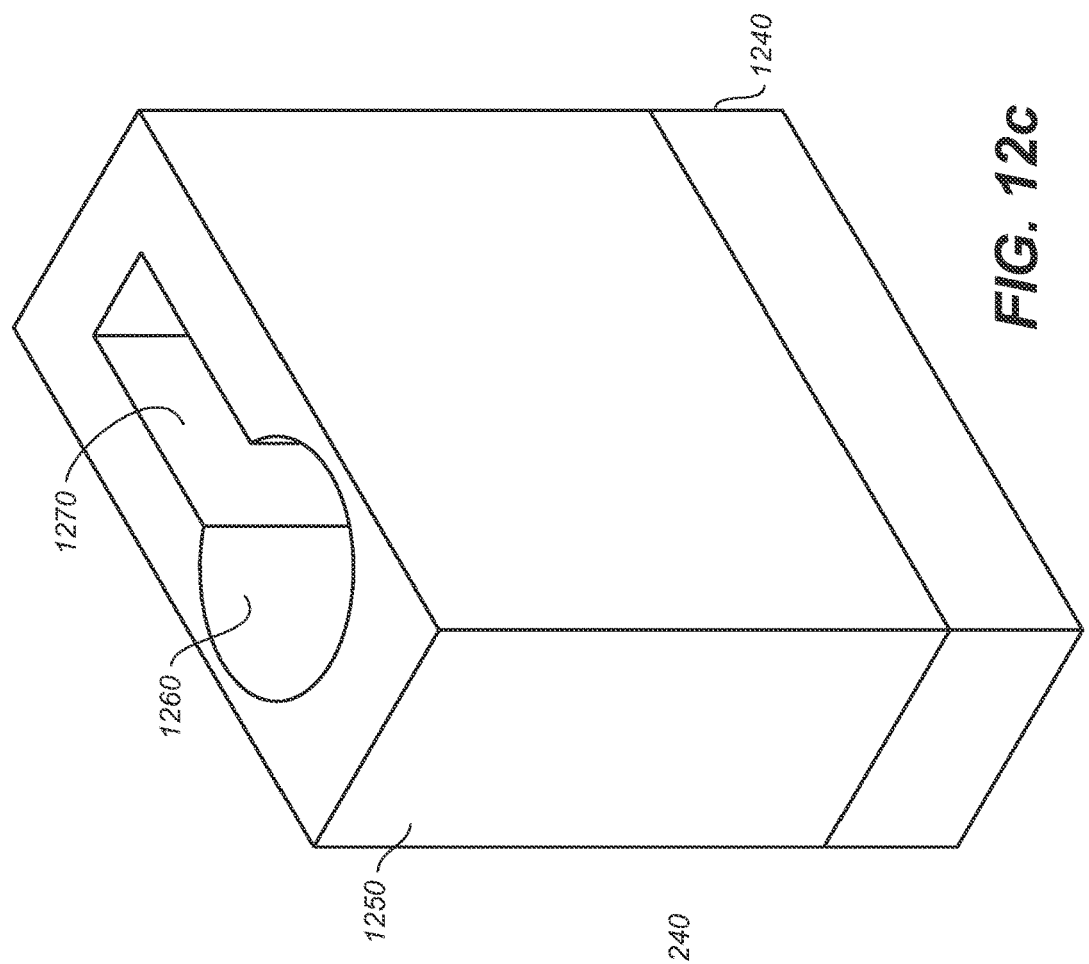
Figure 12B:
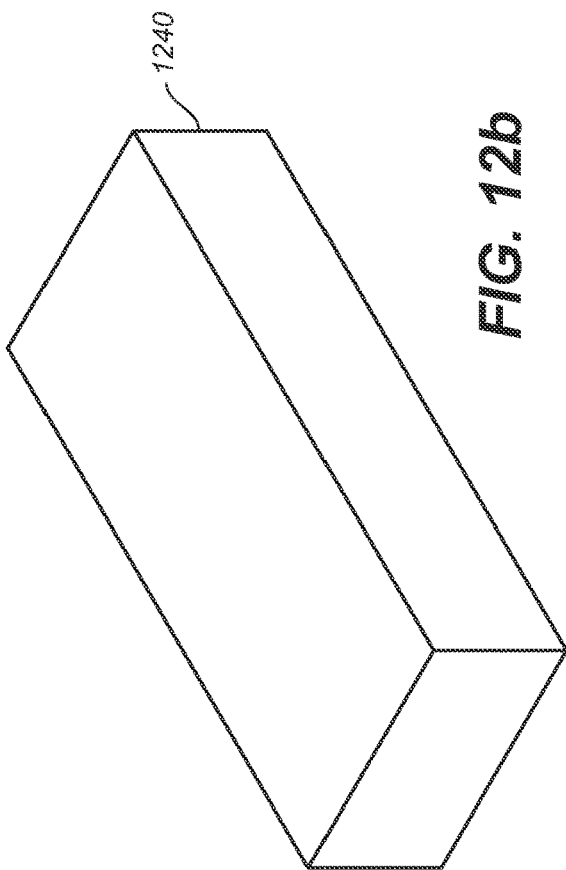

In conjunction with the following description, FIGS. 12a-12c are shown in an isometric view, and FIGS. 12d-12k are shown in a cut-away isometric view. As shown in FIG. 12a, memory structure 1210, which includes an array of NOR memory strings, is provided above a planar surface of a semiconductor substrate. The semiconductor substrate may include circuit devices devices (not shown) that are connected to memory structure 1210. In FIG. 12a, vertical TFTs 1220 are provided in memory structure 1210 and are connected by conductor-filled vias 1230 to bit lines in the NOR memory strings of memory structure 1210. (Each bit line is a strip of heavily-doped semiconductor material forming a common drain terminal for the memory transistors of a NOR memory string.) As shown in FIG. 12a, for exemplary purpose, each bit line is connected to two of vias 1230. In fact, any suitable number of vias may be connected to each bit line. Also, as vertical TFTs 1220 are provided in the staircase portion of memory structure 1210, vertical TFTs 1220 do not occupy any silicon area not already occupied by memory structure 1210.

Formation of vertical TFTs 1220 begins after vias 1230 are formed, using any suitable methods, such as those disclosed above or in the Provisional Applications. Thereafter, conductive semiconductor layer 1240 is deposited, patterned, and etched into individual sections that are electrically isolated from each other. Conductive semiconductor layer 1240 may be n-type or p-type, and may include silicon, silicon germanium, germanium, any suitable semiconductor material, deposited using any suitable technique (e.g., CVD, ALD, or sputtering). As shown in FIG. 12a, each section of conductive semiconductor layer 1240 is electrically connected through two of conductor-filled vias 1230 with the bit lines of the NOR memory strings of memory structure 1210.

To facilitate the detailed description below, the formation of vertical TFTs 1220 is described with reference to a single section of conductive semiconductor layer 1240, which is shown in FIG. 12b. This section of conductive semiconductor layer 1240 is hereinafter referred to as "first source or drain layer 1240," on account that it is designated to become a source or drain region in a vertical TFT to be formed. After first or drain layer 1240 in FIG. 12b is formed, dielectric layer 1250 is deposited thereon (FIG. 12c). Dielectric layer 1250 may include any suitable dielectric material (e.g., silicon oxide, silicon nitride, silicon oxide nitride, aluminum oxide, silicon carbide, silicon oxide carbide, silicon oxide carbide hydride) and may be deposited using any suitable technique (e.g., CVD or PVD). Dielectric layer 1250 is then patterned and etched to provide two cavities, channel cavity 1260 and gate cavity 1270, respectively for subsequently forming therein the channel regions and the gate electrodes for the two vertical TFTs to be formed. Gate cavity 1270 is significantly narrower in width relative to channel cavity 1260. Channel cavity 1260 and gate cavity 1270 each extend the full length of dielectric layer 1250 down to first source or drain layer 1240.

Figure 12E:
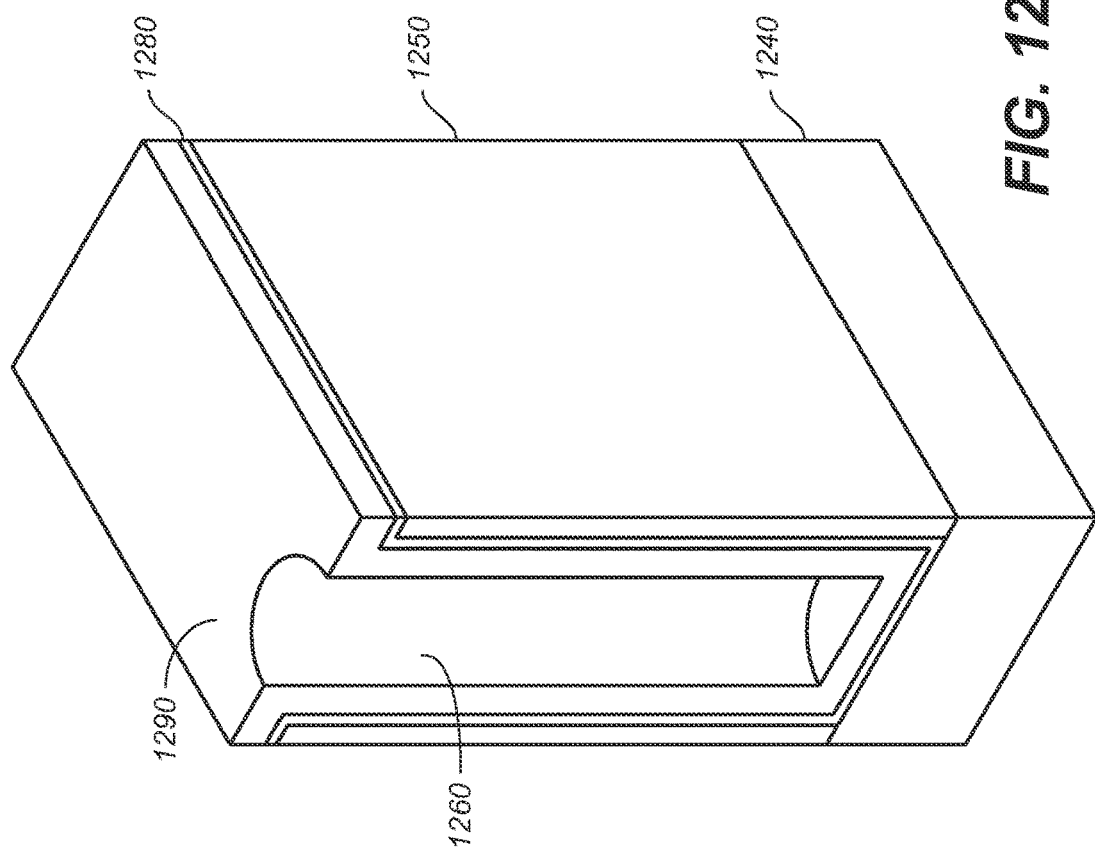
Figure 12D:
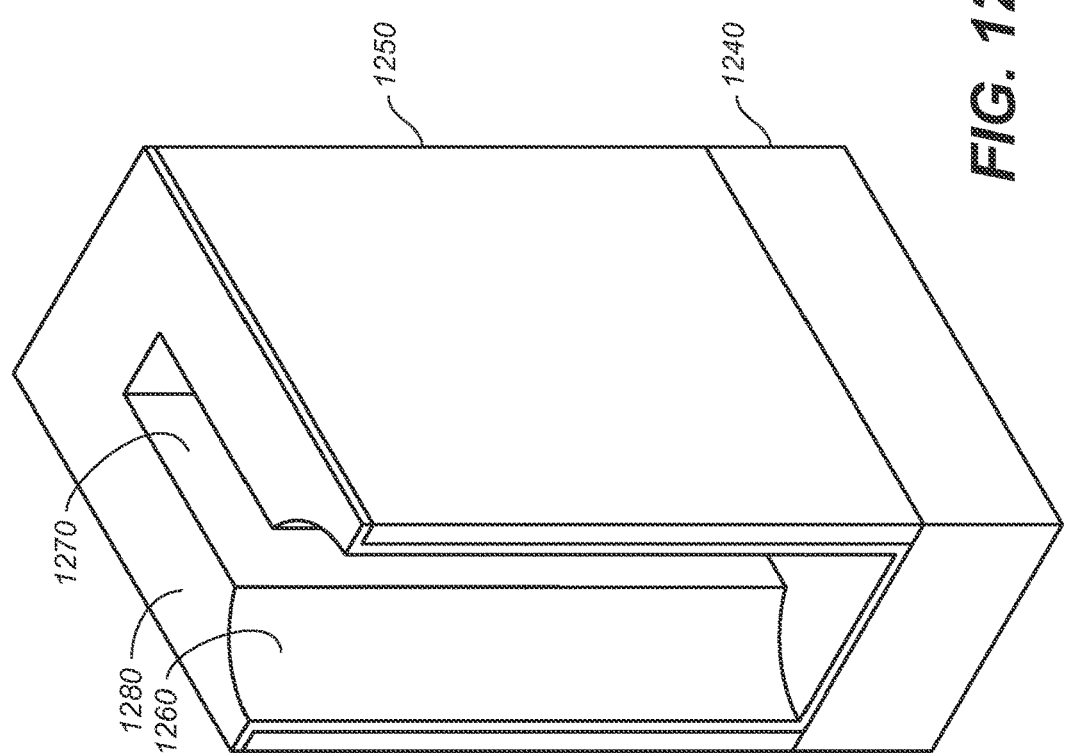

Referring to FIG. 12d, which is shown in a cut-away isometric view, etch-stop layer 1280 (e.g., an about 10 nm-thick layer of silicon nitride) is then conformally deposited inside both channel cavity 1260 and gate cavity 1270 and on top of dielectric layer 1250. Thereafter, as shown in FIG. 12e, sacrificial layer 1290 (e.g., an about 30 nm-thick layer of silicon oxide) is conformally deposited over etch-stop layer 1280. Both etch-stop layer 1280 and sacrificial layer 1290 may be deposited using any suitable technique (e.g., CVD or ALD). In FIG. 12e, because of its narrower width, gate cavity 1270 is substantially filled after depositions of etch-stop layer 1280 and sacrificial layer 1290, while an open shaft remains in channel cavity 1260.

Figure 12F:
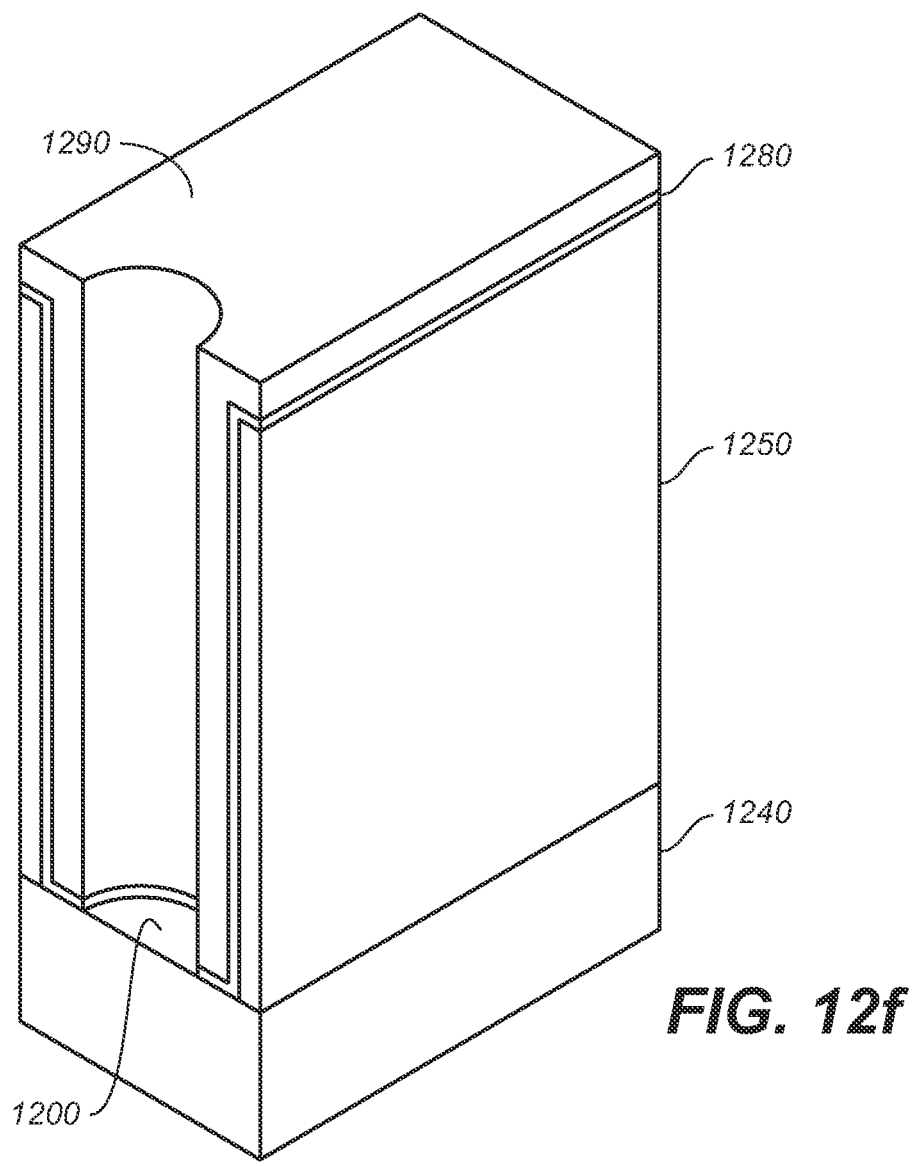

Thereafter, referring to FIG. 12f, an anisotropic etch ("punch through etch") removes portions of etch-stop layer 1280 and sacrificial layer 1290 to expose surface 1300 of first source or drain layer 1240 to channel cavity 1260. The punch through etch leaves etch-stop layer 1280 and sacrificial layer 1290 on the sidewalls of channel cavity 1260 and gate cavity 1270.

Figure 12G:
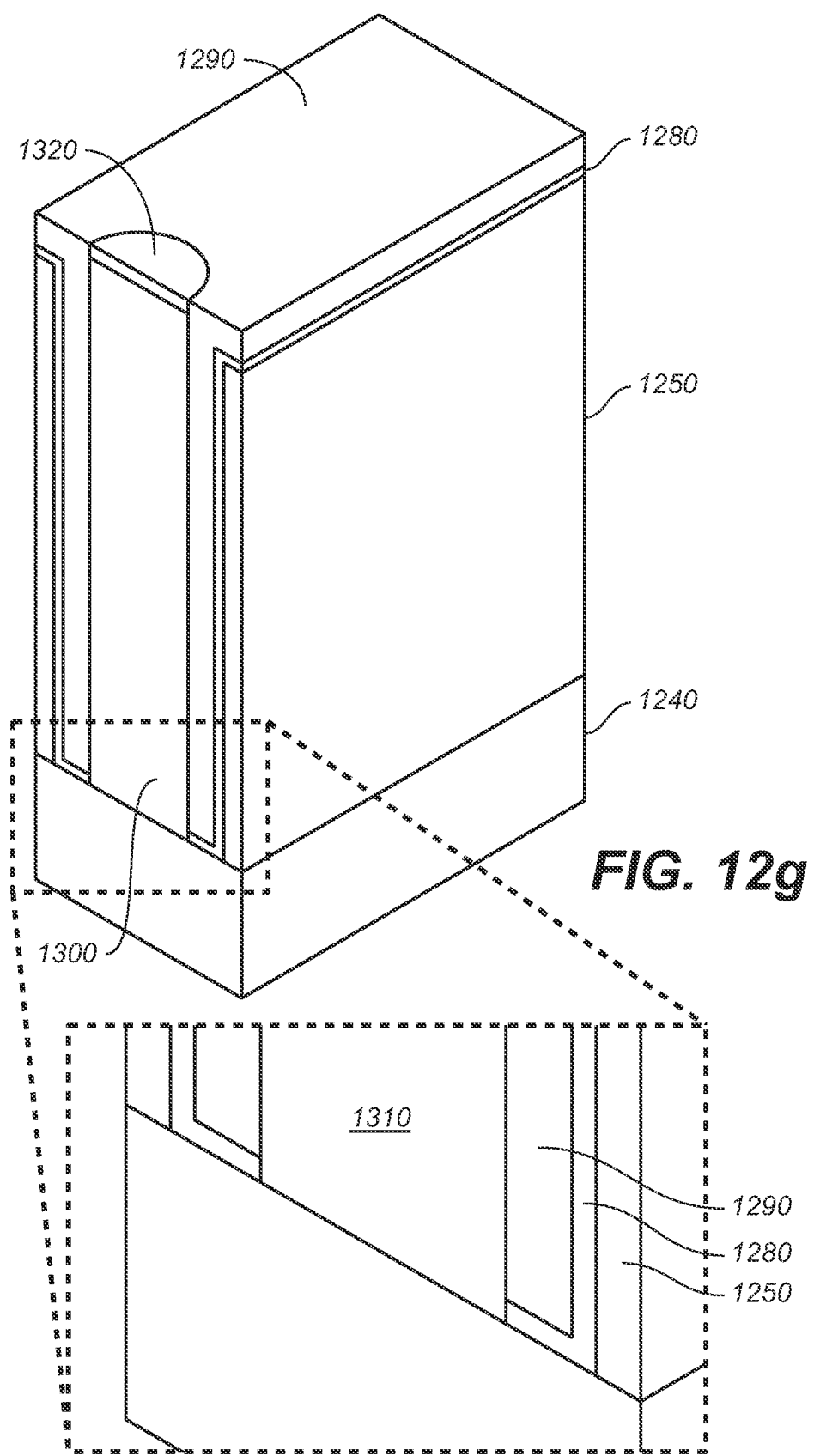

Thereafter, referring to FIG. 12g and its inset, channel layer 1310 (e.g., a suitable n-type or p-type amorphous silicon, silicon germanium, germanium or another semiconductor film) is deposited to fill channel cavity 1260, using any suitable technique (e.g., CVD, ALD, or sputtering). Channel layer 1310 is in electrical contact at surface 1300 with conductive semiconductor layer 1240. Channel layer 1310 may doped in situ during deposition. Portions of channel layer 1310 may be removed from the top surface of dielectric layer 1250, using either an etch back operation or CMP.

Thereafter, channel layer 1310 is crystallized using any suitable technique (e.g., using a crystallization process in the presence of titanium or nickel silicide, as discussed above) to provide a semiconductor pillar with a low crystalline defect density, resulting in a high charge carrier mobility and enabling a substantial current. For example, channel layer 1310 may be crystallized in the presence of the $TiSi_2$ that results from the reaction of thin titanium layer 1320 with channel layer 1310 during annealing. Optionally, a protective layer (not shown) may be deposited on channel layer 1310. The protective layer may be titanium nitride or any other suitable material. This structure is then annealed in an inert atmosphere (e.g., nitrogen or argon) to a suitable crystallization temperature (e.g., between 550 and 1000° C. for between 1 second and 24 hours; specifically, 550° C. for 24 hours, 600° C. for 12 hours, 750° C. for 5 minutes, or 800° C. for 1 minute, or according to any suitable anneal recipe). Referring to FIG. 12h, during annealing, a portion of titanium film 1320 reacts with the semiconductor in channel layer 1310 to form titanium silicide layer 1330. In this process, titanium silicide layer 1330 is formed prior to crystallization of channel layer 1310 completes, providing a crystalline template that is suitable for forming a low defect density crystalline semiconductor with a high carrier mobility.

Figure 12I:
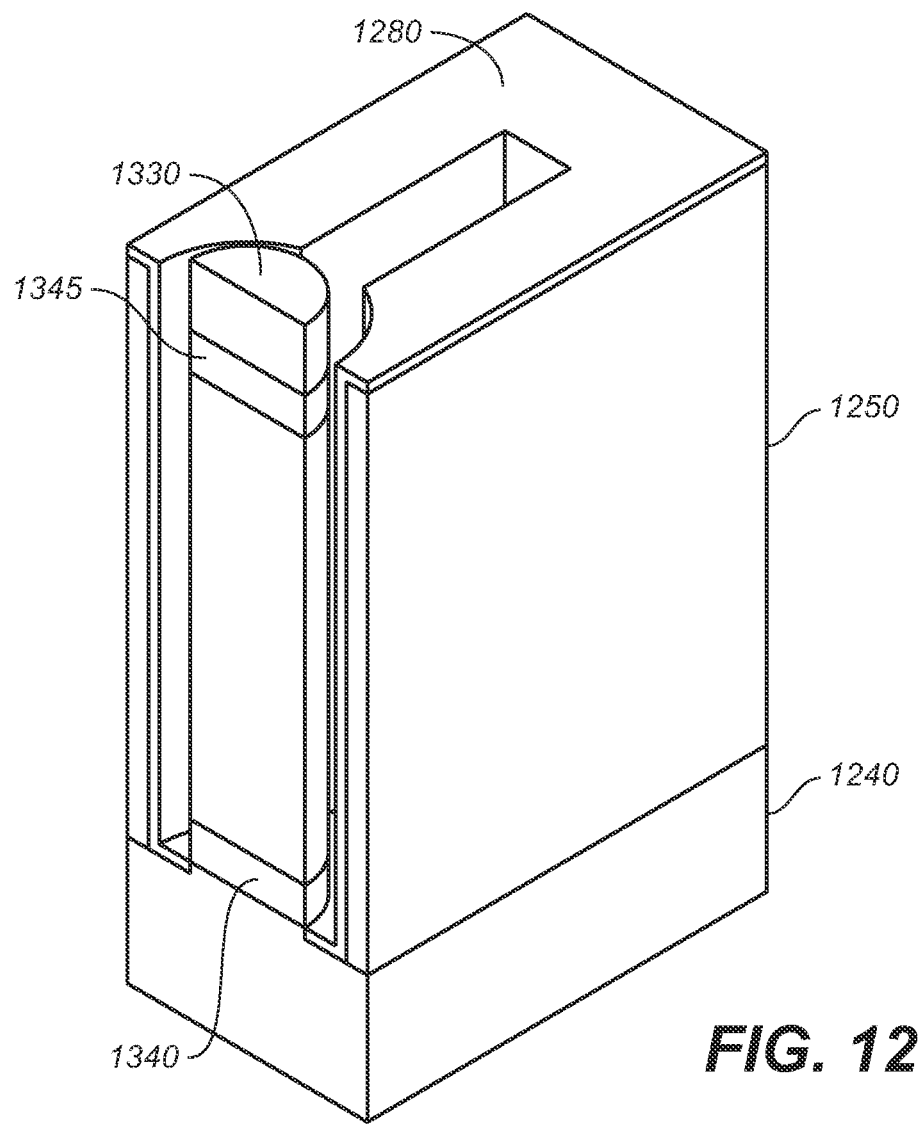

Referring to FIG. 12i, a portion of crystallized channel layer 110 is then doped by ion implantation to form heavily-doped second source or drain layer 1345, followed by an anneal step, if required, to activate the implanted dopant atoms. Annealing also causes dopant atoms in first source or drain layer 1240 to diffuse into channel layer 1310 to form lightly doped drain (LDD) region 1340. LDD region 1340 has a dopant concentration that is less than those of first source or drain layer 1240 and second source or drain layer 1345, and greater than that of channel layer 1310.

Figure 12J:
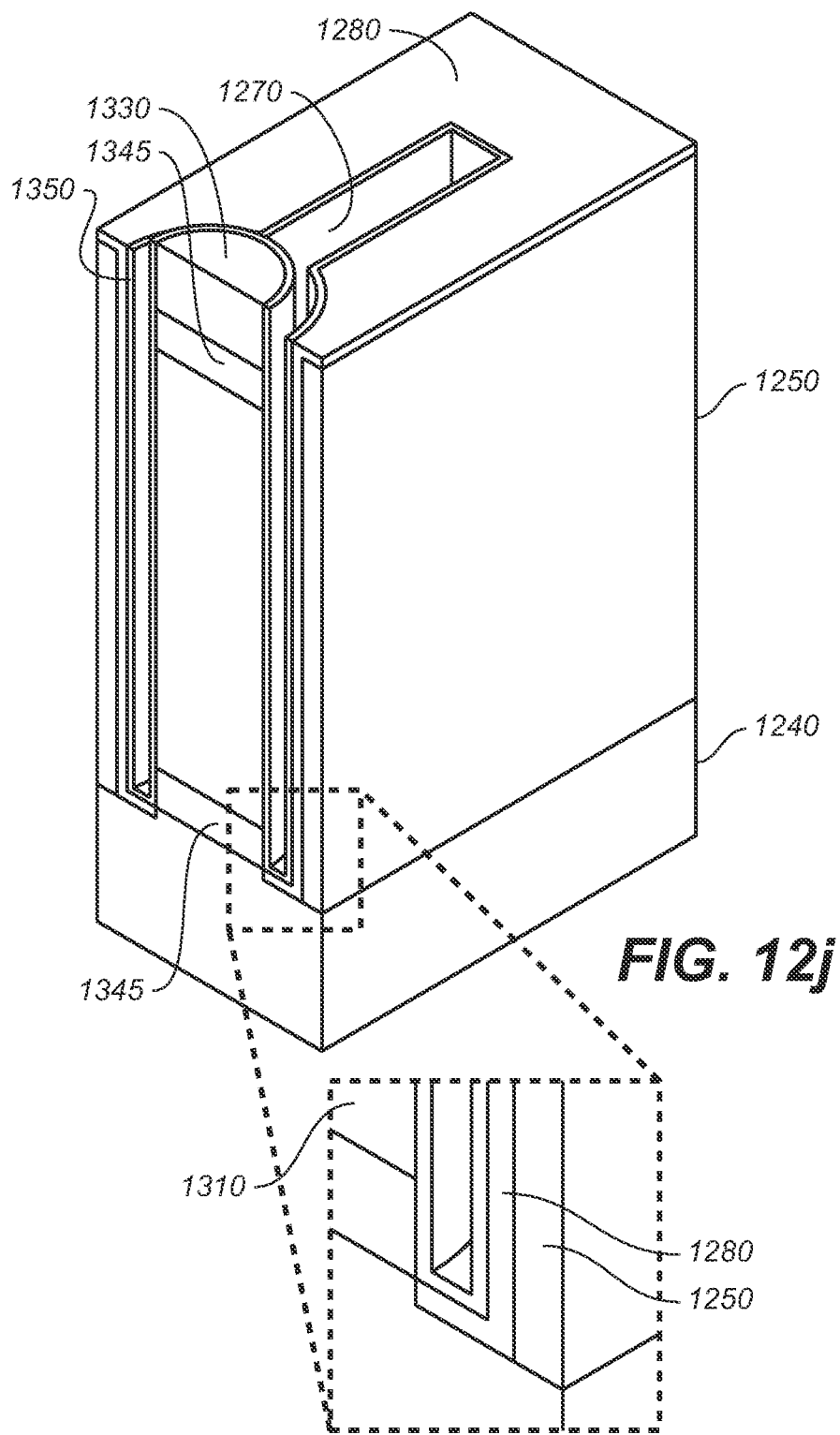
Figure 12K:
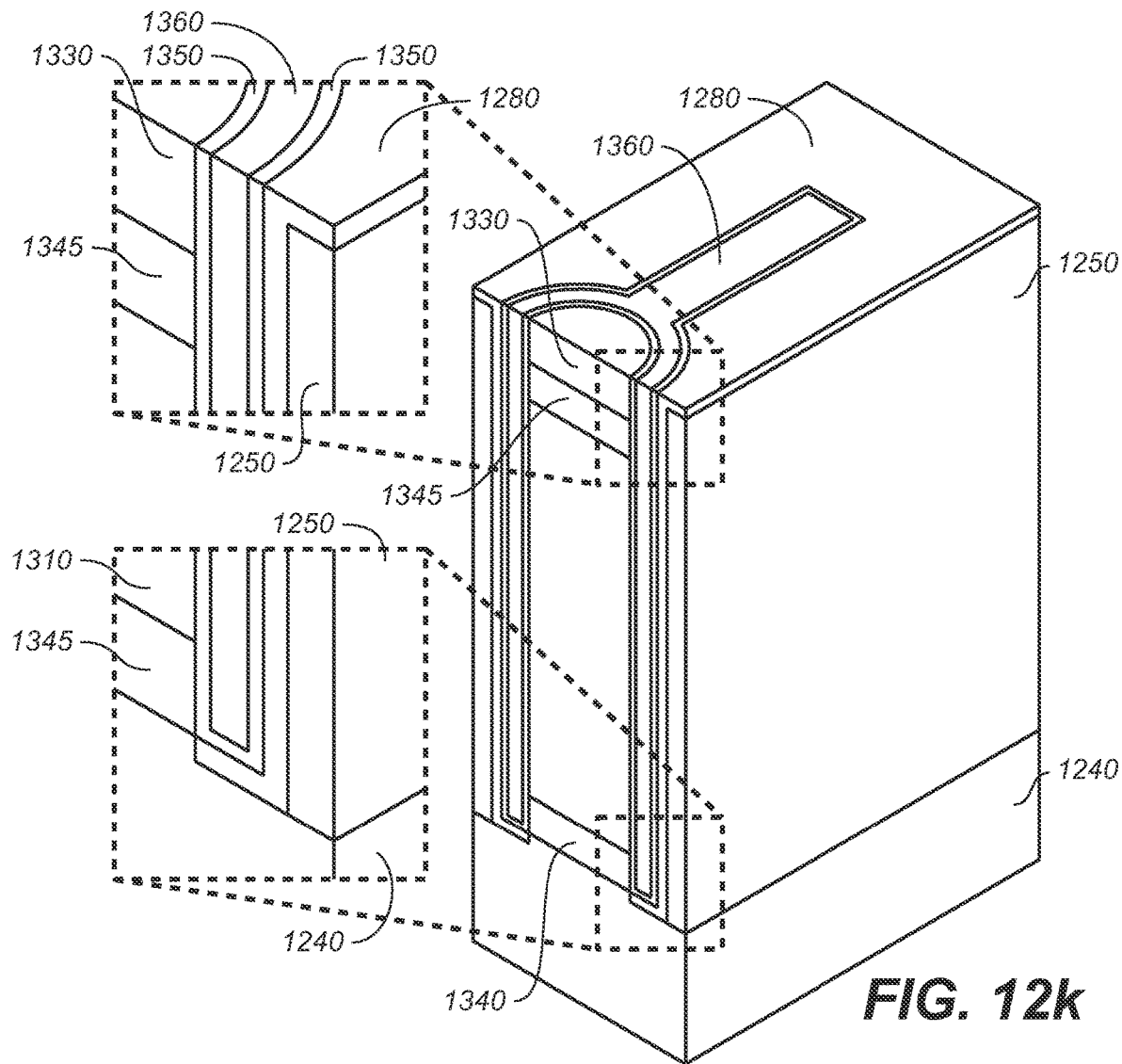

Referring to FIG. 12j, sacrificial layer 1290 is then removed by selective etching (e.g., hydrofluoric acid, which removes silicon oxide much more rapidly than silicon nitride). Thereafter, referring to FIG. 12k, having its portion of sacrificial layer 1290 removed, gate cavity 1270 is partially filled by conformally depositing or growing gate dielectric layer 1350 (e.g., silicon oxide, silicon nitride, silicon oxide nitride, aluminum oxide, or hafnium oxide). Gate dielectric layer 1350 may be between 3 and 100 nm thick, especially between 5 and 20 nm thick. Thereafter, gate cavity 1270 is filled—as indicated in FIG. 12k by gate electrode or conductive layer 1360—using any suitably conductive material (e.g., doped silicon, doped silicon germanium, doped germanium, titanium, titanium nitride, tungsten, tungsten nitride, tungsten carbide, tungsten carbide nitride, tantalum, or tantalum nitride, or any combinations thereof). Any excess material of gate conductive layer 1360 over the top surface of etch stop layer 1280 (exposed by removal of sacrificial layer 1290) may be removed by etch-back or CMP. Contacts may now be made separately to both gate conductive layer 1360 and channel layer 1310, as shown in FIG. 12a. Fabrication of the vertical TFTs 1220 of FIG. 12a is now substantially completely. In each vertical TFT, first drain or source layer 1240 and LDD layer 1340 together serve as a drain region (or a source region, alternatively), second source or drain layer 1345 serves as a source region (or a drain region, alternatively), channel layer 1310 serves as a channel region, gate dielectric layer 1350 serves as a gate dielectric material, and gate conductive layer 1360 serves as a gate electrode.

Figure 13:
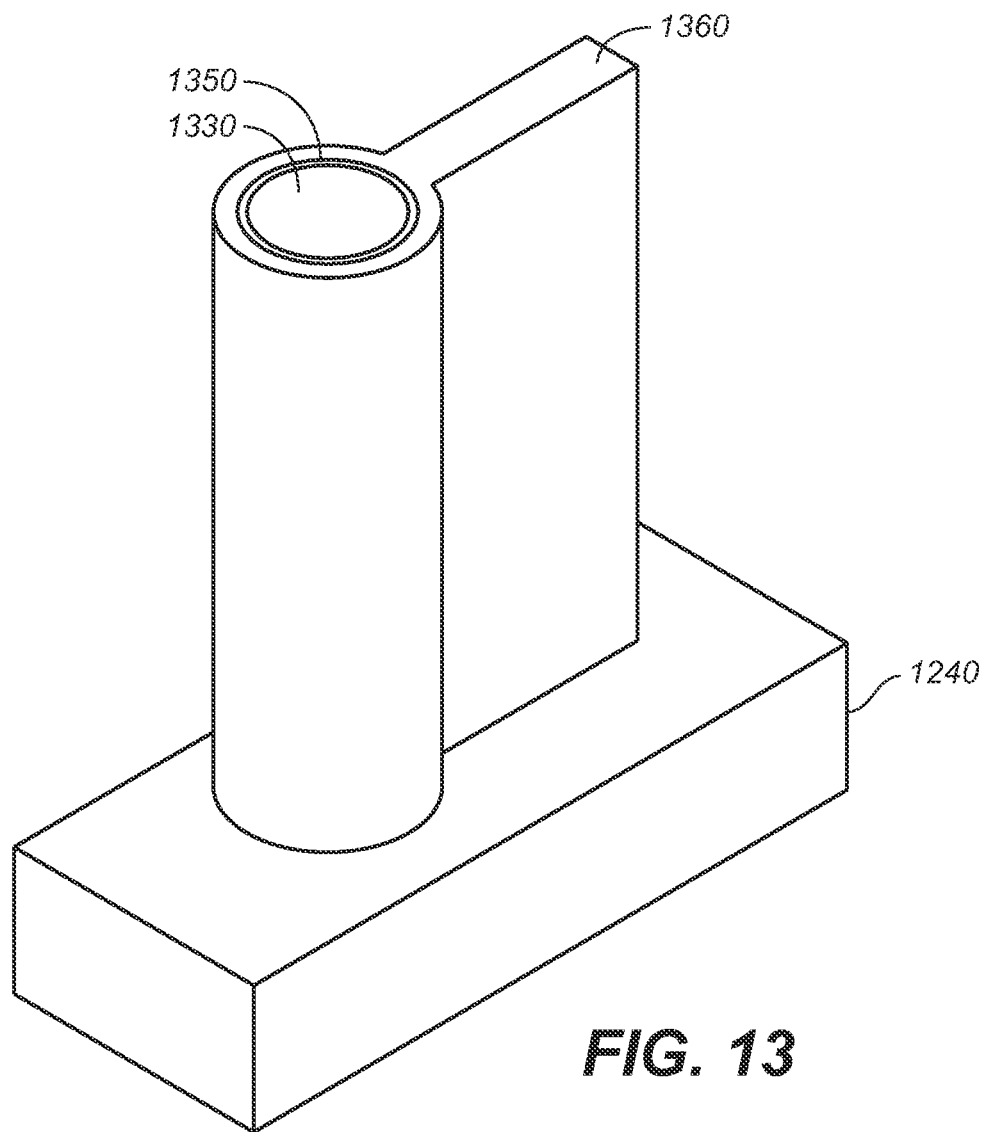
FIG. 13 shows the vertical TFT of FIGS. 12a-12k, with some dielectric layers removed for clarity.

FIG. 13 shows the vertical TFT of FIGS. 12a-12k, with some dielectric layers removed for clarity.

Figure 14A:
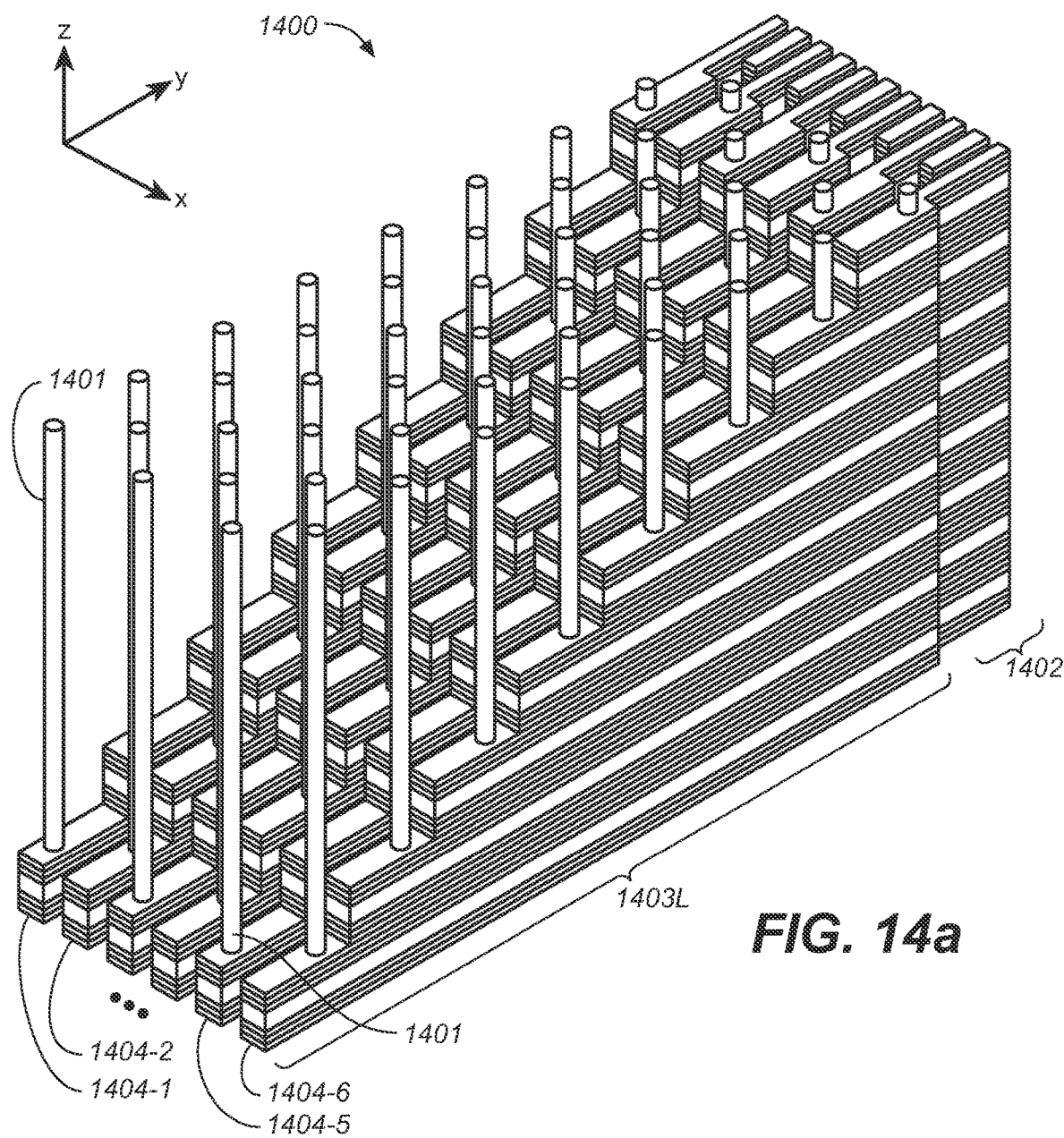
FIGS. 14a, 14b, 14c and 14d illustrate formation of bit line selector 1450 using TFTs formed above staircase structure 1400, in accordance with yet another embodiment of the present invention.

FIGS. 14a, 14b, 14c and 14d illustrate formation of bit line selector 1450 using TFTs formed above staircase structure 1400, in accordance with yet another embodiment of the present invention. FIG. 14a shows, initially, numerous conductors 1401 are formed in conductor-filled vias provided above staircase portion 1403L of memory structure 1400; staircase portion 1403 is formed on one side of array portion 1402 of memory structure 1400, in the manner already described above. Array portion 1402 provides a 3-D array of memory cells. Staircase portion 1403R (not shown)—which is structurally a mirror image of staircase portion 1403L—is provided on the opposite side of array portion 1402. For clarity in presentation, only representative steps for each level of staircase 1403L (i.e., not all steps, only representative steps 1404-1 to 1404-6) and only representative ones of conductors 1401 are shown in FIG. 14a. In a practical implementation, for example, many more steps (e.g., 4096) may be provided at each level of staircase portion 1403L. Not shown in FIG. 14a is also the passivation silicon layer (e.g., silicon oxide) that fills the space above and between the steps of staircase portion 1403L. The passivation layer is planarized, such that each of conductors 1401 is flush and exposed at the planarized surface of the passivation layer.

In this embodiment, as shown in FIG. 14a, two rows of conductors 1401 are provided for each level of staircase portion 1403L, with each row extending along the X-direction and off-set from the other by a short distance along the Y-direction. For example, at steps 1404-1 to 1404-6, a first row of conductors 1401 contact the common bit lines at steps 1404-1, 1404-3 and 1404-5, while a second row of conductors 1401 contact the common bit lines of steps 1404-2, 1404-4 and 14-4-6. In FIG. 14a, the width for each common bit line (i.e., its extent along the X-direction) in staircase portion 1403L and 1403R is wider—e.g., twice as wide—than the width of the same common bit line in array portion 1402. Thus, in this embodiment, half of the common bit lines at each level of array portion 1402 may be accessed through conductors 1401 of staircase portion 1403L, while the other half of the common bit lines at the same level may be accessed through like conductors of staircase portion 1403R. Bit line selector 1450 to be formed above staircase portions 1403L and 1403R select the common bit lines by creating signal paths that connect vertical TFTs to selected ones of conductors 1401. In this embodiment, conductors 1401 are provided for steps at every level of each of staircase portions 1403L and 1403R, so that each row of conductors 1401 connects one-quarter (¼) of the bit lines at each level of the memory array.

Figure 14B:
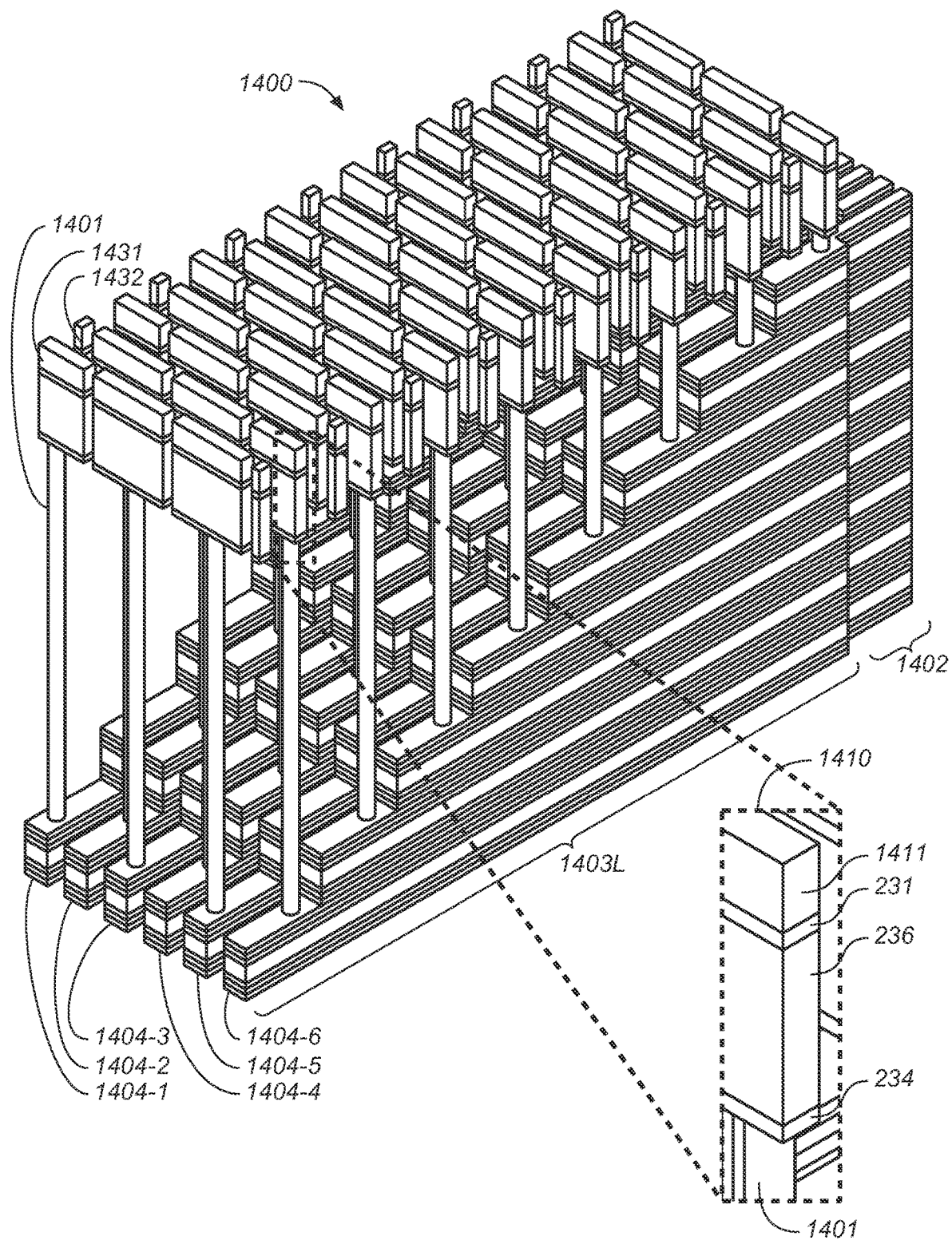
Figure 14C:
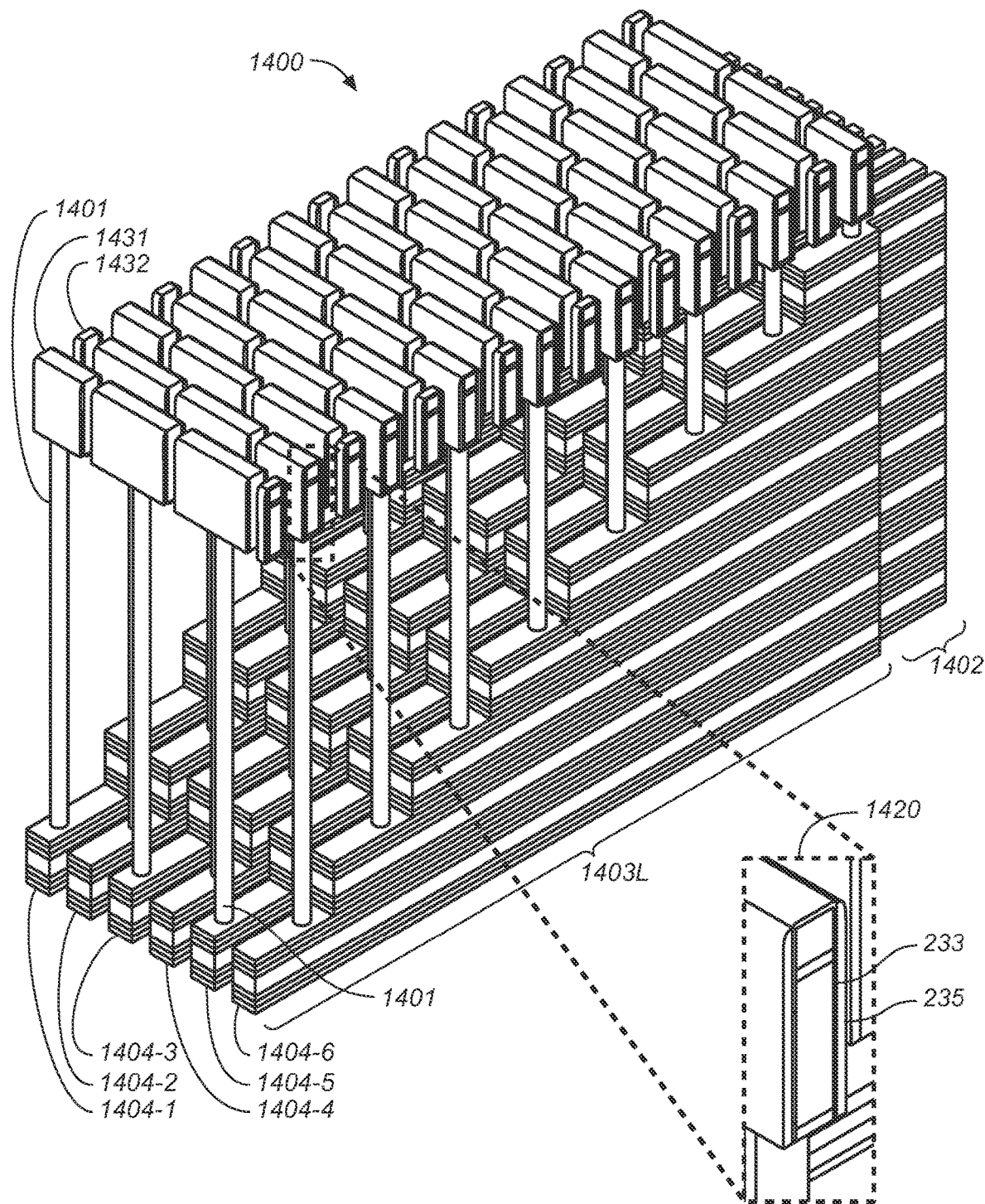

Heavily-doped silicon (e.g., n$^+$-doped polysilicon) 234, intrinsic or lightly-doped silicon (e.g., p$^-$-doped silicon) 236, heavily-doped silicon (e.g., n$^+$-doped polysilicon) 231 and isolation layer (e.g., silicon oxide) 1411 are then successively deposited. In some implementations, intrinsic or lightly-doped silicon 236 is first deposited in amorphous formed, which is later crystallized in a subsequent step. The deposited material stack is then photolithographically patterned and etched. The resulting memory structure 1400 is shown in FIG. 14b. As shown in FIG. 14b, a vertical TFT is to be formed on top of each one of conductors 1401, such that two rows of TFTs (indicated by reference numerals 1431 and 1432) are to be formed for each level of staircase structure 1403L. Inset 1410 shows isolation layer 1411, drain region formed out of heavily-doped silicon 231, channel region formed out of amorphous or lightly-doped p$^-$ doped silicon 236 and source region formed out of heavily-doped silicon 234. Source region 234 connects to its associated underlying conductor 1401. Gate oxide (e.g., silicon oxide) 235 and conductive material (e.g., p$^+$-doped polysilicon) 233 are then deposited conformally. An anisotropic etch removes excess gate conductive material 233 on top of and between rows of the TFTs to be formed. FIG. 14c shows resulting memory structure 1400. Inset 1420 shows a thin gate oxide layer covering the exposed sidewalls of the drain region 231, channel region 236 and source region 234, and a gate electrode, formed out of conductive material 233. In this configuration, each row of TFTs serves one-quarter of the bit lines at each level of memory cells in array portion 1402 (i.e., the bit lines at each level are served by two rows of TFTs in each of staircase structures 1403L and 1403R)

Figure 14D:
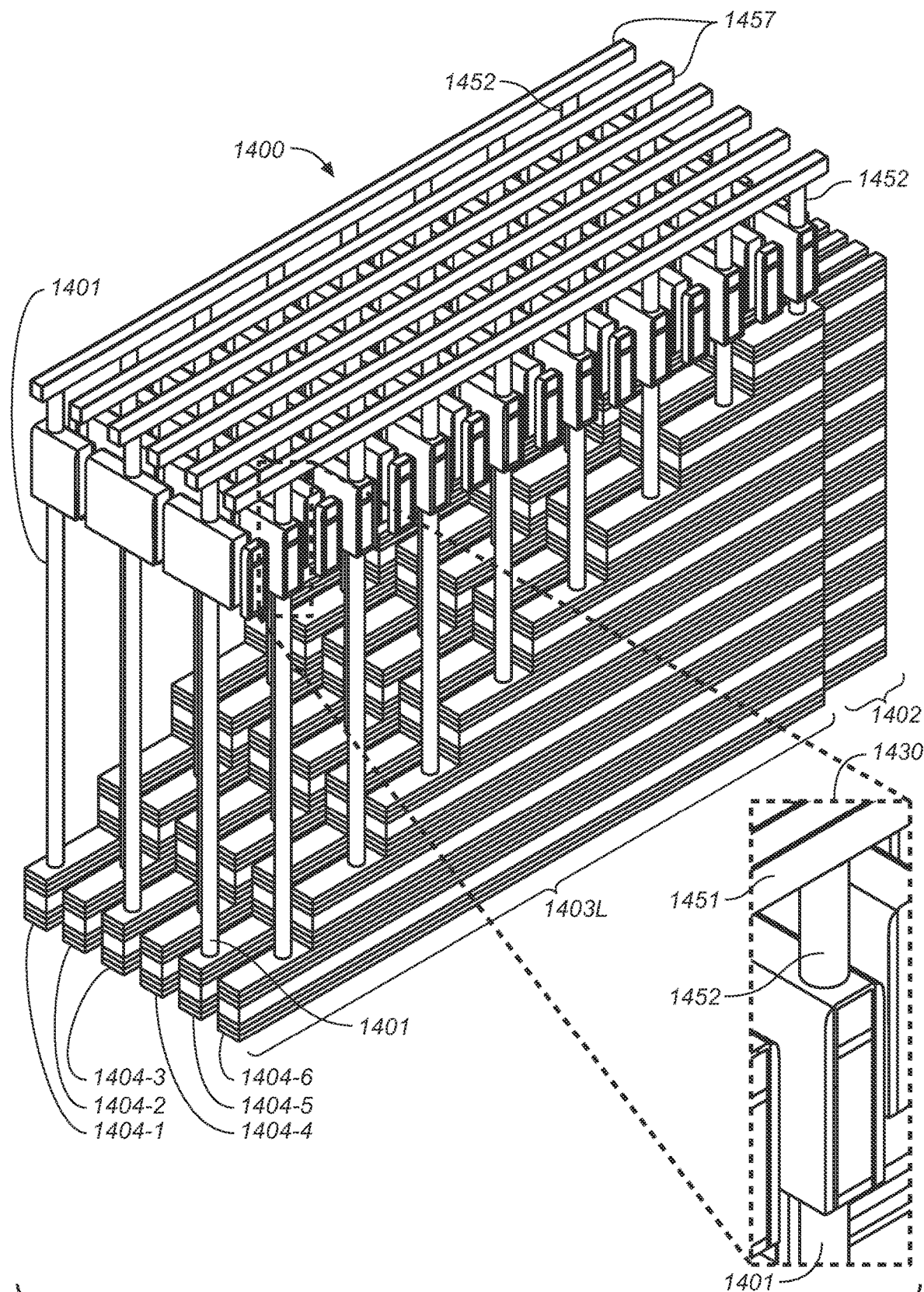

Thereafter memory structure 1400 is then filled with a dielectric material (e.g., silicon oxide) and planarized. Conductors (e.g., tungsten) 1452 are then formed to fill vias created in the dielectric material. Thereafter, conductors 1451 are then formed in a layer of interconnect material (e.g., copper), thereby providing global bit lines for accessing the memory cells in memory structure 1400. FIG. 14*d* show resulting memory structure 1400. Inset 1430 shows one of global bit lines 1451 and its associated one of conductors 1452 connecting to a vertical TFT. Not shown in FIG. 14*d* are conductors formed in an interconnect material layer for sending vertical TFT selection signals to each row of vertical TFTs, and the row's one or more associated conductor-filled vias that connect the conductor in the interconnect material layer to the common gate electrode of that row of vertical TFTs. The vertical TFTs are collectively the switches of bit line selector 1450.

The above detailed description is provided to illustrate specific embodiments of the present invention and is not intended to be limiting. Numerous modifications and variations within the scope of the present invention are possible. The present invention is set forth in the accompanying claims.

We claim:

1. A memory circuit, comprising:
   a semiconductor substrate having a planar surface, the semiconductor substrate having formed therein circuitry for memory operations;
   an array of memory cells ("memory array") formed above the planar surface, the memory array being formed in a memory structure that comprises one or more conductive layers each having one or more conductors carrying electrical signals to or from the memory cells, the conductors in each conductive layer extending along a first direction substantially parallel to the planar surface; and
   one or more transistors each formed above the conductive layers and each, when rendered conducting by a control signal, being electrically connected to a corresponding one of the conductors, wherein each transistor includes first and second drain or source regions, a channel region, and a gate region each formed out of a semiconductor material or a conductive material.

2. The memory circuit of claim 1, further comprising an interconnection layer having a plurality of conductors, each conductor in the interconnection layer being electrically connected to one or more of the transistors such that, when one its connected transistors is rendered conducting, the conductor is electrically connected to the conductor in the memory structure associated with the connected transistor.

3. The memory circuit of claim 1, wherein the conductive layers of the memory structure are provided in a staircase structure having two or more levels, with each conductive layer being provided on one of the levels.

4. The memory circuit of claim 3, wherein the staircase structure is one of a plurality of staircase structures each being provided in a portion of the memory structure separate from the array of memory cells.

5. The memory circuit of claim 1, wherein the transistors formed above each conductive layer and electrically connecting, when rendered conductive, the conductors in the conductive layer are arranged in two rows, the transistors in each row being arranged along a second direction substantially parallel the planar surface and substantially orthogonal to the first direction.

6. The memory circuit of claim 1, further comprising a set of interconnect lines, wherein the gate terminal of each transistor connects to one of the interconnect lines.

7. The memory circuit of claim 1 wherein, when a current is present in the channel region of one of the transistors, the current flows in a direction substantially perpendicular to the planar surface.

8. The memory circuit of claim 1, wherein the memory cells are organized into a plurality of levels of NOR memory strings, each level having multiple NOR memory strings, and wherein conductors of the first conductive layer form common bit lines of the NOR memory strings.

9. The memory circuit of claim 1, wherein the semiconductor material comprises one or more of: polycrystalline silicon, polycrystalline silicon germanium, single-crystal silicon, single-crystal silicon germanium, and indium gallium zinc oxide (IGZO).

10. The memory circuit of claim 1, wherein the channel region comprises indium gallium zinc oxide (IGZO).

11. The memory circuit of claim 9, wherein the IGZO comprises a crystalline material.

* * * * *

UNITED STATES PATENT AND TRADEMARK OFFICE
CERTIFICATE OF CORRECTION

PATENT NO. : 11,610,914 B2
APPLICATION NO. : 17/161504
DATED : March 21, 2023
INVENTOR(S) : Tianhong Yan et al.

It is certified that error appears in the above-identified patent and that said Letters Patent is hereby corrected as shown below:

In the Drawings

In Fig. 2b, the labels "Poly (metal?) Gate 233" and "Poly Gate" should each read "Gate 233." (As shown on the attached drawing sheet)

In Fig. 2c, the labels "Poly (metal?) Gate 233" and "Poly Gate" should each read "Gate 233." (As shown on the attached drawing sheet)

Signed and Sealed this
Thirtieth Day of January, 2024

Katherine Kelly Vidal
*Director of the United States Patent and Trademark Office*